United States Patent
Miyashita et al.

(10) Patent No.: US 11,997,858 B2
(45) Date of Patent: May 28, 2024

(54) ORGANIC EL DEVICE AS WELL AS DISPLAY APPARATUS, IMAGE PICKUP APPARATUS, COMMUNICATION APPARATUS, LIGHTING APPARATUS, LUMINAIRE, AND MOVING BODY EACH INCLUDING THE SAME

(71) Applicant: CANON KABUSHIKI KAISHA, Tokyo (JP)

(72) Inventors: Hirokazu Miyashita, Kanagawa (JP); Itaru Takaya, Kanagawa (JP); Takayuki Ito, Kanagawa (JP); Moe Takahira, Kyoto (JP); Tomona Yamaguchi, Tokyo (JP); Satoru Shiobara, Kanagawa (JP); Tomokazu Kotake, Tokyo (JP); Haruna Iida, Tokyo (JP); Naoki Yamada, Tokyo (JP); Jun Kamatani, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 758 days.

(21) Appl. No.: 17/139,848

(22) Filed: Dec. 31, 2020

(65) Prior Publication Data
US 2021/0126214 A1    Apr. 29, 2021

Related U.S. Application Data

(63) Continuation of application No. PCT/JP2019/025944, filed on Jun. 28, 2019.

(30) Foreign Application Priority Data

Jul. 5, 2018 (JP) .................. 2018-128017
Jun. 25, 2019 (JP) .................. 2019-117143

(51) Int. Cl.
*H10K 50/11* (2023.01)
*F21S 43/145* (2018.01)
(Continued)

(52) U.S. Cl.
CPC ............ *H10K 50/11* (2023.02); *F21S 43/145* (2018.01); *H04N 23/53* (2023.01); *H10K 50/131* (2023.02);
(Continued)

(58) Field of Classification Search
CPC ...... H10K 50/11; H10K 50/131; H10K 50/19; H10K 85/624; H10K 2102/311;
(Continued)

(56) References Cited

U.S. PATENT DOCUMENTS

| 2005/1074044 | 8/2005 | Seishi | |
| 2007/0035238 A1* | 2/2007 | Nakagawa | H10K 50/828 313/504 |

(Continued)

FOREIGN PATENT DOCUMENTS

CN        107665955 A    2/2018

*Primary Examiner* — Karen Kusumakar
*Assistant Examiner* — Shawn Shaw Muslim
(74) *Attorney, Agent, or Firm* — CANON U.S.A., INC. IP Division

(57) ABSTRACT

An organic EL device includes at least an anode, a first light-emitting layer, an intermediate layer, a second light-emitting layer, and a cathode in this order. The intermediate layer is adjacent to the first light-emitting layer and the second light-emitting layer. The first light-emitting layer and the second light-emitting layer can trap electrons. A material constituting the intermediate layer is a hydrocarbon that has a HOMO level equal to or lower than the HOMO level of a host of the first light-emitting layer and that has a high $S_1$ level.

25 Claims, 10 Drawing Sheets

(51) Int. Cl.
   *H04N 23/53* (2023.01)
   *H10K 50/13* (2023.01)
   *H10K 50/19* (2023.01)
   *H10K 59/12* (2023.01)
   *H10K 77/10* (2023.01)
   *H10K 85/60* (2023.01)
   *H10K 101/30* (2023.01)
   *H10K 101/40* (2023.01)
   *H10K 102/00* (2023.01)

(52) U.S. Cl.
   CPC ............. *H10K 50/19* (2023.02); *H10K 59/12* (2023.02); *H10K 77/111* (2023.02); *H10K 85/622* (2023.02); *H10K 85/623* (2023.02); *H10K 85/624* (2023.02); *H10K 85/626* (2023.02); *H10K 85/633* (2023.02); *H10K 85/6574* (2023.02); *H10K 85/6576* (2023.02); *H10K 2101/30* (2023.02); *H10K 2101/40* (2023.02); *H10K 2102/311* (2023.02)

(58) Field of Classification Search
   CPC ............. H10K 85/633; H10K 2101/40; H10K 85/6574; H10K 85/623; H10K 2101/30; H10K 85/622; H10K 77/111; H10K 85/6576; H10K 59/12; H10K 85/626; F21S 43/145; H04N 23/53
   See application file for complete search history.

(56) References Cited

U.S. PATENT DOCUMENTS

| | | |
|---|---|---|
| 2012/0305898 A1 | 12/2012 | Okamoto |
| 2016/0336519 A1 | 11/2016 | Seo |
| 2017/0288162 A1 | 10/2017 | Akiyama |

* cited by examiner

ORGANIC EL DEVICE AS WELL AS DISPLAY APPARATUS, IMAGE PICKUP APPARATUS, COMMUNICATION APPARATUS, LIGHTING APPARATUS, LUMINAIRE, AND MOVING BODY EACH INCLUDING THE SAME

CROSS-REFERENCE TO RELATED APPLICATIONS

This application is a Continuation of International Patent Application No. PCT/JP2019/025944, filed Jun. 28, 2019, which claims the benefit of Japanese Patent Application No. 2018-128017, filed Jul. 5, 2018, and Japanese Patent Application No. 2019-117143, filed Jun. 25, 2019, all of which are hereby incorporated by reference herein in their entirety.

TECHNICAL FIELD

The present invention relates to an organic EL device that emits light upon energization of an organic electroluminescence (EL) layer including a light-emitting layer between a pair of electrodes and various apparatuses including the organic EL device.

BACKGROUND ART

In recent years, research and development of full-color light-emitting arrays including an organic EL device has been energetically promoted. Full-color light-emitting arrays are produced by differently coloring a light-emitting layer for each pixel (device) or by using an organic EL device whose light-emitting layer emits white light and differently coloring a color filter for each pixel. Organic EL devices often include two or more light-emitting materials.

Patent Literature 1 discloses an organic EL device that includes a plurality of light-emitting layers and a charge barrier layer between two light-emitting layers. The organic EL device aims to improve luminous efficiency.

Patent Literature 2 discloses an organic EL device that includes three light-emitting layers and intermediate layers between the light-emitting layers. The intermediate layers are formed of the same material as a host of the light-emitting layer. The organic EL device emits light from the three light-emitting layer and aims to improve emission balance.

However, the organic EL device disclosed in Patent Literature 1 had insufficient durability. In the organic EL device described in Patent Literature 1, the energy level (HOMO level) of the highest occupied molecular orbital (HOMO) of the charge barrier layer (intermediate layer) between two light-emitting layers is higher than that of a host of the adjacent light-emitting layers. In other words, the organic EL device described in Patent Literature 1 has a device structure in which the HOMO level of the intermediate layer is closer to the vacuum level than the HOMO level of the adjacent light-emitting layers. Thus, positive holes are accumulated in the intermediate layer between two light-emitting layers, possibly causing exciton quenching due to the accumulated charge and material degradation due to charge accumulation.

The organic EL device disclosed in Patent Literature 2 had insufficient emission balance of red, green, and blue. The organic EL device in Patent Literature 2 has a device structure in which among two intermediate layers (a first intermediate layer and a second intermediate layer) between three light-emitting layers a material of the first intermediate layer adjacent to a red-light-emitting layer is the same as the material of a host constituting the red-light-emitting layer. Thus, energy transfer from a green- or blue-light-emitting layer on the opposite side of the first intermediate layer from the red-light-emitting layer is likely to occur to the red-light-emitting layer via the first intermediate layer, and energy transfer can be accompanied with a change in emission balance and a decrease in luminous efficiency.

Depending on the material structure, the intermediate layers may cause a decrease in device efficiency or may cause device degradation.

CITATION LIST

Patent Literature

PTL 1 International publication No. WO 2010/134350
PTL 2 Japanese Patent Laid-Open No. 2011-151011

SUMMARY OF INVENTION

The present invention has been made to solve such problems and provides an organic EL device with improved durability and good emission balance and various apparatuses including the organic EL device.

A first of the present invention is an organic EL device that includes at least an anode, a first light-emitting layer, an intermediate layer, a second light-emitting layer, and a cathode in this order, the intermediate layer being adjacent to the first light-emitting layer and the second light-emitting layer, wherein the first light-emitting layer contains a first host and a first dopant, the second light-emitting layer contains a second host and a second dopant, the intermediate layer contains an aromatic hydrocarbon compound, the following relationship (a) is satisfied between the first host and the first dopant, the following relationship (b) is satisfied between the second host and the second dopant, and the following relationship (c) is satisfied between the intermediate layer material and the first host, (a) LUMO (H1)>LUMO (D1)
(b) LUMO (H2)>LUMO (D2)
(c) HOMO (H1)≥HOMO (IL)

wherein LUMO (H1), LUMO (D1), LUMO (H2), and LUMO (D2) in (a) to (c) denote LUMO energy levels of the first host, the first dopant, the second host, and the second dopant, respectively, and HOMO (H1) and HOMO (IL) denote HOMO energy levels of the first host and the intermediate layer material, respectively. A second of the present invention is a display apparatus including a plurality of pixels, wherein each pixel has an organic EL device according to the present invention and an active device coupled to the organic EL device.

A third of the present invention is a flexible display apparatus that includes a flexible substrate and a display unit on the flexible substrate, wherein the display unit includes an organic EL device according to the present invention and an active device coupled to the organic EL device.

A fourth of the present invention is an image pickup apparatus that includes an optical unit with a plurality of lenses, an image pickup device for receiving light passing through the optical unit, and a display unit for displaying an image, wherein the display unit is a display unit for displaying an image taken with the image pickup device, and the display unit has an organic EL device according to the present invention.

A fifth of the present invention is a communication apparatus that includes a display unit and a communication unit, wherein the display unit has an organic EL device according to the present invention.

A sixth of the present invention is a lighting apparatus that includes a light source and a light diffusing unit, wherein the light source has an organic EL device according to the present invention.

A seventh of the present invention is a lighting apparatus that includes a light source and an optical film on a light output side of the light source, wherein the light source has an organic EL device according to the present invention.

An eighth of the present invention is a luminaire that includes an organic EL device according to the present invention and a protective member for protecting the organic EL device.

A ninth of the present invention is a moving body that includes a body and a luminaire on the body, wherein the luminaire has an organic EL device according to the present invention.

Further features of the present invention will become apparent from the following description of exemplary embodiments with reference to the attached drawings.

DESCRIPTION OF EMBODIMENTS

An organic electroluminescence (EL) device according to the present invention includes at least an anode, a first light-emitting layer, an intermediate layer, a second light-emitting layer, and a cathode in this order. The intermediate layer is located between the first light-emitting layer and the second light-emitting layer. The first light-emitting layer on the anode side contains a first host and a first dopant. The second light-emitting layer on the cathode side contains a second host and a second dopant. The intermediate layer contains an aromatic hydrocarbon compound as a constituent material (hereinafter referred to as an "intermediate layer material").

In each light-emitting layer, the energy level of the lowest unoccupied molecular orbital (LUMO) (hereinafter referred to as a "LUMO level") of the host is higher (closer to the vacuum level) than the LUMO energy level of the dopant. Furthermore, the energy level of the highest occupied molecular orbital (HOMO) (hereinafter referred to as a "HOMO level") of the intermediate layer material is lower (farther from the vacuum level) than the HOMO level of the first host material. The present invention is further described below with reference to FIG. 1.

FIG. 1 is a schematic view of an organic EL device according to an embodiment of the present invention. FIG. 1 is a cross-sectional view in the lamination direction.

Figure 1A:
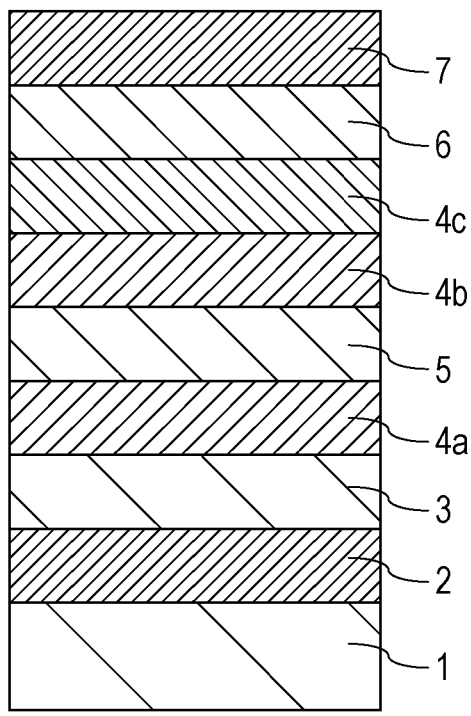
FIG. 1A is a schematic cross-sectional view of an organic EL device according to an embodiment of the present invention.

An organic EL device illustrated in FIG. 1A includes an anode 2, a hole-transport layer 3, a first light-emitting layer 4a, an intermediate layer 5, a second light-emitting layer 4b, a third light-emitting layer 4c, an electron-transport layer 6, and a cathode 7 stacked in this order on a substrate 1. The first light-emitting layer 4a, the second light-emitting layer 4b, and the third light-emitting layer 4c contain a dopant. The dopants have different emission colors.

Figure 1B:
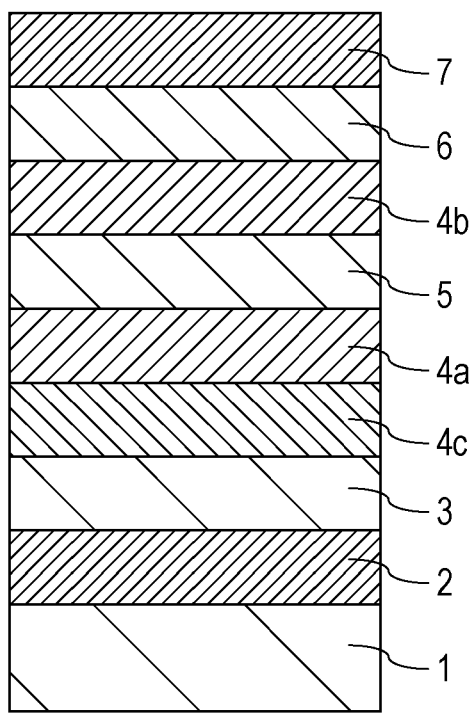
FIG. 1B is a schematic cross-sectional view of an organic EL device according to an embodiment of the present invention.

An organic EL device illustrated in FIG. 1B includes the anode 2, the hole-transport layer 3, the third light-emitting layer 4c, the first light-emitting layer 4a, the intermediate layer 5, the second light-emitting layer 4b, the electron-transport layer 6, and the cathode 7 stacked in this order on the substrate 1. The first light-emitting layer 4a, the second light-emitting layer 4b, and the third light-emitting layer 4c contain a dopant. The dopants have different emission colors.

Figure 1C:
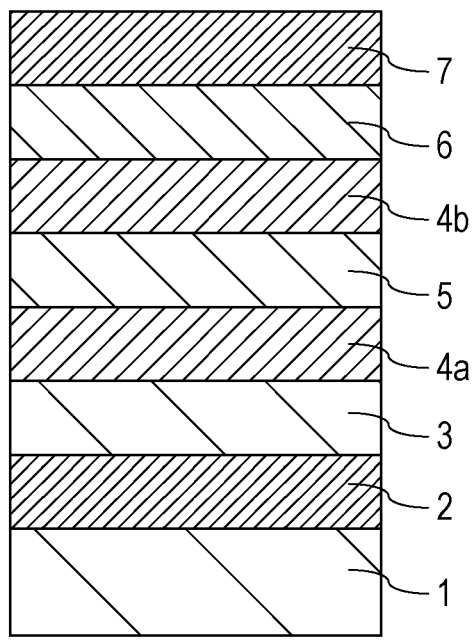
FIG. 1C is a schematic cross-sectional view of an organic EL device according to an embodiment of the present invention.

An organic EL device illustrated in FIG. 1C includes the anode 2, the hole-transport layer 3, the first light-emitting layer 4a, the intermediate layer 5, the second light-emitting layer 4b, the electron-transport layer 6, and the cathode 7 stacked in this order on the substrate 1. The first light-emitting layer 4a contains two dopants of different emission colors. The second light-emitting layer 4b contains a dopant of a different emission color from the dopants contained in the first light-emitting layer 4a.

The light-emitting layers 4a, 4b, and 4c in FIGS. 1A to 1C are fluorescent layers. The light-emitting layers 4a, 4b, and 4c may have any emission color. For example, the light-emitting layers 4a, 4b, and 4c may have the same emission color or different emission colors. The light-emitting layers may emit white light as a whole. When the light-emitting layers have different emission colors, white light may be emitted from red-, green-, and blue-light-emitting layers.

A light-emitting layer in the present invention refers to a layer with a light-emitting function among organic compound layers between the anode 2 and the cathode 7. A host in each light-emitting layer is a material serving as a main component among the materials contained in the light-emitting layer. More specifically, a host is a material constituting more than 50% by mass of the light-emitting layer among the materials contained in each light-emitting layer. A dopant refers to a material that is not the main component in the materials contained in each light-emitting layer. More specifically, a dopant is a material constituting less than 50% by mass of the light-emitting layer among the materials contained in each light-emitting layer. The concentration of a dopant in a light-emitting layer is preferably 0.1% or more by mass and 20% or less by mass. Furthermore, it is desirable that the concentration of a dopant in a light-emitting layer be 10% or less by mass to suppress concentration quenching.

Each device in FIG. 1 may have a hole-injection layer between the anode 2 and the hole-transport layer 3 and an electron-blocking layer between the hole-transport layer 3 and the light-emitting layer. Each device in FIG. 1 may have a hole-blocking layer between the light-emitting layer and the electron-transport layer 6 and an electron-injection layer between the electron-transport layer 6 and the cathode 7. Such a hole-injection layer, an electron-blocking layer, a hole-blocking layer, and an electron-injection layer can be appropriately used as required in the present invention.

Figure 2:
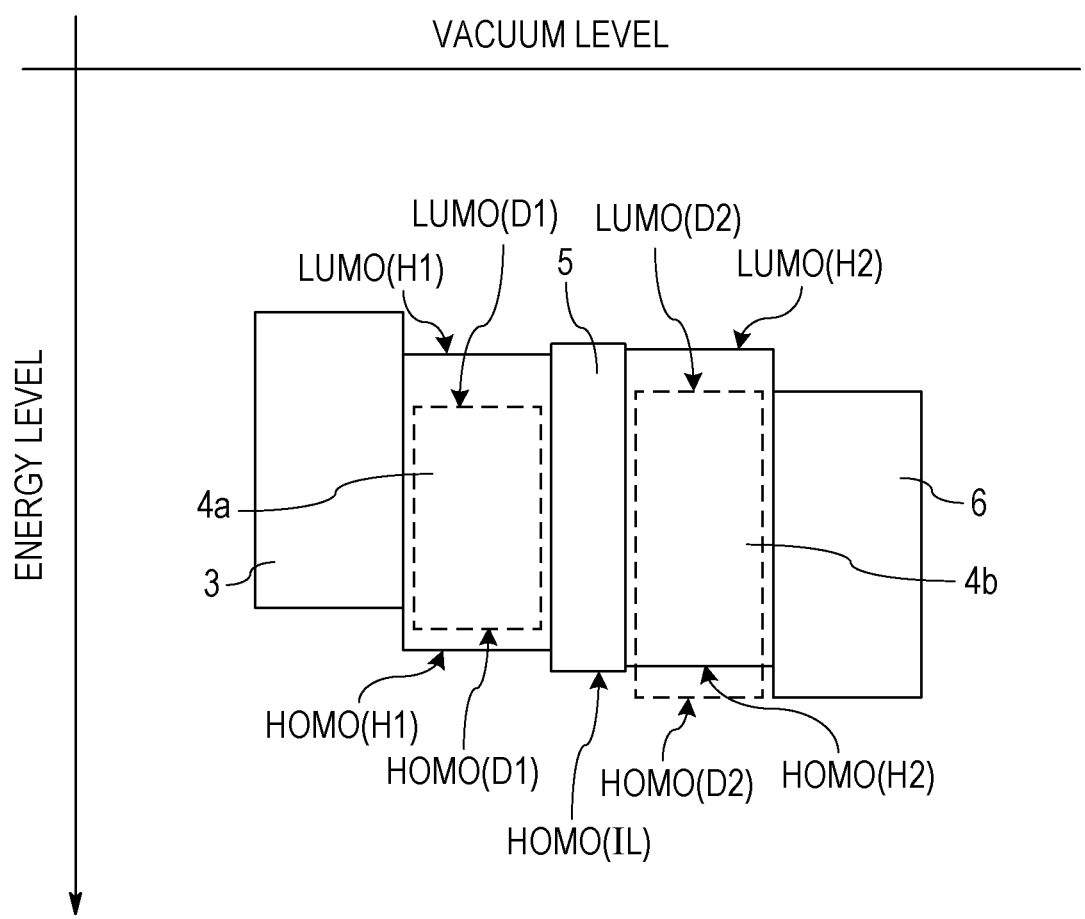
FIG. 2 is a schematic energy diagram of the energy level of each layer constituting an organic EL device according to the present invention.

FIG. 2 is a schematic energy diagram of the energy level at the periphery of a light-emitting layer constituting an organic EL device according to the present invention.

As illustrated in FIG. 2, in the present invention, the following relationship (a) is satisfied between a first host and a first dopant in the first light-emitting layer 4a.

(a) LUMO (H1)>LUMO (D1)

In (a), LUMO (H1) and LUMO (D1) denote the LUMO levels of the first host and the first dopant, respectively.

The following relationship (b) is satisfied between a second host and a second dopant in the second light-emitting layer 4b.

(b) LUMO (H2)>LUMO (D2)

In (b), LUMO (H2) and LUMO (D2) denote the LUMO levels of the second host and the second dopant, respectively.

The following relationship (c) is satisfied between an intermediate layer material constituting the intermediate layer 5 and a first host contained in the first light-emitting layer 4a.

(c) HOMO (H1)≥HOMO (IL)

In (c), HOMO (H1) and HOMO (IL) denote the HOMO levels of the first host and the intermediate layer material, respectively.

HOMO levels and LUMO levels are based on the vacuum level and are negative values in typical molecules. Thus, when HOMO levels and LUMO levels are compared, small values (large absolute values) are far from the vacuum level, and large values (small absolute values) are close to the vacuum level.

In the present invention, HOMO levels and LUMO levels are numerical values obtained by a molecular orbital calculation method. The calculation method in the molecular orbital calculation method utilized a widely used density functional theory (DFT). B3LYP was used as the functional, and 6-31G* was used as the basis function. The molecular orbital calculation method was performed using widely used Gaussian 09 (Gaussian 09, Revision C. 01, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E. Peralta, F. Ogliaro, M. Bearpark, J. J. Heyd, E. Brothers, K. N. Kudin, V. N. Staroverov, T. Keith, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford CT, 2010.).

In the exemplary embodiments described later, to verify the accuracy of calculated values, calculated values obtained by the molecular orbital calculation method were compared with actual values.

As illustrated in FIGS. 1A to 1C and FIG. 2, an organic EL device according to the present invention has a device structure that includes at least two fluorescent layers 4a and 4b and the intermediate layer 5 between the light-emitting layers 4a and 4b. Having the following characteristics, an organic EL device according to the present invention is an organic EL device with high durability and good emission balance.

(1) The two light-emitting layers 4a and 4b with the intermediate layer 5 interposed therebetween have electron trapping properties.

(2) The HOMO level of the intermediate layer material is equal to or lower than the HOMO level of the first host on the side of the anode 2.

(3) The intermediate layer material is a hydrocarbon.

(4) The energy level of the lowest excited singlet ($S_1$) of the intermediate layer material (hereinafter referred to as an "$S_1$ level") is high.

These characteristics are described below.

(1) The two light-emitting layers 4a and 4b with the intermediate layer 5 interposed therebetween have electron trapping properties.

Electric charges (positive holes, electrons) in the light-emitting layers move in the light-emitting layers while having levels between the host and dopant levels. In other words, electric charges in the light-emitting layer move in the light-emitting layer while being repeatedly trapped or detrapped by the host or dopant. Charge mobility decreases with an increase in the difference in HOMO or LUMO level between the host and the dopant.

More specifically, a LUMO level of the dopant lower than the LUMO level of the host causes electron trapping properties in the light-emitting layer, and the electron trapping properties are improved with decreasing LUMO level of the dopant. A HOMO level of the dopant higher than the HOMO level of the host causes hole trapping properties in the light-emitting layer.

In the present invention, the relationships (a) and (b) are satisfied. In FIG. 1, the two light-emitting layers 4a and 4b with the intermediate layer 5 interposed therebetween are light-emitting layers with electron trapping properties and have low electron mobility. This localizes a recombination region to the side of the electron-transport layer 6.

In general, an amine compound used as a hole-transport layer material has an unshared electron pair (lone pair) and is therefore a compound that is stable against an electron-releasing radical cation state but is unstable in an electron-accepting radical anion state. More specifically, when electrons injected from the cathode 7 reach the hole-transport layer 3, the electrons interact with an amine compound in the hole-transport layer 3 and cause material degradation, thus probably decreasing luminous efficiency or durability. In the present invention, the two light-emitting layers 4a and 4b with the intermediate layer 5 interposed therebetween have electron trapping properties and have the recombination region localized to the side of the electron-transport layer 6.

This can prevent the degradation of the hole-transport layer 3 caused by electrons and provides an organic EL device with high durability.

(2) The HOMO level of the intermediate layer material is equal to or lower than the HOMO level of the first host on the side of the anode 2.

In an organic EL device including a plurality of light-emitting layers, it is assumed that localization of the recombination region to the side of the electron-transport layer 6 as in (1) enables light emission only from the light-emitting layers 4b and 4c on the side of the electron-transport layer 6 and makes white light emission difficult.

It has been found in the present invention that the relationship (c) is required. This creates a hole barrier between the first light-emitting layer 4a and the intermediate layer 5. The hole barrier can increase positive holes in the first light-emitting layer 4a and expand the recombination region to the side of the hole-transport layer 3. This enables the light-emitting layers 4a and 4b to emit light. Thus, white light can be produced.

Electrons reaching the first light-emitting layer 4a are trapped due to the electron trapping properties of the first light-emitting layer 4a. Rapid recombination with positive holes at the interface between the first light-emitting layer 4a and the intermediate layer 5 can limit the number of electrons reaching the hole-transport layer 3. Consequently, degradation of the hole-transport layer 3 caused by electrons as described above is not accelerated.

In the intermediate layer 5 that does not satisfy the relationship (c), that is, in the intermediate layer 5 that has a HOMO level higher than the HOMO level of the first host, there is no hole barrier, and this makes it difficult to limit hole transport and limits the recombination region to the intermediate layer 5 or to the second light-emitting layer 4b. This causes excess excitons to be trapped in the intermediate layer 5 or the second light-emitting layer 4b and may result in quenching or material degradation.

(3) The intermediate layer material is a hydrocarbon.

The present inventors have found that the intermediate layer material constituting the intermediate layer 5 is preferably a hydrocarbon. In the present invention, the intermediate layer 5 regulates charge transfer between the first light-emitting layer 4a and the second light-emitting layer 4b and adjusts carrier balance. In particular, to regulate positive holes flowing into the second light-emitting layer 4b, it is required to accumulate positive holes at the interface between the first light-emitting layer 4a and the intermediate layer 5. Thus, a molecular structure capable of withstanding excessive radical cation generation is required, and the intermediate layer material is preferably a hydrocarbon with high chemical stability. In general, compounds with a heteroatom, such as a nitrogen atom, an oxygen atom, or a sulfur atom, have a lone pair and are active in electron donation and acceptance, that is, in oxidation-reduction. Thus, such compounds can cause material degradation due to an interaction, such as a disproportionation reaction caused by unpaired electrons generated through electron donation and acceptance, and therefore have low chemical stability. By contrast, hydrocarbons have high chemical stability without a lone pair and are therefore preferred as intermediate layer materials.

(4) The intermediate layer material has a high $S_1$ level.

The intermediate layer material not only adjusts carrier balance but also regulates energy transfer between the first light-emitting layer 4a and the second light-emitting layer 4b. An organic EL device according to the present invention is a light-emitting device containing a fluorescent dopant.

Thus, the intermediate layer 5 is preferably a compound with a sufficiently high $S_1$ level. More specifically, the $S_1$ level is preferably 2.58 eV or more. To suppress energy transfer in the blue region, that is, at a wavelength of 430 nm or more and 480 nm or less, the $S_1$ level is preferably 2.58 eV or more, more preferably 2.88 eV or more, desirably 3.00 eV or more. Materials with a high $S_1$ level include aromatic hydrocarbon compounds. Specific examples include, but are not limited to, compounds in which at least two of aromatic hydrocarbons selected from the group consisting of benzene, naphthalene, fluorene, benzofluorene, phenanthrene, anthracene, chrysene, triphenylene, pyrene, fluoranthene, and benzofluoranthene are bonded to form a molecular structure. The $S_1$ level, as used herein, refers to a numerical value calculated from the molecular orbital calculation described above.

When the intermediate layer 5 suppresses energy transfer in the green region, that is, at a wavelength of 500 nm or more and 570 nm or less, the $S_1$ level is preferably 2.18 eV or more, more preferably 2.48 eV or more, desirably 2.50 eV or more. When the intermediate layer 5 suppresses energy transfer in the red region, that is, at a wavelength of 580 nm or more and 680 nm or less, the $S_1$ level is preferably 2.14 eV or more, more preferably 1.82 eV or more, desirably 1.80 eV or more.

Acene compounds formed by linear condensation of benzene rings have a substitution site with a high electron density at the central benzene ring, are therefore susceptible to oxidation, and have low chemical stability among aromatic hydrocarbons. Thus, except for anthracene, which is an acene compound, benzene, naphthalene, benzofluorene, fluorene, phenanthrene, chrysene, triphenylene, pyrene, fluoranthene, and benzofluoranthene are particularly preferred.

A composition composed only of benzene and naphthalene has a large band gap and creates an unnecessarily excessive barrier, which becomes an electron and hole injection barrier, between the first light-emitting layer 4a and the second light-emitting layer 4b. This makes it difficult to adjust carrier balance and may cause material degradation due to local electric field concentration resulting from a charge pool. Thus, the intermediate layer material preferably has an $S_1$ level of 3.3 eV or less, more preferably 3.2 eV or less. More specifically, it is desirable that the intermediate layer material be a compound having at least one of fluorene, benzofluorene, phenanthrene, chrysene, triphenylene, pyrene, fluoranthene, and benzofluoranthene as a part of its molecular structure. To avoid an excessive hole barrier, a difference in HOMO level from the host material of the first light-emitting layer is preferably 0.5 eV or less, desirably 0.3 eV or less, in molecular orbital calculation.

In an organic EL device including a plurality of light-emitting layers, unlike monochromatic organic EL devices including a monolayer light-emitting layer, good white cannot be achieved without considering the relationship between the light-emitting layers. In particular, an organic EL device with high durability and good emission balance can be obtained when the characteristics (1) to (4) are satisfied, that is, when the two light-emitting layers 4a and 4b with the intermediate layer 5 interposed therebetween have electron trapping properties, when the HOMO level of the intermediate layer material is equal to or lower than the HOMO level of the first host on the side of the anode 2, when the intermediate layer material is a hydrocarbon, and when the $S_1$ level is high.

A device structure that satisfies the following conditions enhances the effects of the characteristics (1) to (4) and is therefore preferred.

(5) When there is the third light-emitting layer 4c, the third light-emitting layer 4c also have electron trapping properties. When there is no third light-emitting layer 4c, the third dopant (fluorescence) is contained in the first light-emitting layer 4a and has an electron trap relationship with the first host.

(6) The first light-emitting layer 4a has hole trapping properties.

(7) The HOMO level of the second dopant in the second light-emitting layer 4b is smaller than the HOMO level of the second host.

(8) The light-emitting layers 4a, 4b, and 4c have electron trapping properties greater than hole trapping properties.

(9) The second light-emitting layer 4b is a blue-light-emitting layer.

(10) Each host material is a hydrocarbon.

(11) Each dopant has a fluoranthene skeleton.

These are described below.

(5) When there is the third light-emitting layer 4c, the third light-emitting layer 4c also have electron trapping properties. When there is no third light-emitting layer 4c, the third dopant is contained in the first light-emitting layer 4a and has an electron trap relationship with the first host.

Each of the light-emitting layers 4a, 4b, and 4c in FIG. 1 contains at least a host and a dopant. More specifically, the first light-emitting layer 4a contains a first host and a first dopant, and the second light-emitting layer 4b contains a second host and a second dopant. As illustrated in FIGS. 1A and 1B, in the presence of the third light-emitting layer 4c, the third light-emitting layer 4c contains a third host and a third dopant. As illustrated in FIG. 1C, when there is no third light-emitting layer 4c, the first light-emitting layer 4a contains a third dopant in addition to the first dopant.

When the third light-emitting layer 4c adjacent to the second light-emitting layer 4b is located between the second light-emitting layer 4b and the cathode 7 as illustrated in FIG. 1A, or when the third light-emitting layer 4c adjacent to the first light-emitting layer 4a is located between the first light-emitting layer 4a and the anode 2 as illustrated in FIG. 1B, the following relationship (d) is preferably satisfied between the third host and the third dopant.

(d) LUMO (H3)>LUMO (D3)

LUMO (H3) and LUMO (D3) in (d) denote LUMO levels of the third host and the third dopant, respectively. Having the relationship (d), the third light-emitting layer 4c has electron trapping properties.

In FIG. 1A, an electron-trapping light-emitting layer can be formed on the side of the electron-transport layer 6 to localize a recombination region to the side of the electron-transport layer 6 and improve durability. In FIG. 1B, an electron-trapping light-emitting layer can be formed on the side of the hole-transport layer 3 to decrease the number of electrons reaching the hole-transport layer 3 and improve durability.

When there is no third light-emitting layer 4c as illustrated in FIG. 1C, preferably, the first light-emitting layer 4a contains a third dopant, and the following relationship (e) is satisfied between the first host and the third dopant.

(e) LUMO (H1)>LUMO (D3)

LUMO (D3) in (e) denotes the LUMO level of the third dopant. Satisfying the relationship (e) can improve the electron trapping properties of the first light-emitting layer 4a, decrease the number of electrons reaching the hole-transport layer 3, and improve durability.

(6) The first light-emitting layer 4a has hole trapping properties.

In the first light-emitting layer 4a, the following relationship (f) is preferably satisfied between the first host and the first dopant.

(f) HOMO (H1)<HOMO (D1)

In (f), HOMO (H1) and HOMO (D1) denote the HOMO levels of the first host and the first dopant, respectively. Satisfying the relationship (f) enables the first light-emitting layer 4a to have hole trapping properties and makes it easier to adjust the balance of the number of positive holes flowing into the second light-emitting layer 4b, which is otherwise adjusted only by the injection barrier of the intermediate layer 5. This expands the recombination region also to the side of the hole-transport layer 3 and makes it easier to emit balanced white light. More specifically, the hole trapping properties of the first light-emitting layer 4a and the hole injection barrier in the intermediate layer 5 can adjust the number of positive holes transported to the second light-emitting layer 4b, thereby achieving carrier balance that facilitates white light emission.

(7) The HOMO level of the second dopant in the second light-emitting layer 4b is smaller than the HOMO level of the second host.

In the second light-emitting layer 4b, the following relationship (g) is preferably satisfied between the second host and the second dopant.

(g) HOMO (H2)>HOMO (D2)

In (g), HOMO (H2) and HOMO (D2) denote the HOMO levels of the second host and the second dopant, respectively. Satisfying the relationship (g) can suppress hole trapping properties in the second light-emitting layer 4b. This can enhance the effects of localizing a recombination region to the side of the electron-transport layer 6. For example, in a layered structure including the third light-emitting layer 4c on the side of the electron-transport layer 6 as illustrated in FIG. 1A, the relationship (g) results in the second light-emitting layer 4b with poor hole trapping properties and promotes hole transport to the third light-emitting layer 4c. This can enhance the effects of localizing a recombination region to the side of the electron-transport layer 6. The relationship (g) can also relatively improve the electron trapping properties in the second light-emitting layer 4b.

(8) The light-emitting layers 4a, 4b, and 4c have electron trapping properties greater than hole trapping properties.

It is described below that, in addition to the prevention of the degradation of the hole-transport layer 3, an electron-trapping light-emitting layer is effective in improving durability.

It is suggested in Science, 283, 1900 (1999) that degradation of a host tris(8-quinolinolato) aluminum (Alq3) in a light-emitting layer is partly due to the instability of radical cations generated by the passage of positive holes. To suppress such degradation caused by radical cations in a light-emitting layer, the hole density of the light-emitting layer is preferably decreased to reduce the probability of becoming radical cations. To this end, it is preferable to reduce the hole trapping properties, enhance the electron trapping properties, and increase the electron density of the light-emitting layer.

More specifically, the following relationship (h) is preferred in the case of the first light-emitting layer 4a illustrated in FIG. 2. (h) LUMO (H1)–LUMO (D1)>HOMO (D1)–HOMO (H1)

Satisfying the relationship (h) can reduce the hole trapping properties and improve the electron trapping properties in the first light-emitting layer 4a.

Furthermore, satisfying the relationships (g) and (h), together with the relationship (b), can reduce the hole trapping properties and relatively enhance the electron trapping properties in the first light-emitting layer 4a. This can increase the electron density of each light-emitting layer adjacent to the intermediate layer 5, increase recombination probability, and consequently decrease the hole density.

(9) The second light-emitting layer 4b is a blue-light-emitting layer.

In the layered structure of FIG. 1A, preferably, the first dopant in the first light-emitting layer 4a emits red light, one of the second dopant in the second light-emitting layer 4b and the third dopant in the third light-emitting layer 4c emits green light, and the other of the second dopant and the third dopant emits blue light. A red-light-emitting dopant with a narrow band gap in the first light-emitting layer 4a enables the first light-emitting layer 4a to easily exhibit hole trapping properties and easily have a hole barrier with the intermediate layer 5. Furthermore, in the present invention, a recombination region is localized to the side of the electron-transport layer 6. Such a layered structure in which excitation energy generated by a blue-light-emitting dopant and a green-light-emitting dopant each having a wide band gap can be transferred to a red-light-emitting dopant on the side of the hole-transport layer 3 is more likely to achieve balanced white light emission and high durability.

In particular, the second light-emitting layer 4b is preferably a blue-light-emitting layer. This is because the use of a blue-light-emitting dopant with a wide band gap tends to satisfy the relationships (b) and (g) and can reduce the hole trapping properties of the second light-emitting layer 4b.

Furthermore, in the layered structure of FIG. 1B, preferably, the third dopant in the third light-emitting layer 4c emits red light, the first dopant in the first light-emitting layer 4a emits green light, and the second dopant in the second light-emitting layer 4b emits blue light. This is because a red-light-emitting dopant with a narrow band gap in the third light-emitting layer 4c enables the third light-emitting layer 4c to have enhanced electron trapping properties, can decrease the number of electrons reaching the hole-transport layer 3, and improves durability. Furthermore, in the present invention, a recombination region is localized to the side of the electron-transport layer 6. Such a layered structure in which excitation energy generated by a blue-light-emitting dopant with a wide band gap can be transferred to a red-light-emitting dopant and a green-light-emitting dopant on the side of the hole-transport layer 3 is more likely to achieve balanced white light emission and high durability.

In the layered structure of FIG. 1C, the first dopant and the third dopant in the first light-emitting layer 4a are preferably a red-light-emitting dopant and a green-light-emitting dopant, and the second dopant in the second light-emitting layer 4b is preferably a blue-light-emitting dopant. This is because a red-light-emitting dopant with a narrow band gap in the first light-emitting layer 4a enables the first light-emitting layer 4a to have enhanced electron trapping properties, can decrease the number of electrons reaching the hole-transport layer 3, and improves durability. Furthermore, in the present invention, a recombination region is localized to the side of the electron-transport layer 6. Such a layered structure in which excitation energy of a blue-light-emitting dopant with a wide band gap can be transferred to a red-light-emitting dopant and a green-light-emitting dopant on the side of the hole-transport layer 3 is more likely to achieve balanced white light emission and high durability.

Coexistence of a red-light-emitting dopant and a green-light-emitting dopant with different band gaps in the first light-emitting layer 4a tends to cause energy transfer to a red-light-emitting dopant with a narrower band gap. Thus, the doping concentration of the red-light-emitting dopant is preferably lower than the doping concentration of the green-light-emitting dopant. It is desirable that the mass ratio of the red-light-emitting dopant concentration to the green-light-emitting dopant concentration be preferably 1/5 or less, more preferably 1/10 or less. This can adjust the emission intensity balance of the red and green dopants.

Thus, in an organic EL device according to the present invention, the second light-emitting layer 4b in the layered structures of FIGS. 1A to 1C is preferably a blue-light-emitting layer.

A blue-light-emitting dopant, as used herein, refers to a light-emitting material with an emission spectrum peak wavelength in the range of 430 to 480 nm. A green-light-emitting dopant, as used herein, refers to a light-emitting material with an emission spectrum peak wavelength in the range of 500 to 570 nm. A red-light-emitting dopant, as used herein, refers to a light-emitting material with an emission spectrum peak wavelength in the range of 580 to 680 nm.

(10) Each host material is a hydrocarbon.

In the present invention, the host in the light-emitting layers 4a to 4c may be any compound and is preferably a compound that does not have a bond with low binding stability in its molecular structure. A compound that has a bond with low binding stability, that is, an unstable bond with low binding energy in its molecular structure contained as a host in a light-emitting layer constituting an organic EL device tends to undergo degradation while the device is driven. This is likely to adversely affect the durability life of the organic EL device.

For example, in [4,4'-bis(carbazol-9-yl)biphenyl] (CBP) described below, a bond with low binding stability refers to a bond between a carbazole ring and a phenylene ring (a nitrogen-carbon bond). The calculated binding energy values of CBP, an exemplary compound EM1 of a host, and an exemplary compound HT7 of a hole injection transport material are compared below. The calculation method was b3-lyp/def2-SV(P).

Binding energy (calculated values)

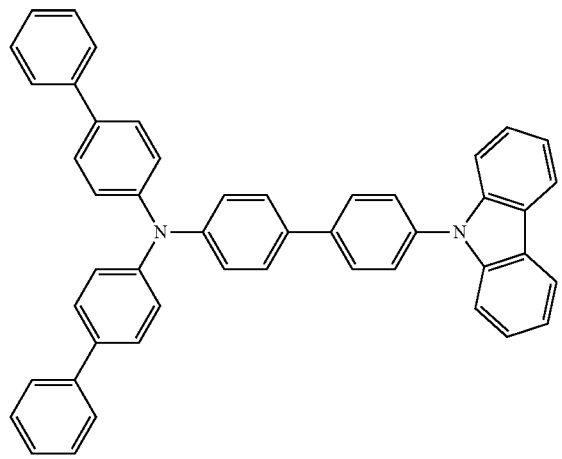

HT7
3.86 eV

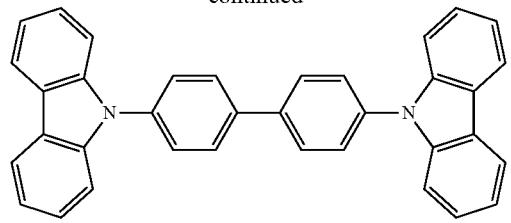

CBP
3.86 eV

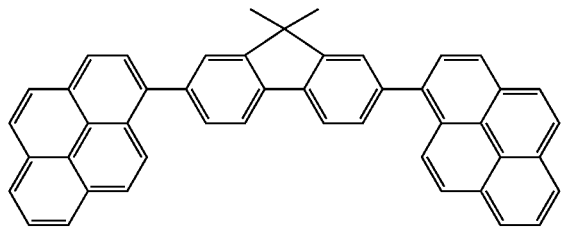

EM1
5.01 eV

The results show that the host in the light-emitting layers 4a to 4c of an organic EL device according to the present invention is preferably a hydrocarbon with high binding stability composed of carbon-carbon bonds. Because a hydrocarbon host has a low LUMO level, a dopant should also have a low LUMO level to form a light-emitting layer with enhanced electron trapping properties.

(11) Each dopant has a fluoranthene skeleton.

In the present invention, the dopant in the light-emitting layers 4a to 4c may be any compound and is preferably a compound that has a fluoranthene skeleton, which is an electron-withdrawing structure, from the perspective of the electron trapping properties described in (10). The fluoranthene skeleton can decrease the LUMO level, increase the difference in LUMO level from a host material, and improve the electron trapping properties. Having no electron-donating substituted amino group is also preferred because it decreases the LUMO level and enhances the electron trapping properties. A compound without a substituted amino group constituting a nitrogen-carbon bond is also preferred in terms of binding stability.

Thus, the light-emitting layers 4a to 4c can have enhanced electron trapping properties when the host is a hydrocarbon and when the dopant is a compound that has the fluoranthene skeleton and has no substituted amino group. In this case, such materials constituting the light-emitting layers 4a to 4c have high stability and can provide an organic EL device with high durability.

The fluoranthene skeleton is described below. The fluoranthene skeleton refers to fluoranthene and a fused polycyclic compound produced by condensation of fluoranthene and an aromatic hydrocarbon. More specifically, the fluoranthene skeleton refers to fused polycyclic compounds represented by the following FF1 to FF30.

FF1
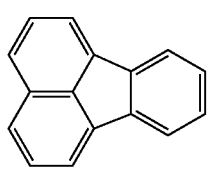

FF2
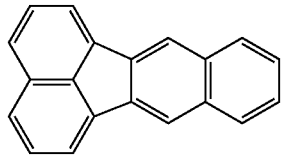

FF3
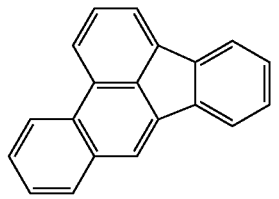

FF4
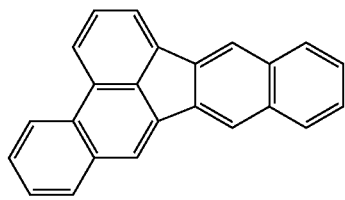

FF5
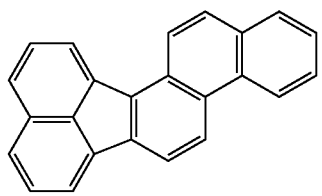

FF6
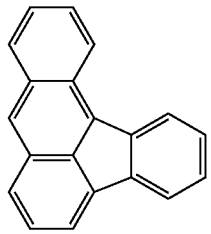

FF7
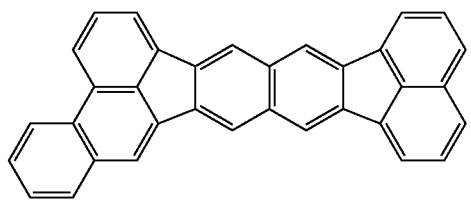

FF8
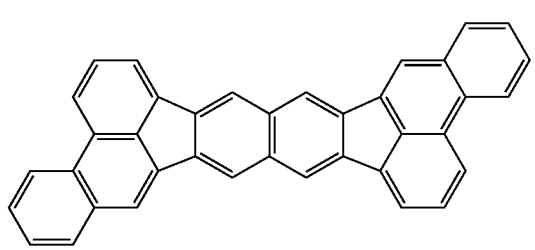

FF9
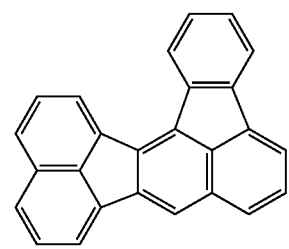
FF10
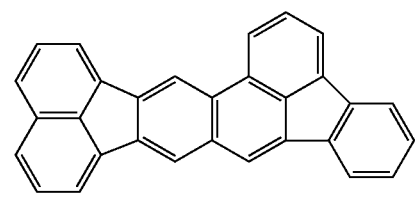
FF11
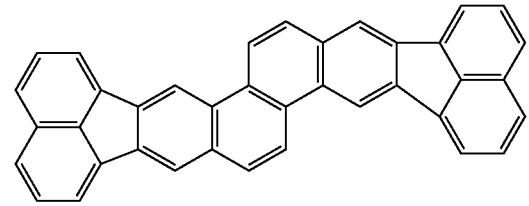
FF12
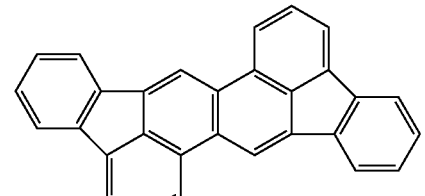
FF13
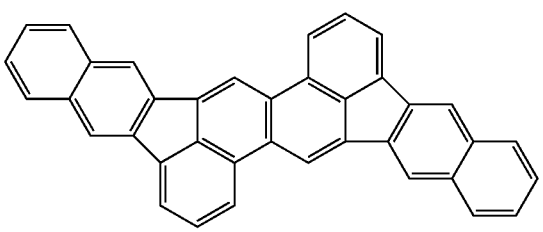
FF14
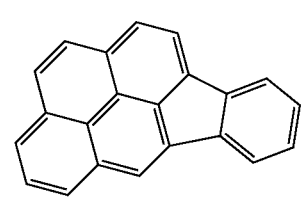
FF15
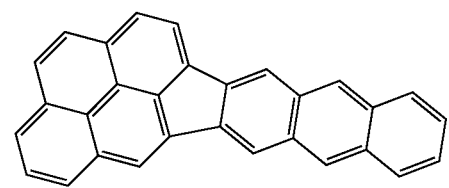
FF16
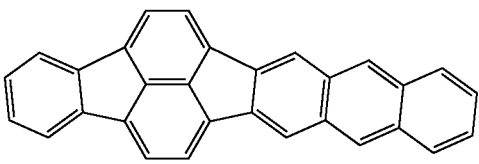
FF17
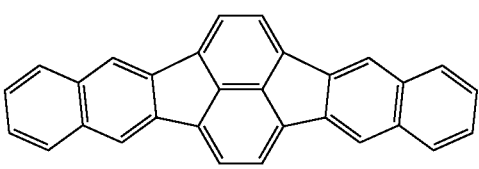
FF18
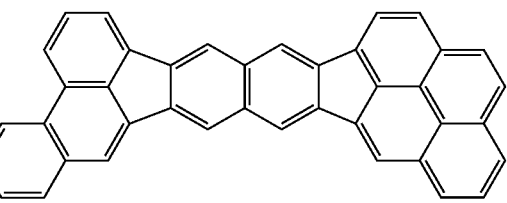
FF19
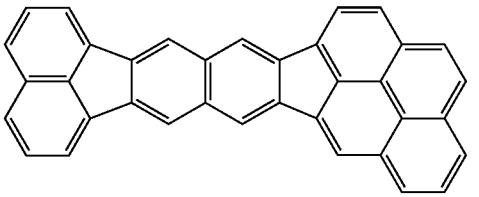
FF20
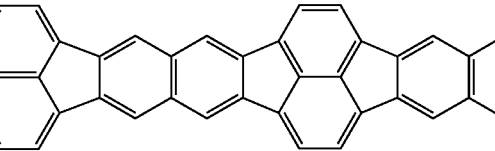
FF21
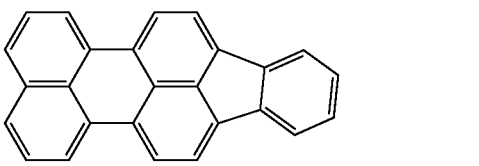
FF22
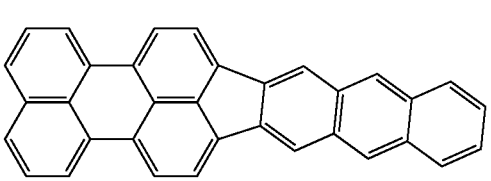
FF23
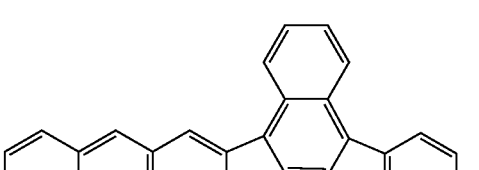

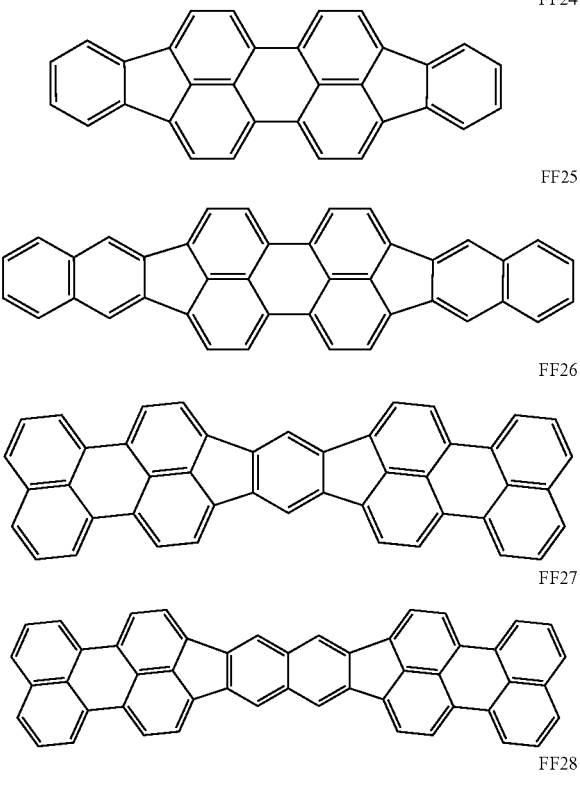

FF24

FF25

FF26

FF27

FF28

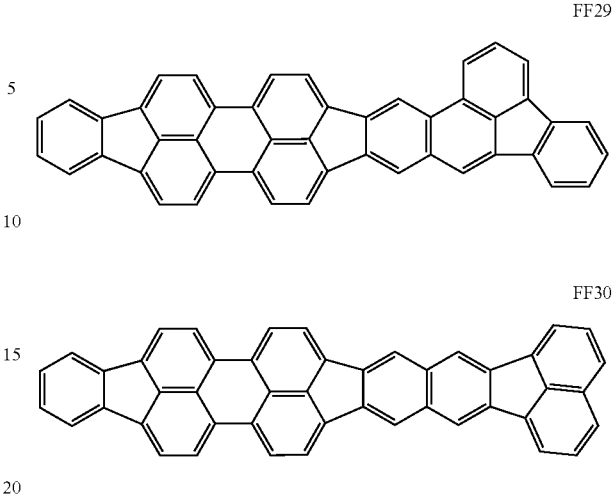

FF29

FF30

Among the fluoranthene compounds represented by FF1 to FF30, dopants with a structure in which two or more fluoranthenes are fused are preferred to improve electron-withdrawing properties and improve the electron trapping properties. More specifically, dopants with skeletons represented by FF7 to FF13, FF16 to FF20, and FF23 to FF30 are suitably used in the present invention.

Thus, an organic EL device with particularly high durability and good emission balance can be obtained when the conditions (5) to (10) are satisfied, that is, when the third dopant has enhanced electron trapping properties, when each light-emitting layer has poor hole trapping properties, when the second light-emitting layer 4b is a blue-light-emitting layer, when the host is a hydrocarbon, and when the dopant has a fluoranthene skeleton.

Specific examples of the host used in the present invention are described below. These compounds are only specific examples, and the present invention is not limited to these compounds.

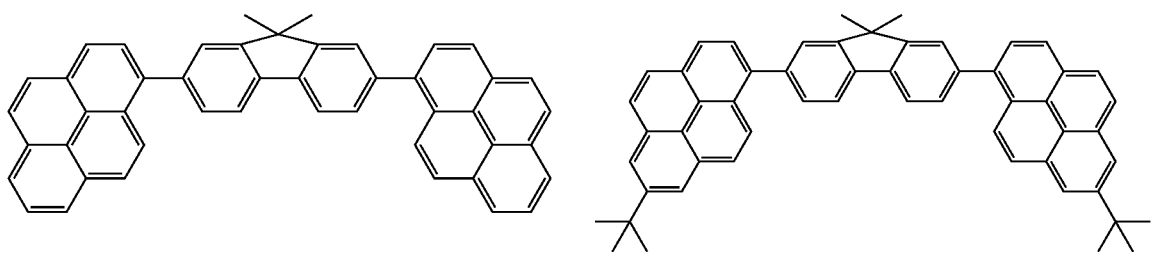

EM1

EM2

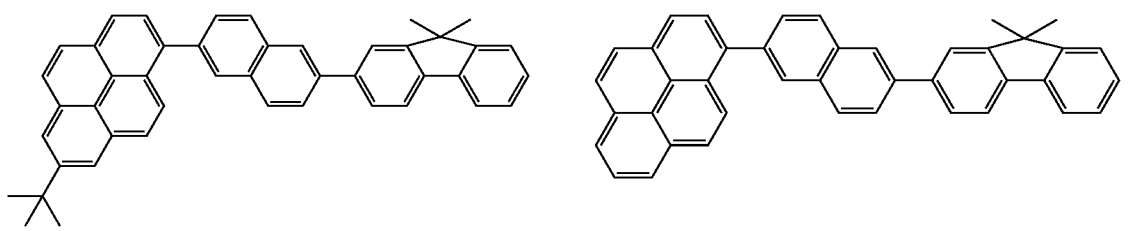

EM3

EM4

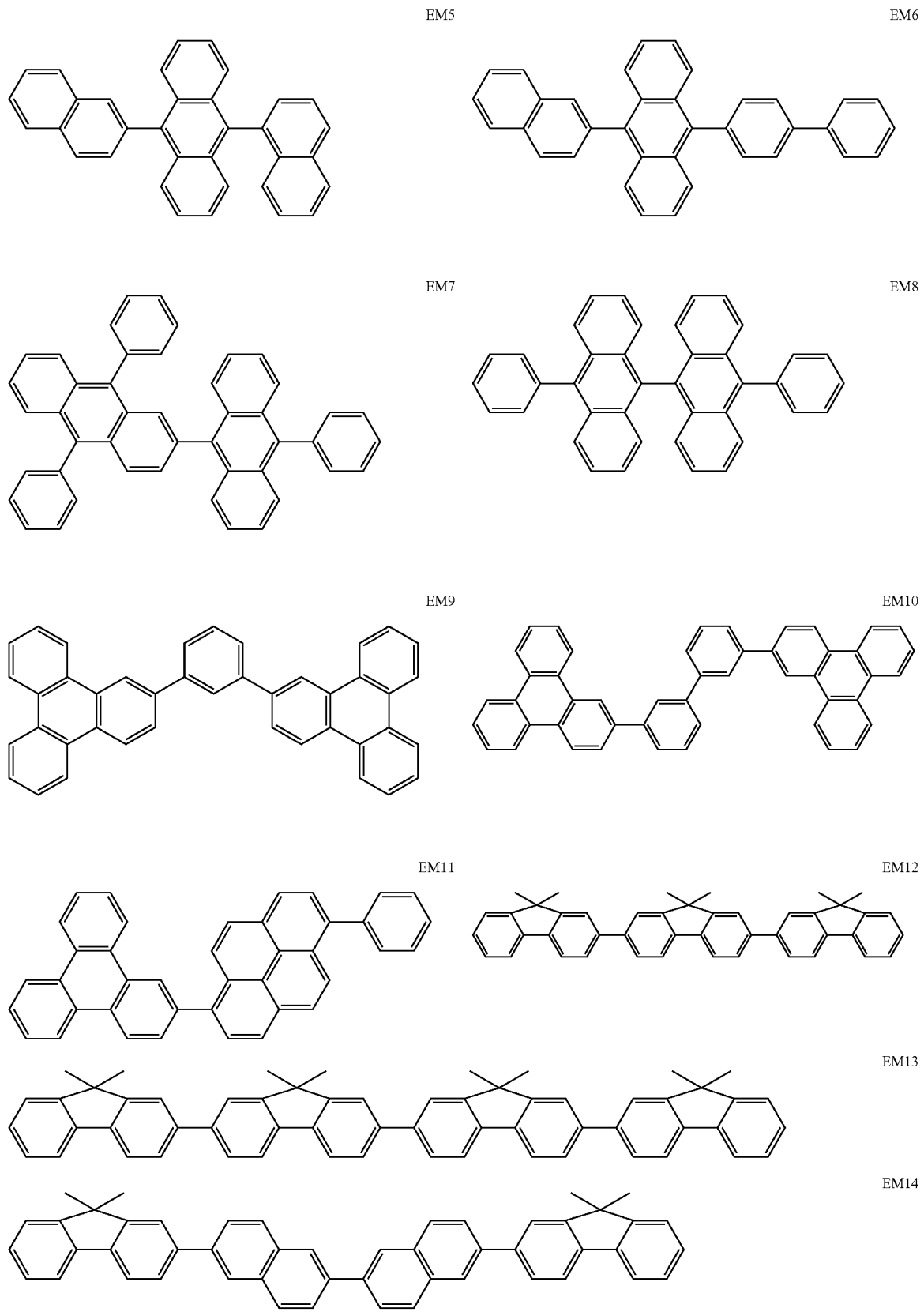

-continued
EM15
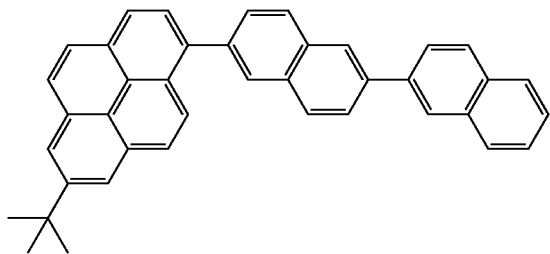
EM16
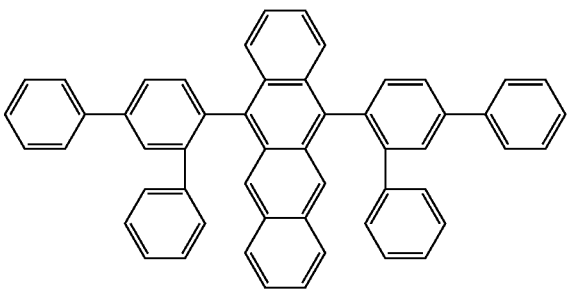
EM17
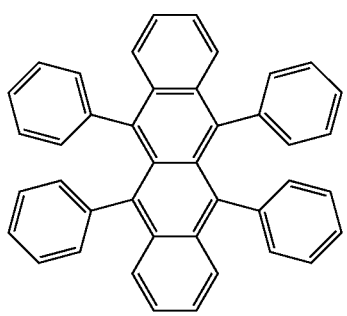
EM18
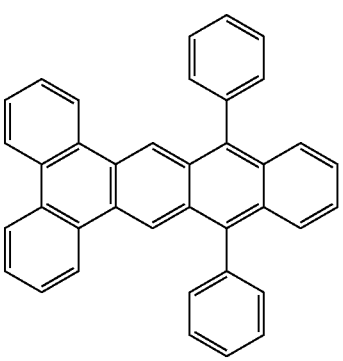
EM19
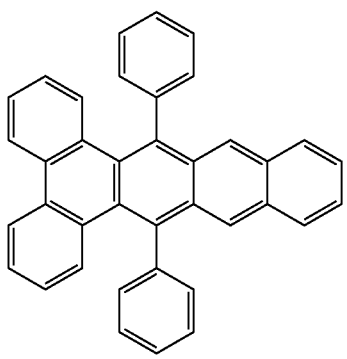
EM20
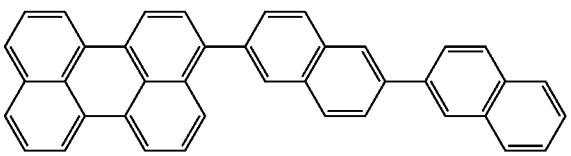
EM21
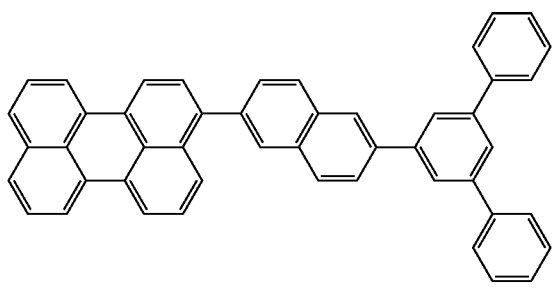
EM22
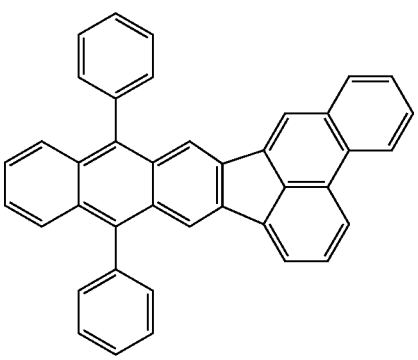

EM23

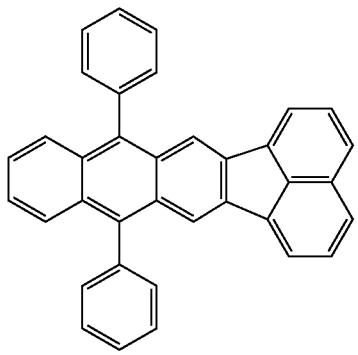

EM24

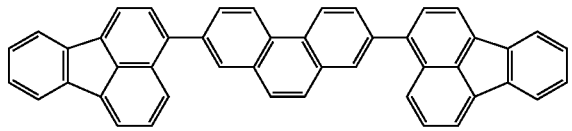

EM25

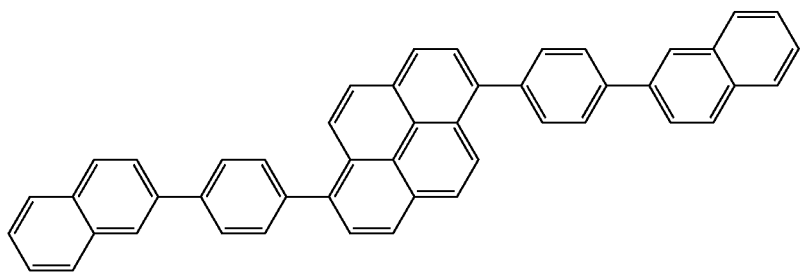

EM26

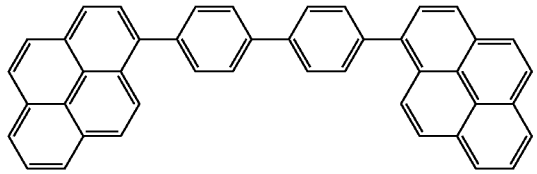

EM27

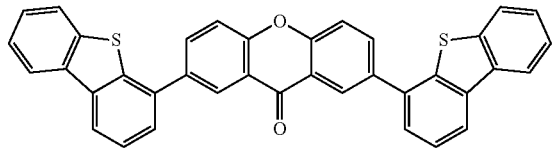

EM28

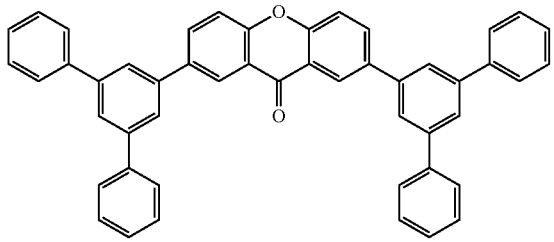

EM29

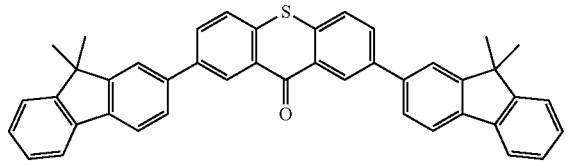

EM30

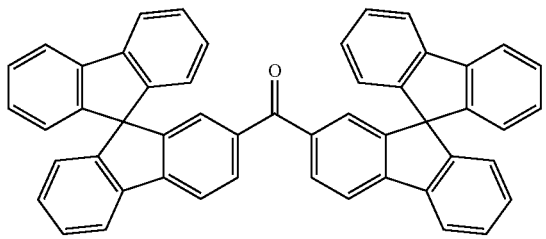

EM31

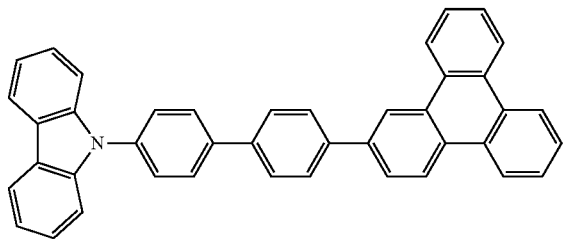

Among the hosts represented by EM1 to EM31, hydrocarbons represented by EM1 to EM26 are preferred in terms of the binding stability described above. These compounds can be used as hosts to provide an organic EL device with high durability.

In addition to these specific examples, carbazole derivatives, dibenzofuran derivatives, dibenzothiophene derivatives, organoaluminum complexes, such as tris(8-quinolinolato) aluminum, and organoberyllium complexes are used as hosts in the present invention.

Examples of blue-light-emitting dopants used in the present invention are described below. The present invention is not limited to these examples.

BD1
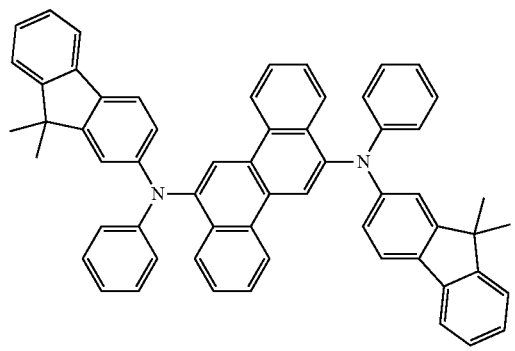
BD2
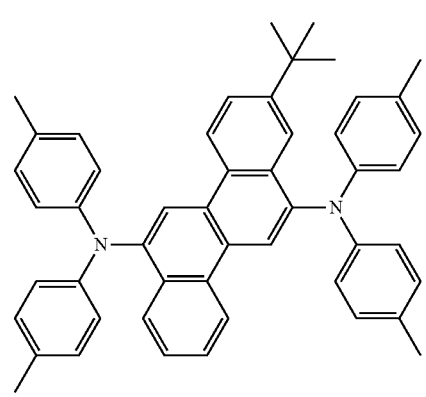
BD3
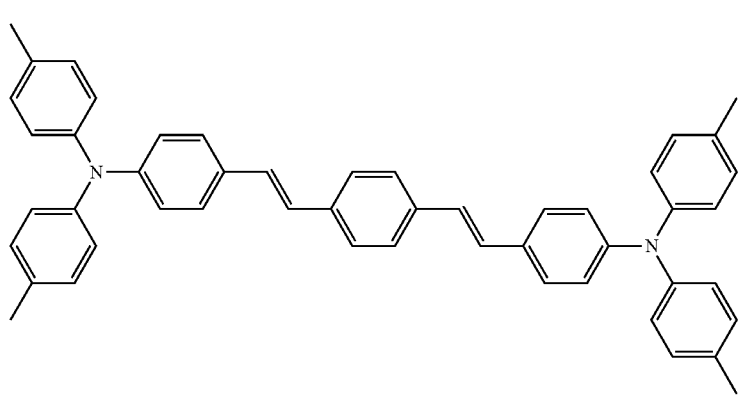
BD4
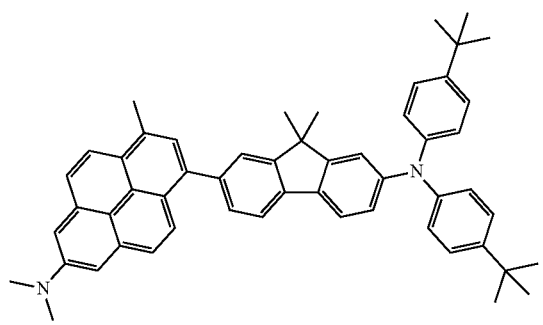
BD5
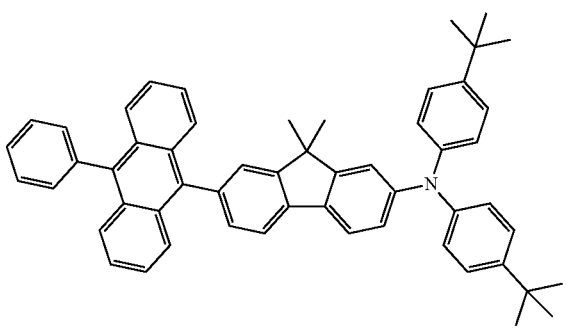
BD6
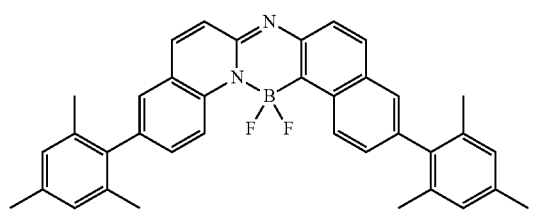
BD7
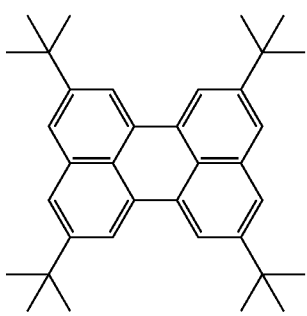

-continued
BD8
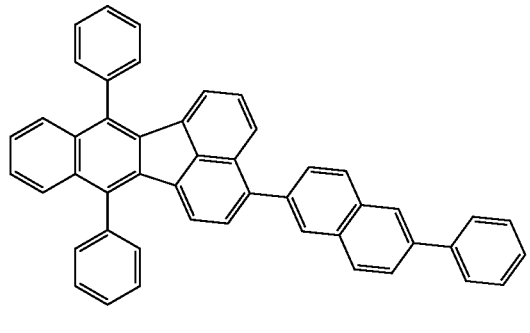
BD9
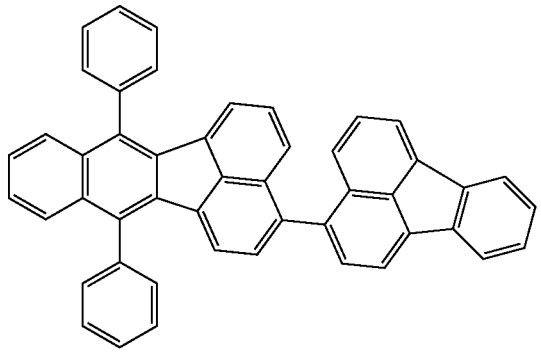
BD10
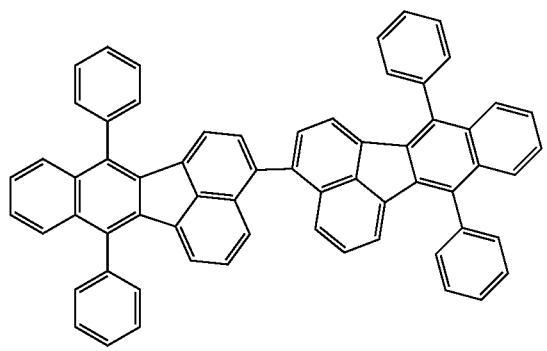
BD11
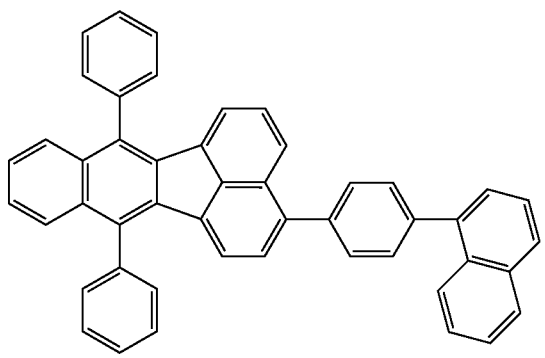
BD12
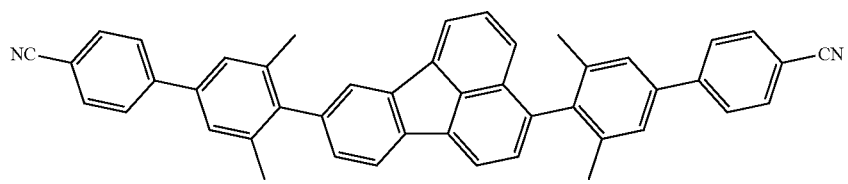
BD13
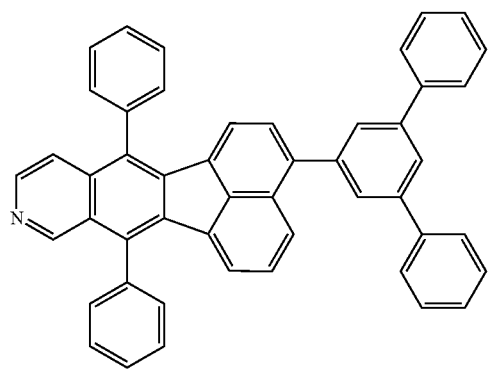
BD14
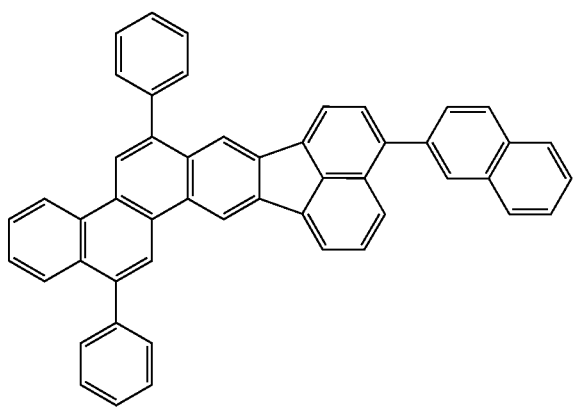

-continued
BD15
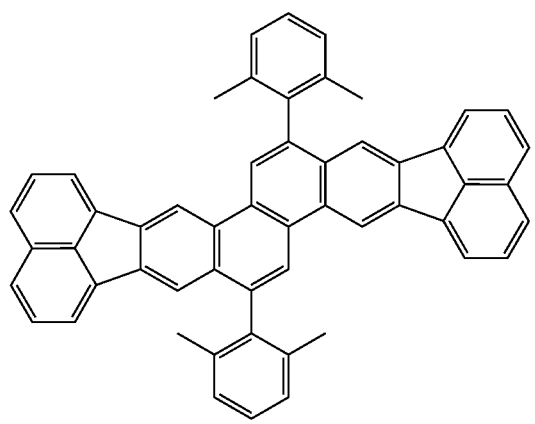
BD16
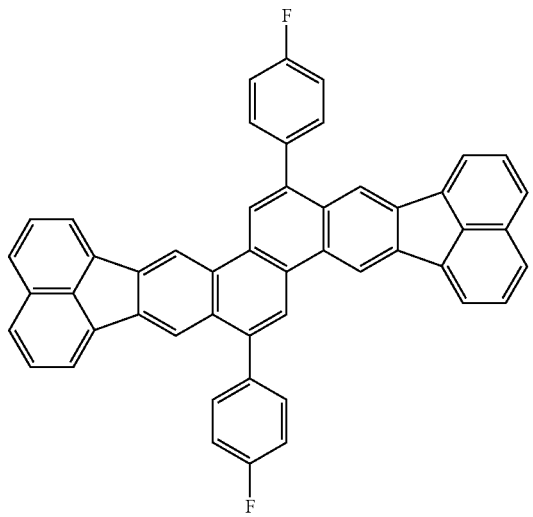
BD17
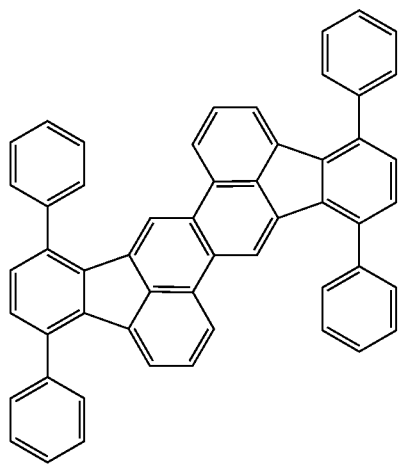
BD18
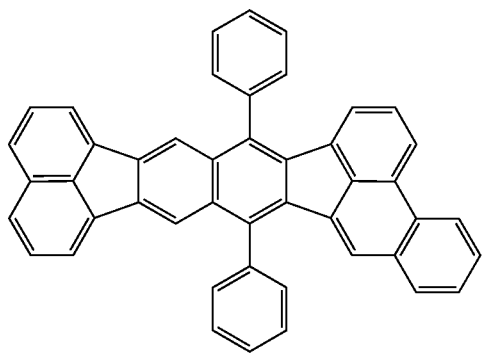
BD19
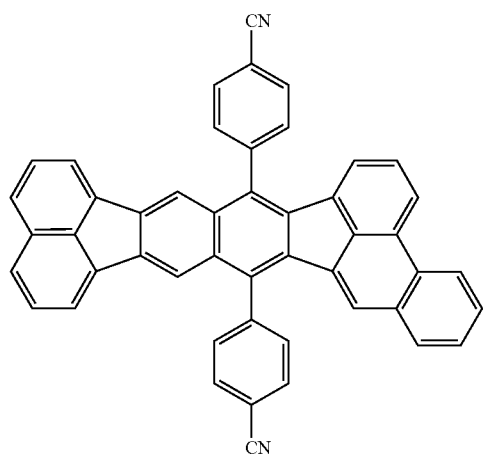
BD20
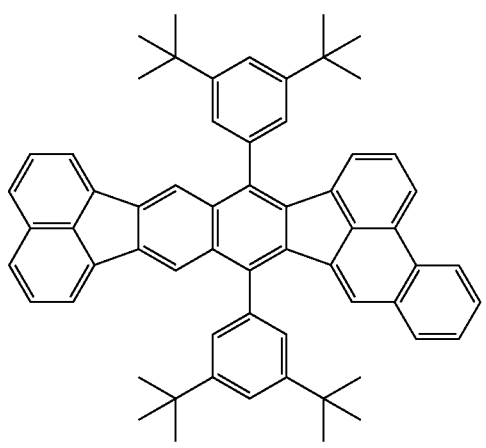

-continued
BD21 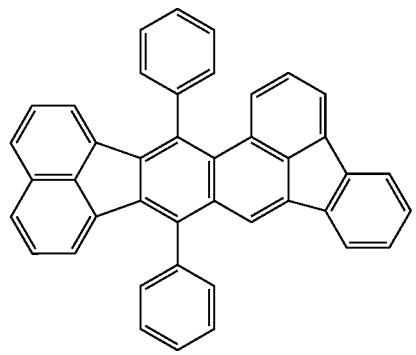
BD22 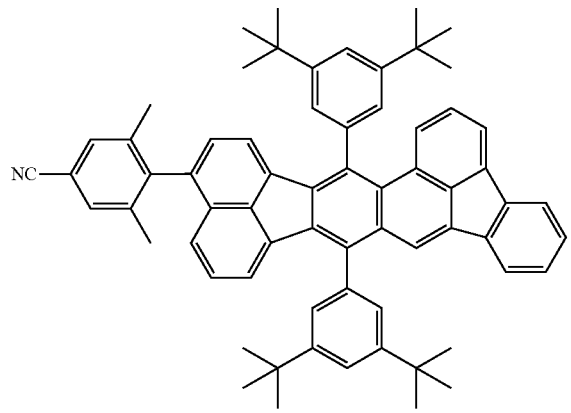
BD23 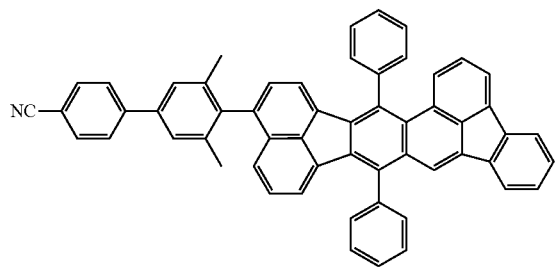
BD24 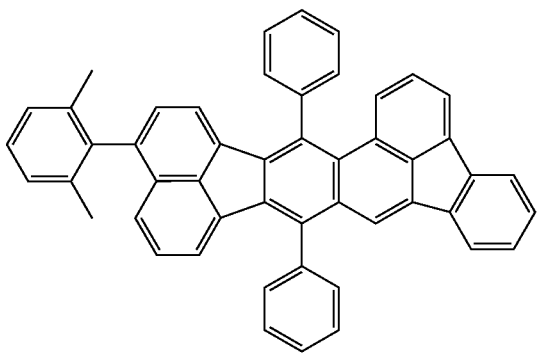
BD25 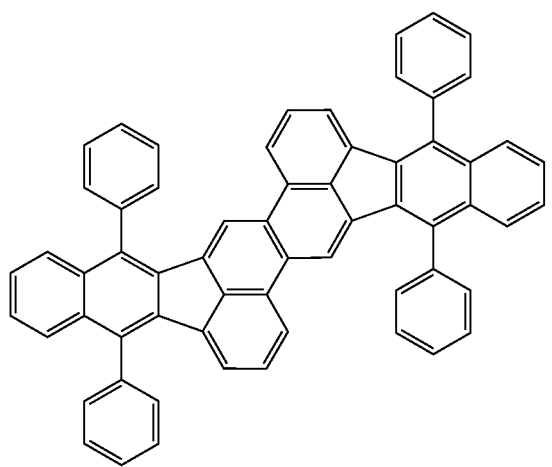
BD26 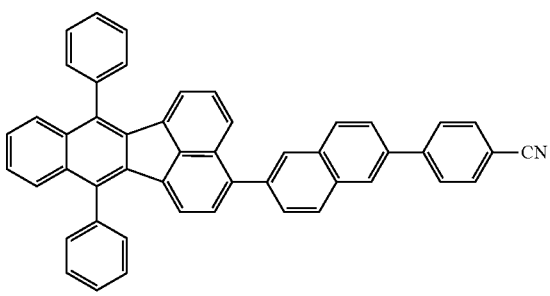

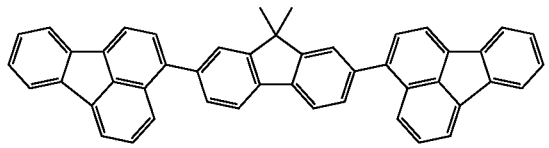

BD27

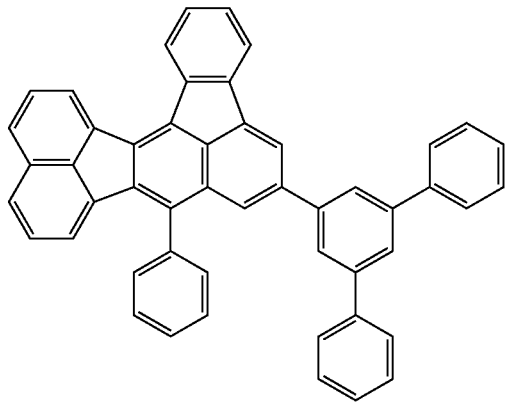

BD28

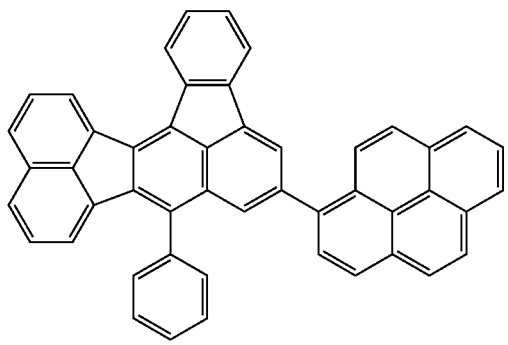

BD29

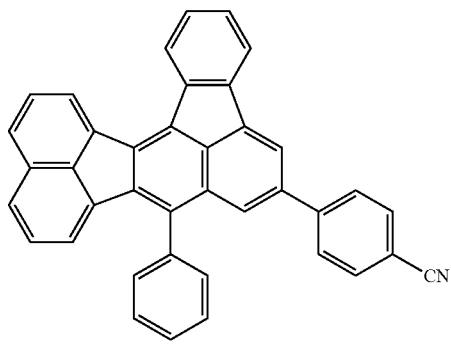

BD30

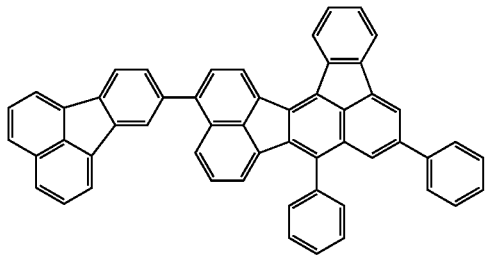

BD31

Among the blue-light-emitting dopants represented by BD1 to BD31, those without an electron-donating substituted amino group are preferred in terms of electron trapping properties. Furthermore, having an electron-withdrawing cyano group is preferred because it can decrease the LUMO level of the dopant and enhance the electron trapping properties of the light-emitting layer.

It is desirable that the doping concentration of the blue-light-emitting dopant be in the range of 0.1% to 10% by mass, more preferably 0.3% to 5% by mass. An excessively low concentration undesirably results in a low electron trap probability, a low recombination probability, and a low blue emission intensity. On the other hand, an excessively high concentration undesirably results in concentration quenching.

Examples of green-light-emitting dopants used in the present invention are described below. The present invention is not limited to these examples.

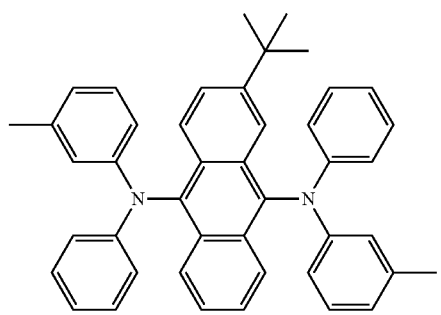

GD1

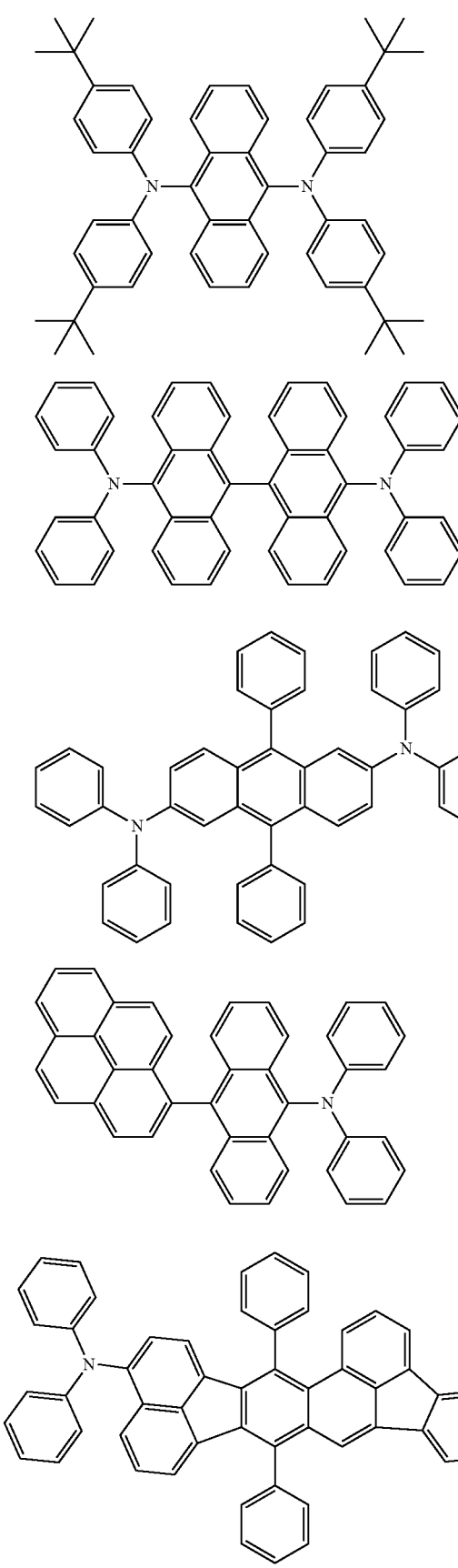
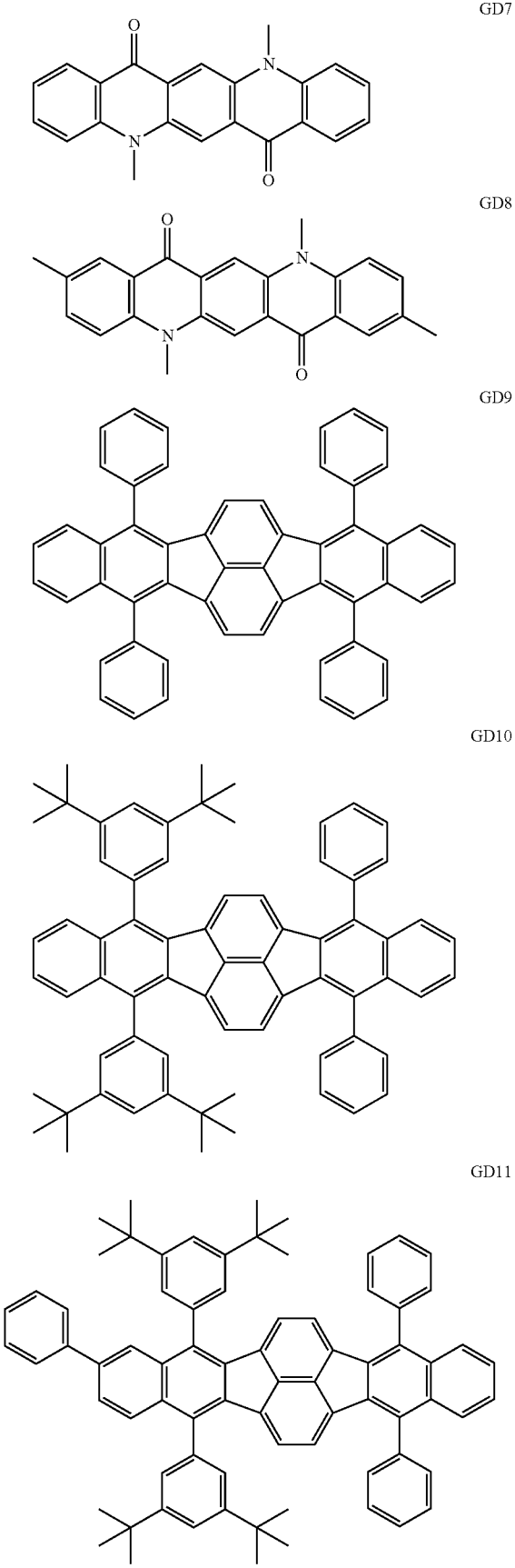

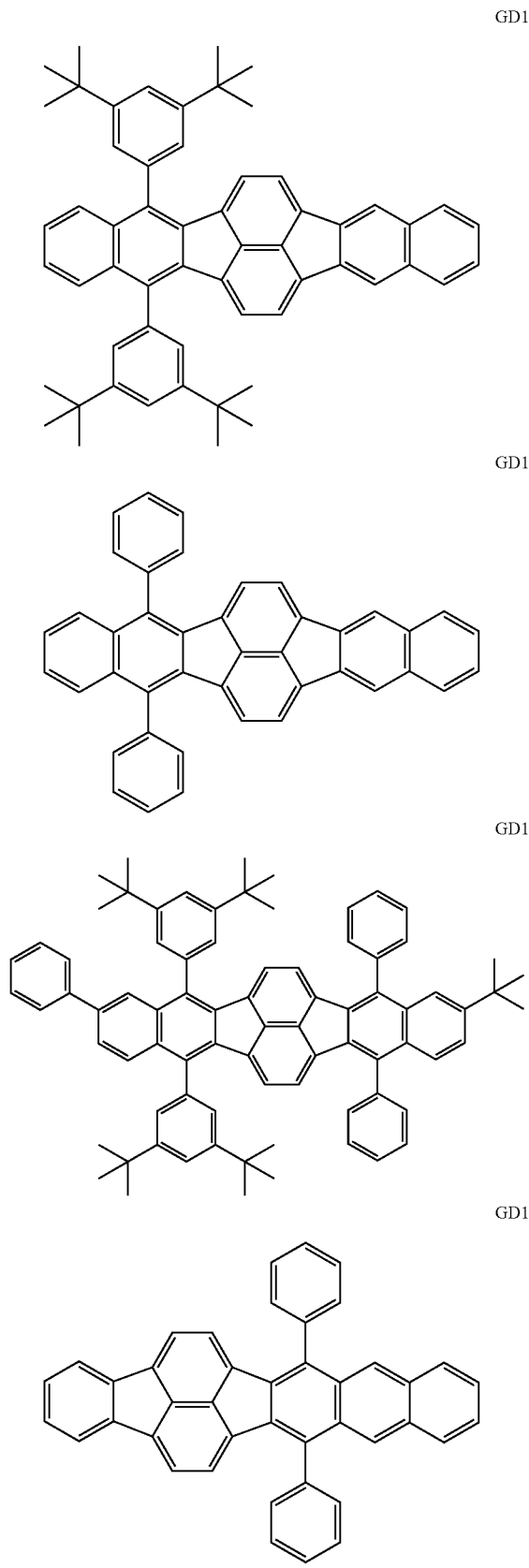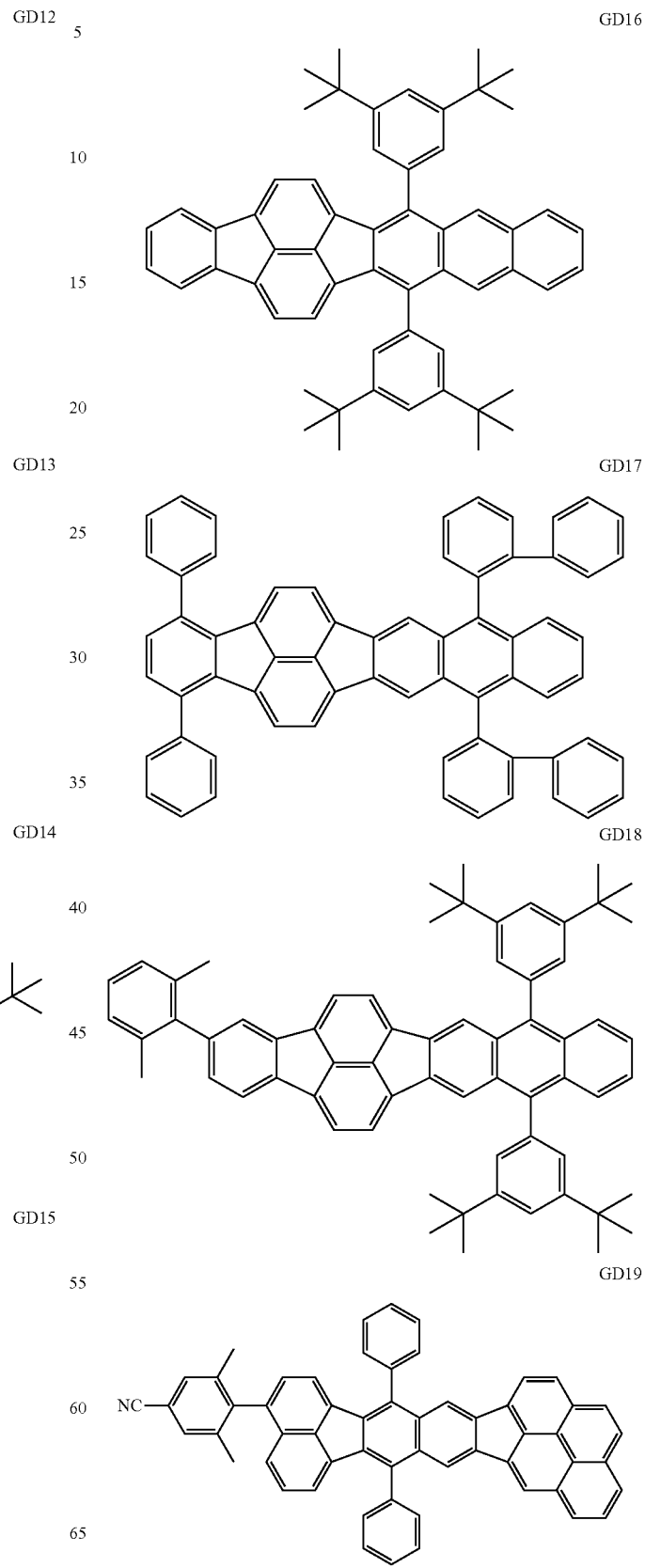

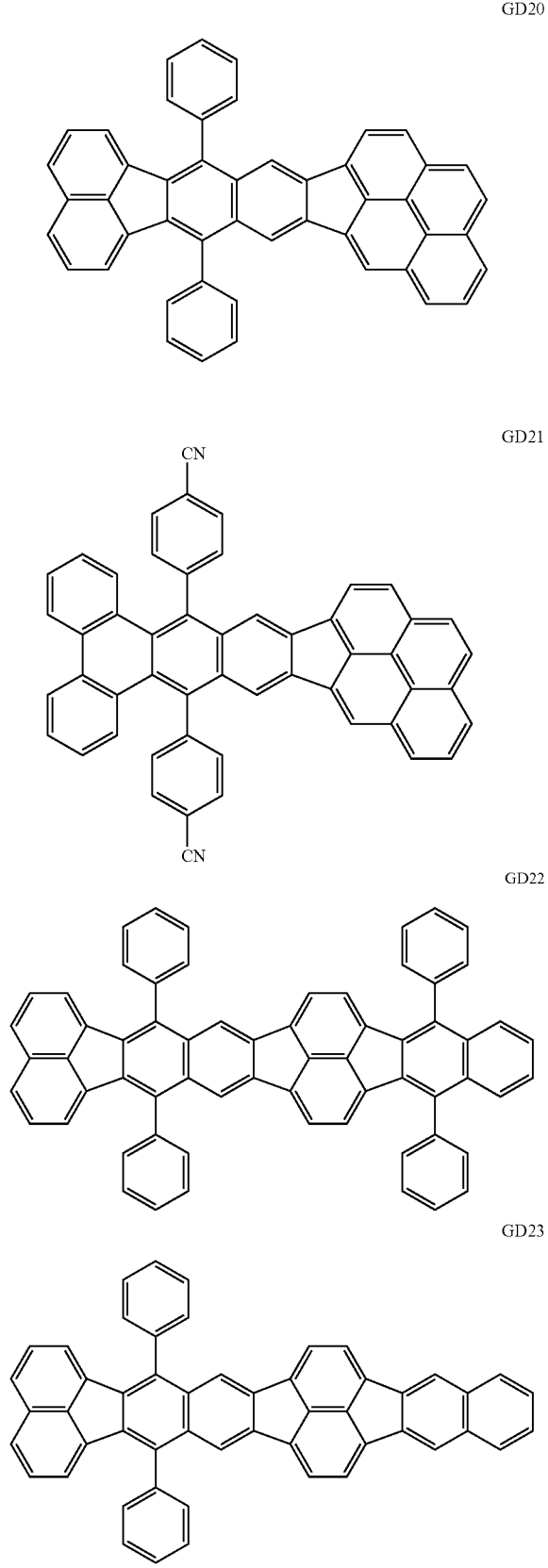
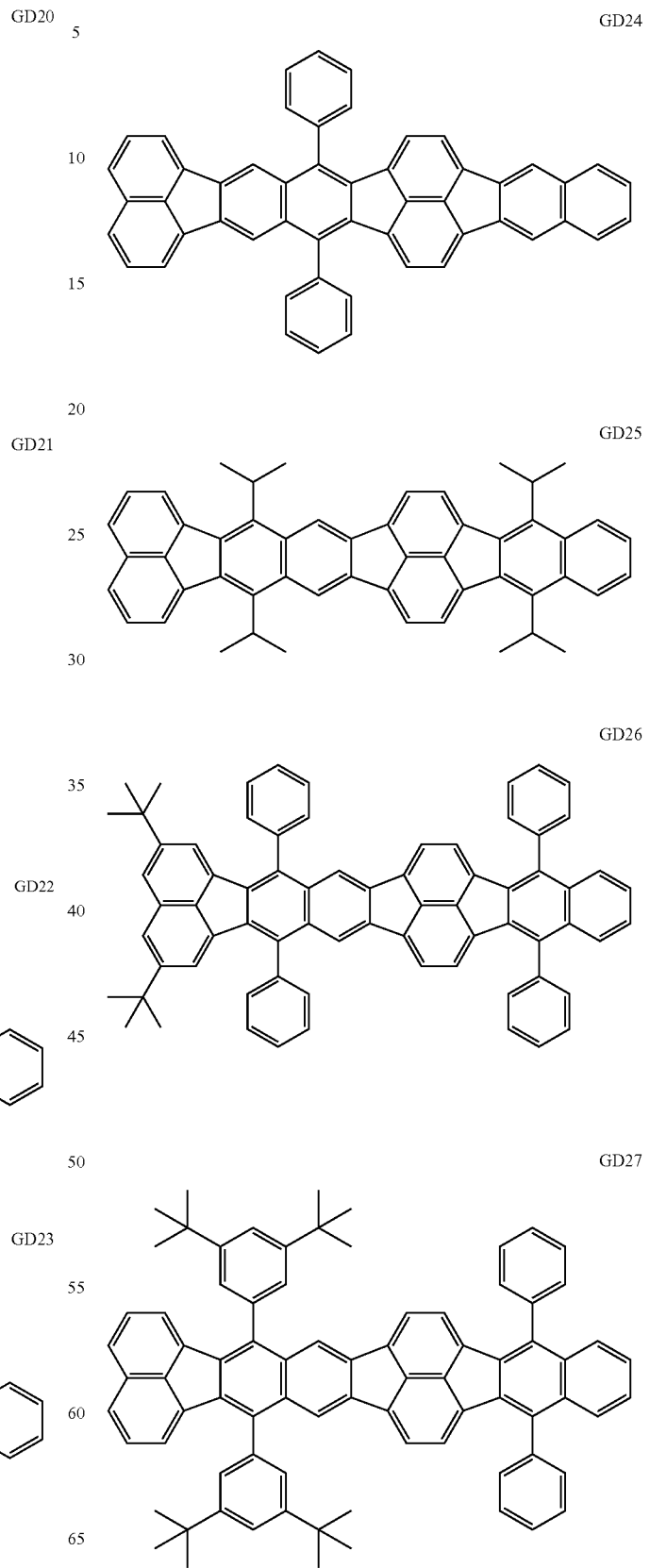

GD28

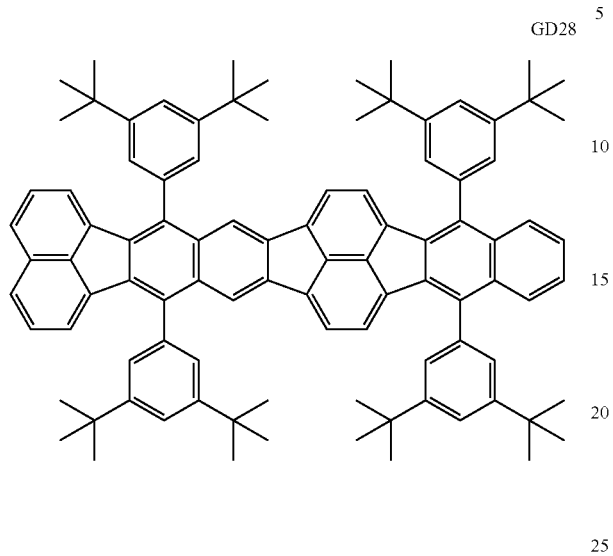

GD31

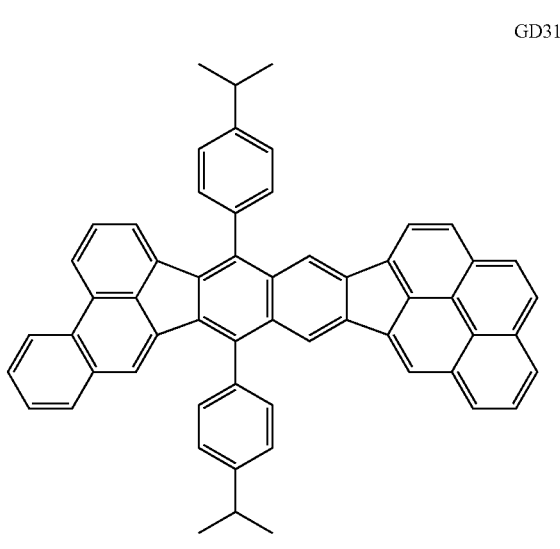

GD29

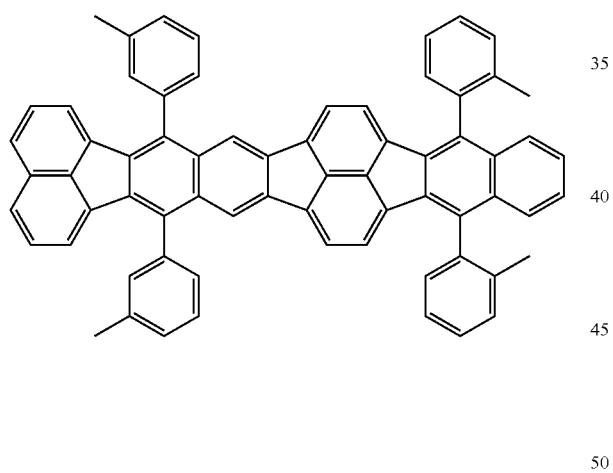

GD32

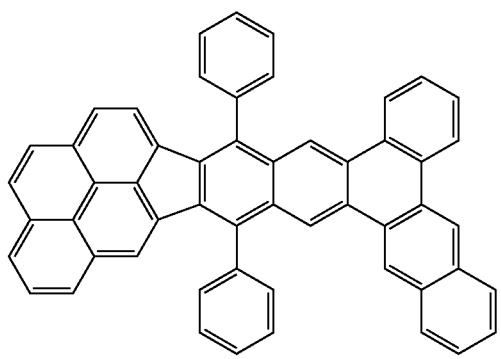

GD30

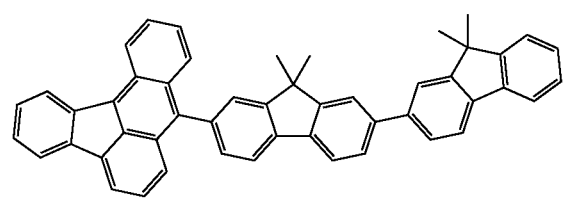

Among the green-light-emitting dopants represented by GD1 to GD32, compounds without an electron-donating substituted amino group are preferred in terms of electron trapping properties.

It is desirable that the doping concentration of the green-light-emitting dopant be in the range of 0.1% to 10% by mass, more preferably 0.3% to 5% by mass. An excessively low concentration undesirably results in a low electron trap probability, a low recombination probability, and a low green emission intensity. On the other hand, an excessively high concentration undesirably results in concentration quenching.

Examples of red-light-emitting dopants used in the present invention are described below. The present invention is not limited to these examples.

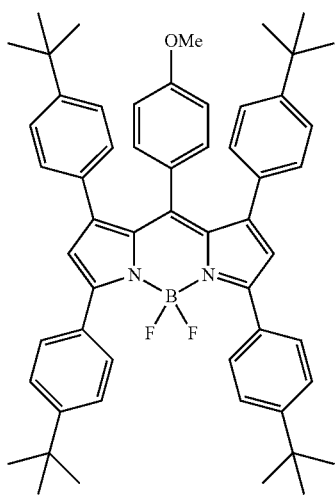
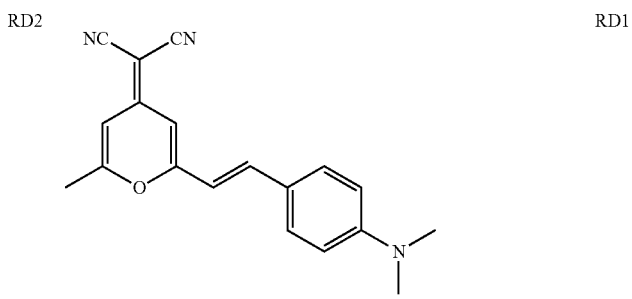
RD2  RD1
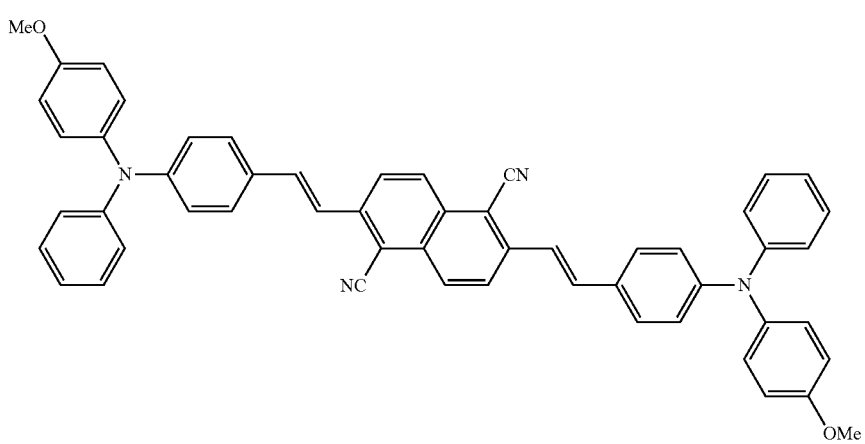
RD3
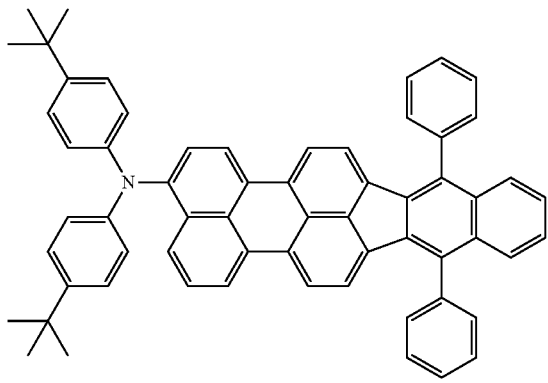
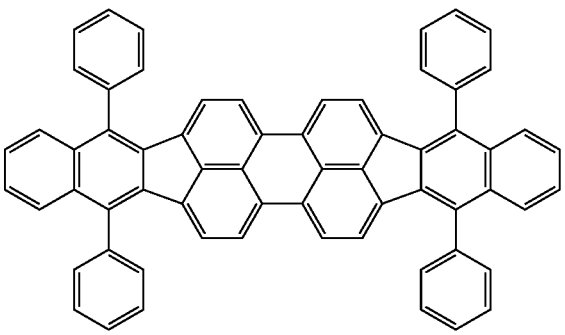
RD4  RD5

-continued
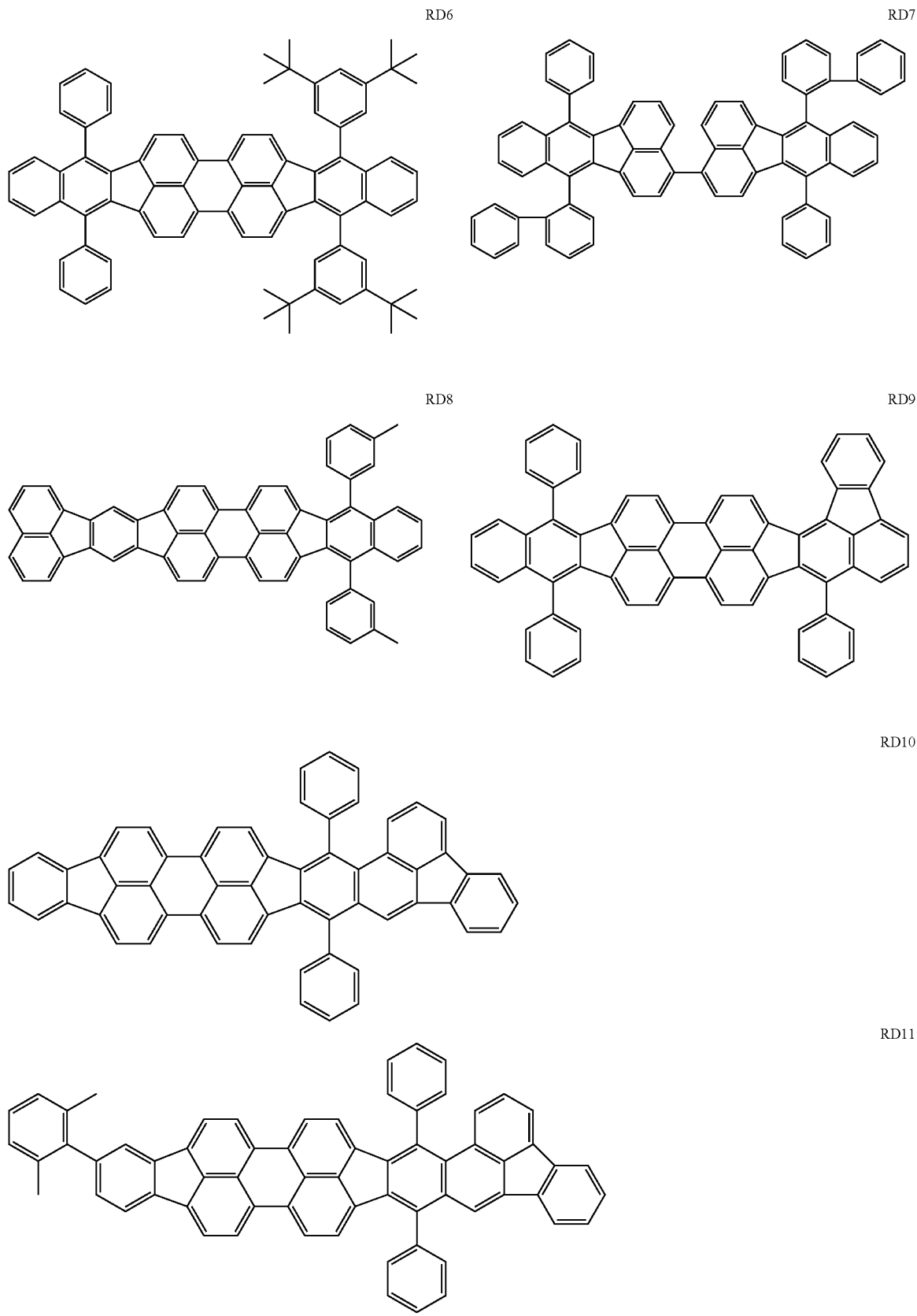

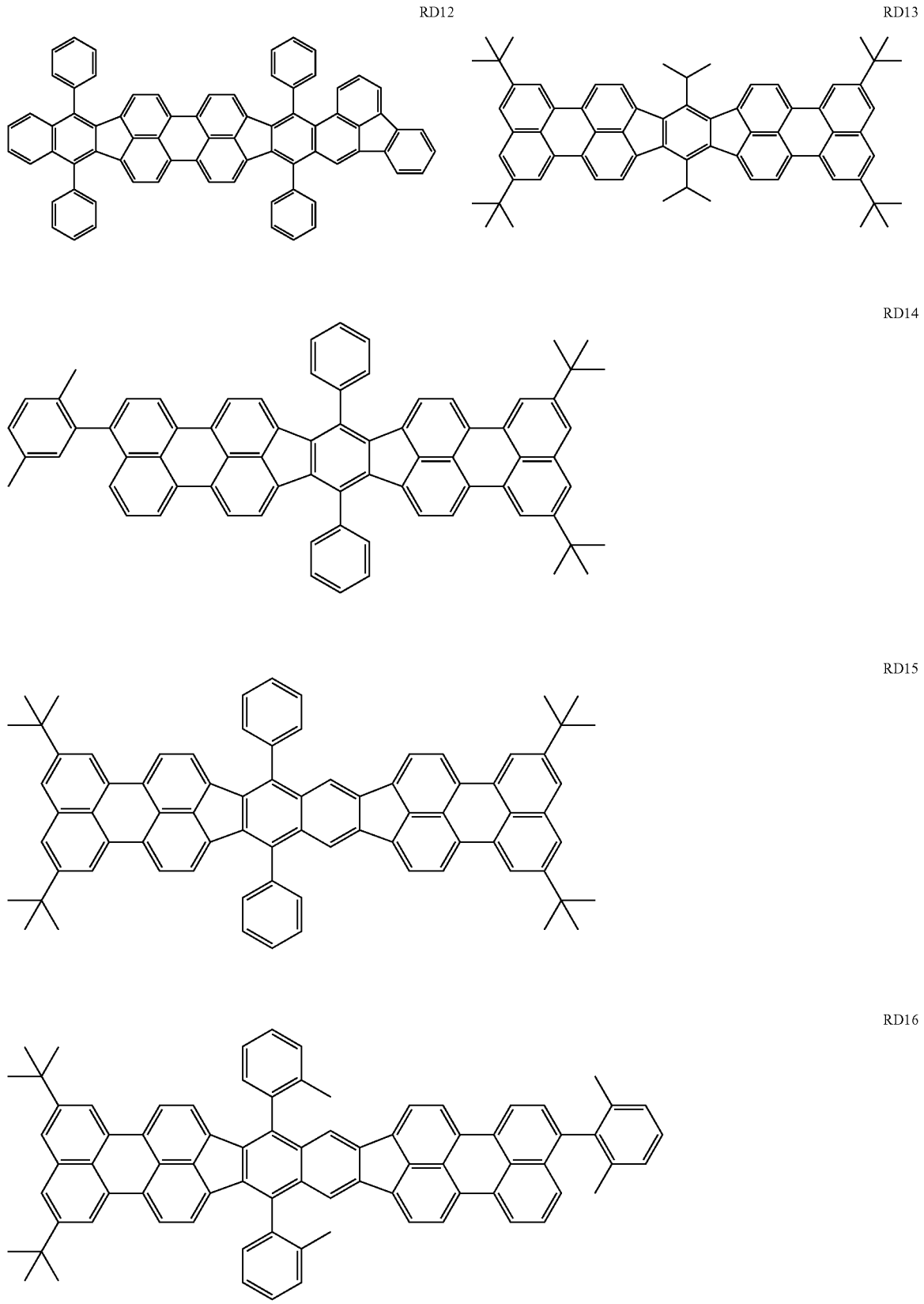

-continued
RD17
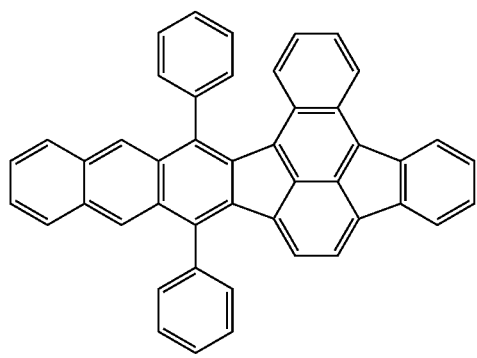
RD18
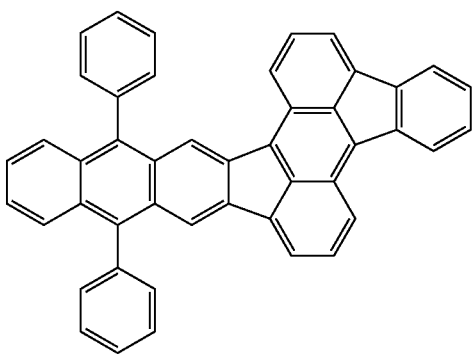
RD19
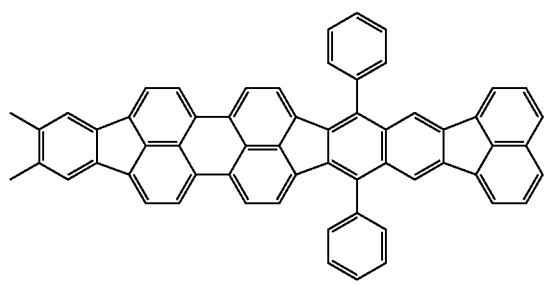
RD20
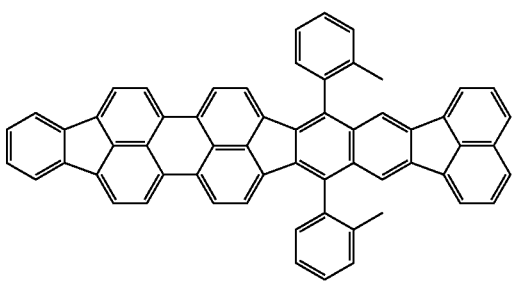
RD21
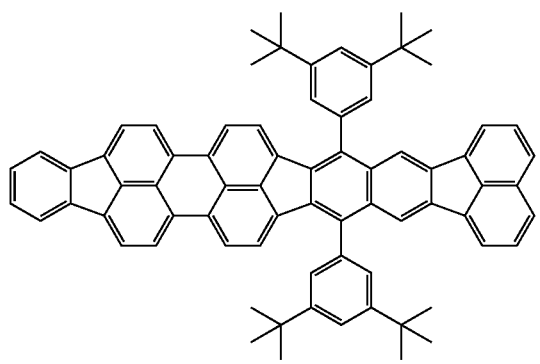
RD22
RD23
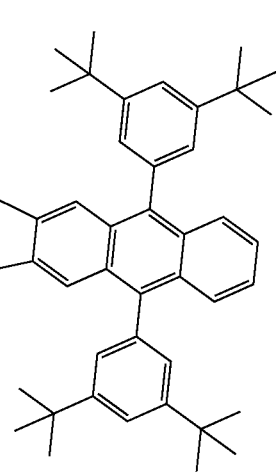

Among the red-light-emitting dopants represented by RD1 to RD23, hydrocarbons are preferred in terms of binding stability.

It is desirable that the doping concentration of the red-light-emitting dopant be in the range of 0.1% to 5% by mass, more preferably 0.1% to 0.5% by mass. An excessively low concentration undesirably results in a low electron trap probability, a low recombination probability, and a low red emission intensity. On the other hand, an excessively high concentration undesirably results in concentration quenching.

In the present invention, in addition to the blue-light-emitting dopants, the green-light-emitting dopants, and the red-light-emitting dopants, the following may also be used: fused-ring compounds (for example, fluorene derivatives, naphthalene derivatives, pyrene derivatives, perylene derivatives, tetracene derivatives, anthracene derivatives, rubrene, etc.), quinacridone derivatives, coumarin derivatives, stilbene derivatives, organoaluminum complexes, such as tris(8-quinolinolato) aluminum, iridium complexes, platinum complexes, rhenium complexes, copper complexes, europium complexes, ruthenium complexes, and polymer derivatives, such as poly(phenylene vinylene) derivatives, polyfluorene derivatives, and polyphenylene derivatives.

Specific examples of the intermediate layer material used in the present invention are described below. These compounds are only specific examples, and the present invention is not limited to these compounds.

IL1

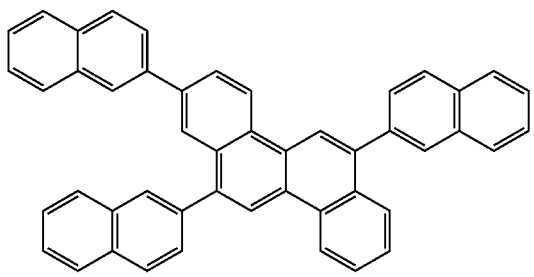

IL2

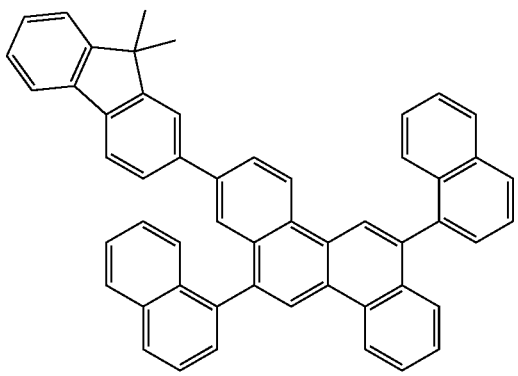

IL3

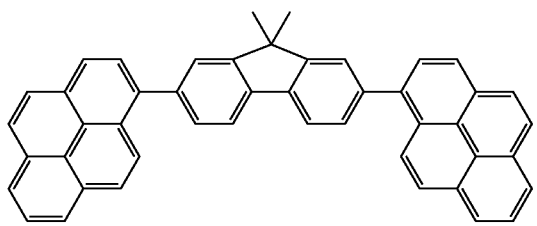

IL4

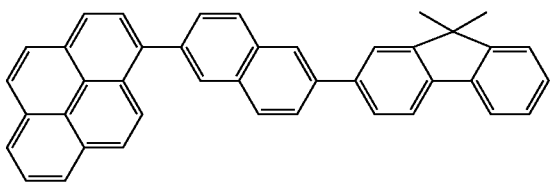

IL5

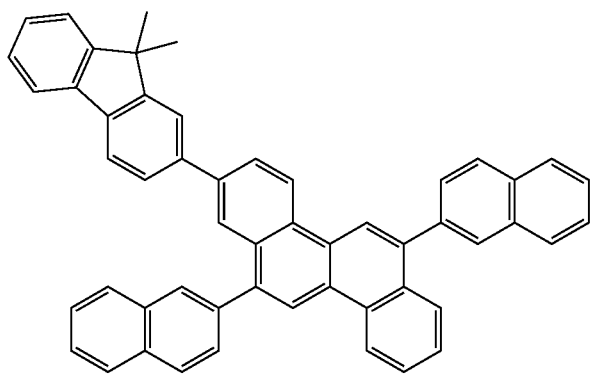

IL6

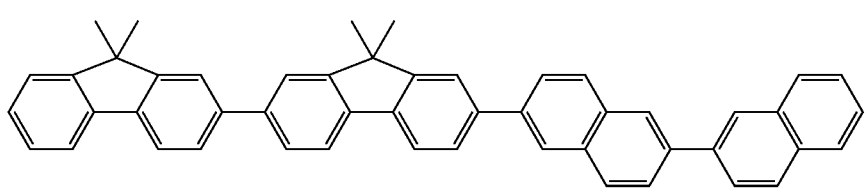

-continued

IL7
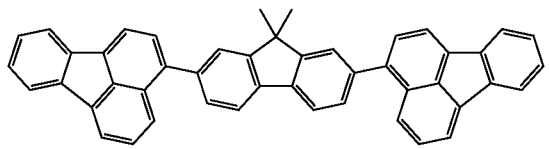

IL8
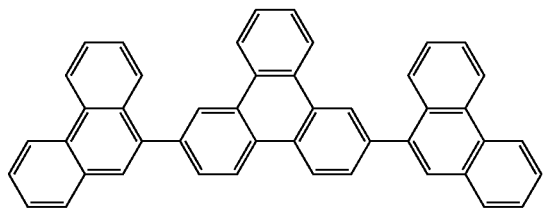

IL9
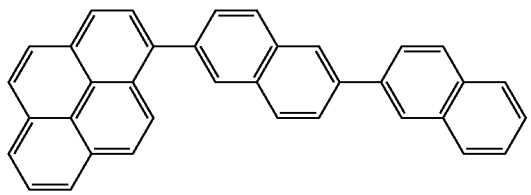

IL10
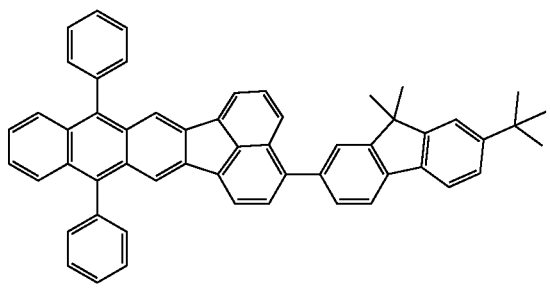

IL11
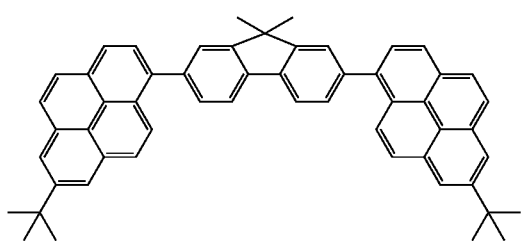

IL12
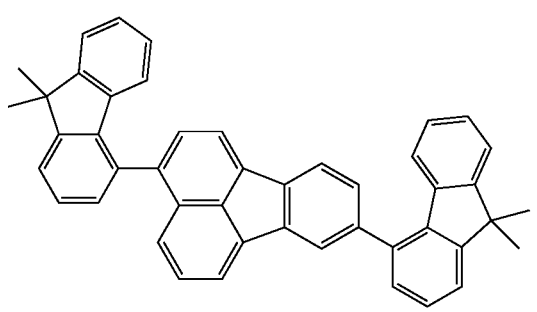

IL13

IL14
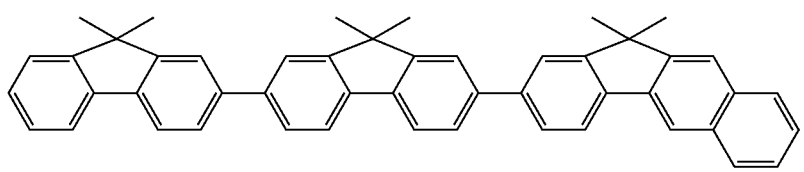

IL15
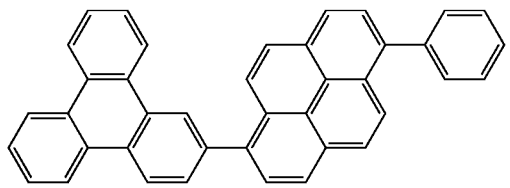

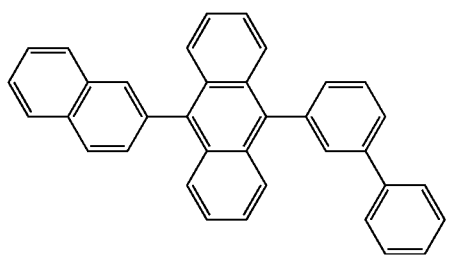

An organic EL device according to the present invention is an organic electric field device that includes a pair of electrodes and an organic compound layer (an organic EL layer) between the pair of electrodes, wherein the organic compound layer has a layered structure composed of a first light-emitting layer/an intermediate layer/a second light-emitting layer from an anode side. In the present invention, a hole-transport layer may be located between the anode and the first light-emitting layer, a hole-injection layer may be located between the anode and the hole-transport layer, or an electron-blocking layer may be located between the hole-transport layer and the first light-emitting layer. Furthermore, in the present invention, an electron-transport layer may be located between the cathode and the second light-emitting layer, an electron-injection layer may be located between the cathode and the electron-transport layer, and a hole-blocking layer may be located between the electron-transport layer and the second light-emitting layer.

In particular, a combination of a hole-transport layer and an electron-blocking layer and a combination of an electron-transport layer and a hole-blocking layer can trap both carriers, positive holes and electrons, in the light-emitting layer and can therefore provide a light-emitting device without carrier leakage and with high luminous efficiency.

Furthermore, various layer structures are possible; for example, an insulating layer is formed at an interface between an electrode and an organic compound layer, an adhesive layer or an interference layer is formed, an electron-transport layer or a hole-transport layer is composed of two layers with different ionization potentials, or a light-emitting layer is composed of two layers formed of different light-emitting materials.

An organic EL device according to the present invention may be of a bottom emission type, a top emission type, or a top and bottom emission type. In the bottom emission type, light is extracted through an electrode located on the substrate side. In the top emission type, light is extracted through the opposite side of the substrate.

The hole injection transport material for use in the hole-transport layer or the hole-injection layer is preferably a material that can facilitate hole injection from the anode or a material with high hole mobility that can transport injected positive holes to a light-emitting layer. To suppress film quality degradation, such as crystallization, in organic EL devices, materials with a high glass transition temperature are preferred. Examples of low-molecular-weight and high-molecular-weight materials with hole injection transport ability include, but are not limited to, triarylamine derivatives, aryl carbazole derivatives, phenylenediamine derivatives, stilbene derivatives, phthalocyanine derivatives, porphyrin derivatives, polyvinylcarbazole, polythiophene, and other electrically conductive polymers. The hole injection transport materials are also suitable for an electron-blocking layer.

Specific examples of compounds that can be used as hole injection transport materials are described below. The present invention is not limited to these compounds.

HT1
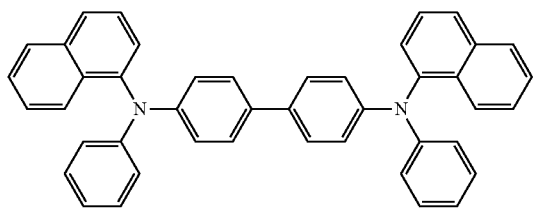

HT2
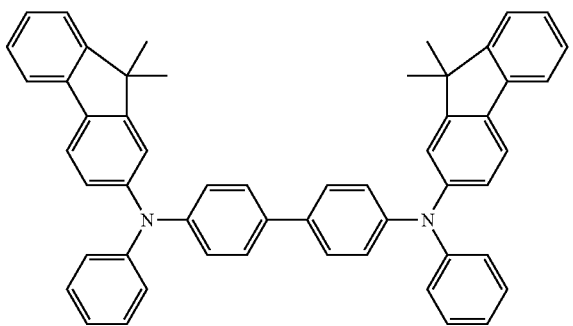

HT3
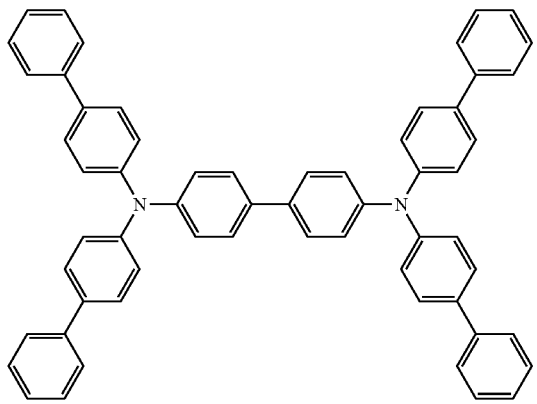

HT4
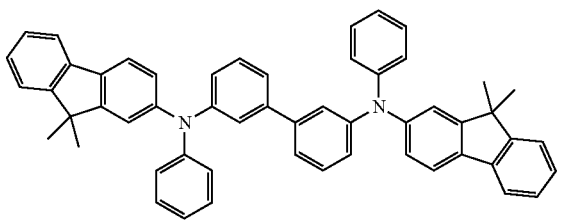

-continued
HT5
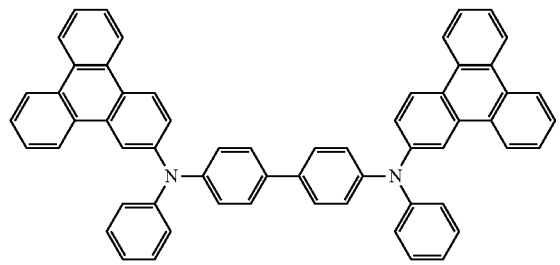
HT6
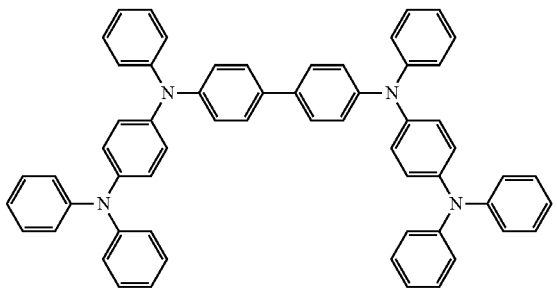
HT7
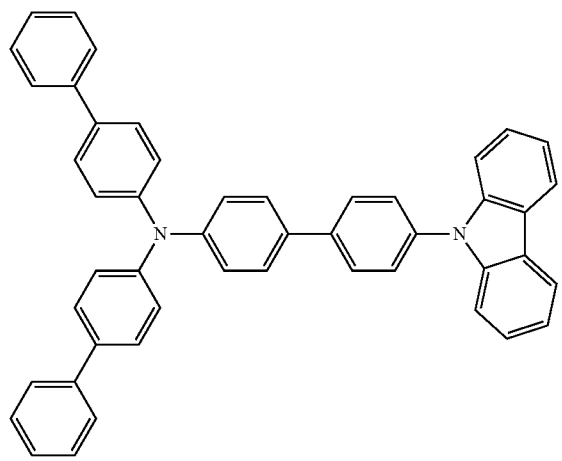
HT8
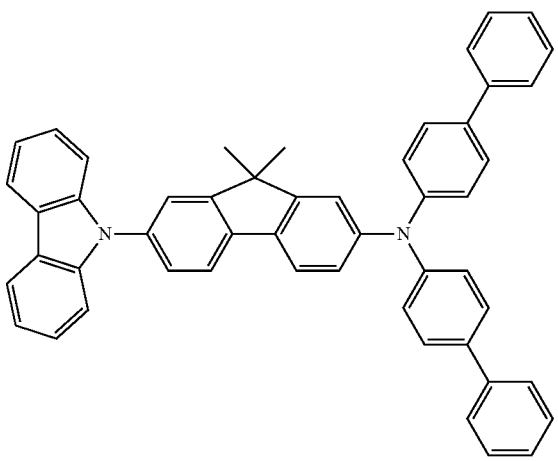
HT9
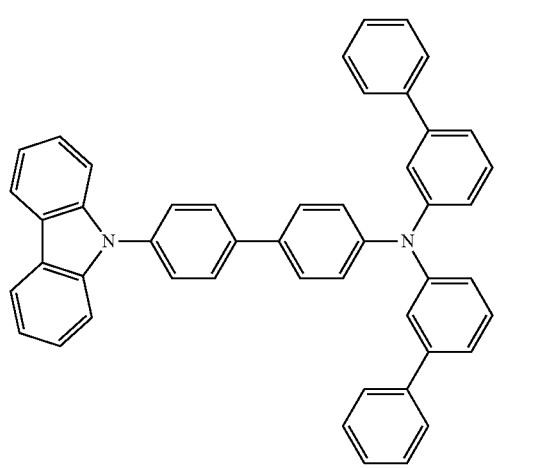
HT10
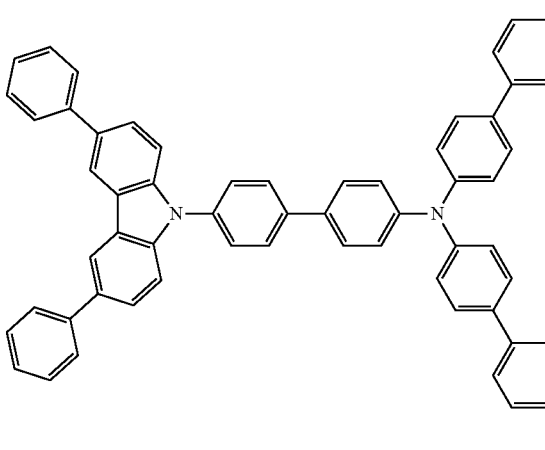
HT11
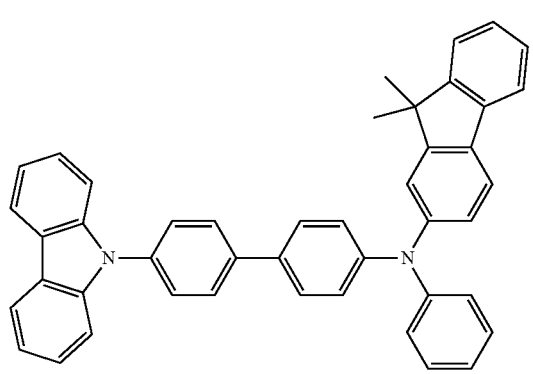
HT12
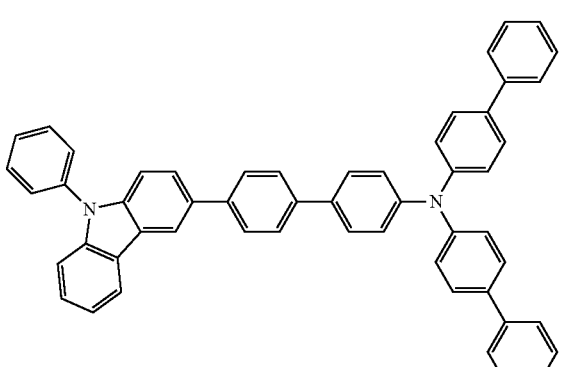

-continued

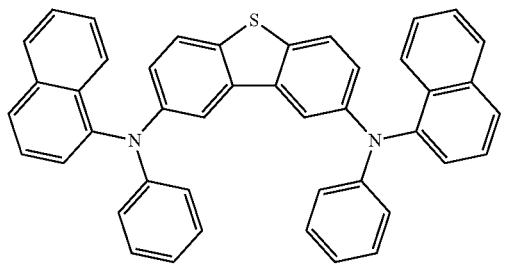
HT13

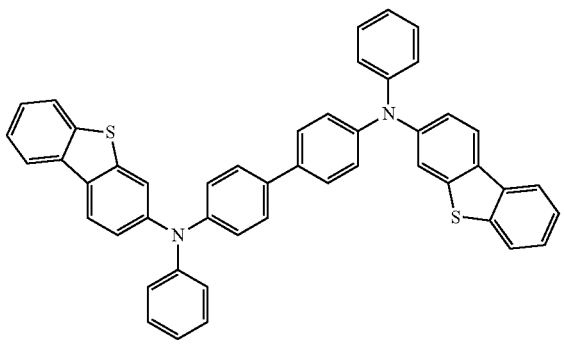
HT14

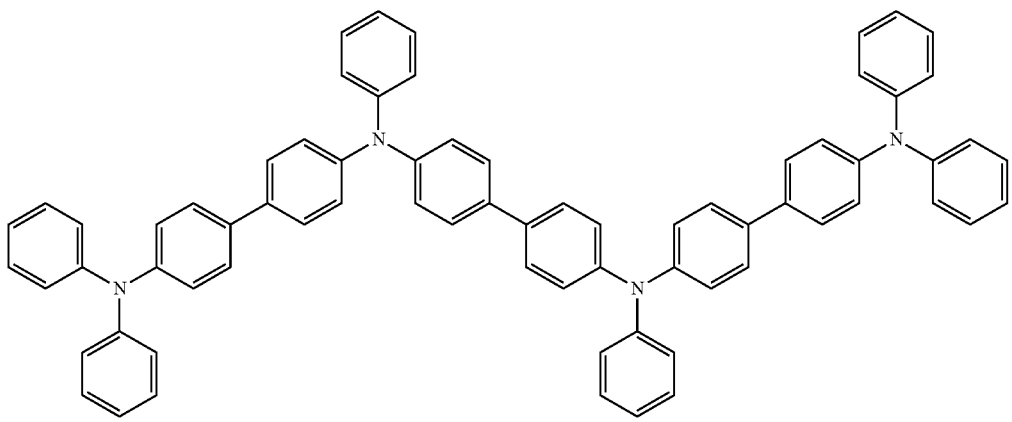
HT15

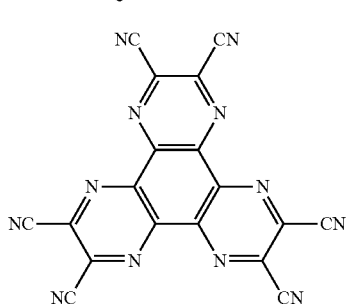
HT16

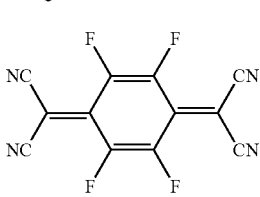
HT17

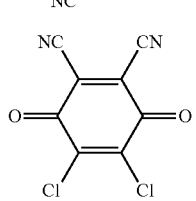

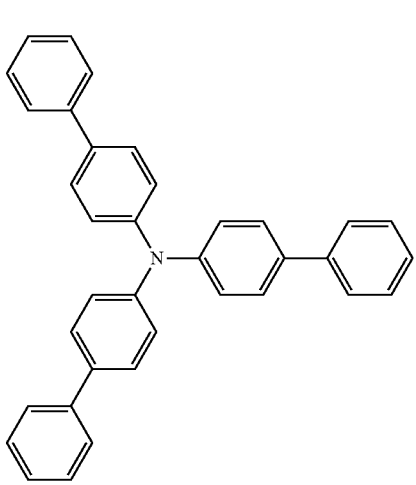
HT19

HT18

An electron-transport material for use in the electron-transport layer and the electron-injection layer can be selected from materials that can transport electrons injected from the cathode to a light-emitting layer and is selected in consideration of the balance with the hole mobility of a hole-transport material. Examples of materials with electron-transport ability include, but are not limited to, oxadiazole derivatives, oxazole derivatives, pyrazine derivatives, triazole derivatives, triazine derivatives, quinoline derivatives, quinoxaline derivatives, phenanthroline derivatives, organoaluminum complex, and fused-ring compounds (for example, fluorene derivatives, naphthalene derivatives, chrysene derivatives, and anthracene derivatives). The electron-transport materials are also suitable for a hole-blocking layer.

Specific examples of compounds that can be used as electron-transport materials are described below. The present invention is not limited to these compounds.

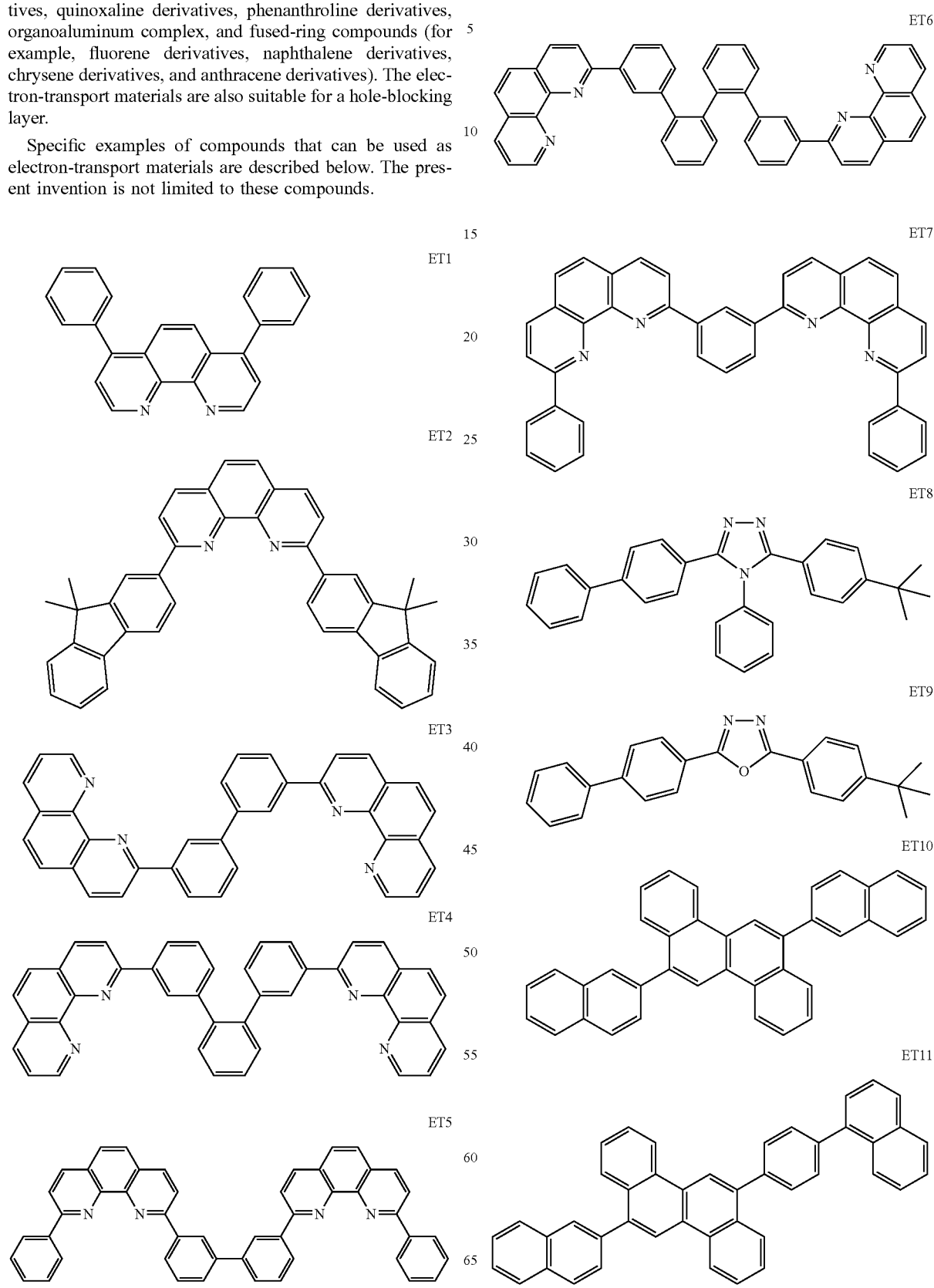

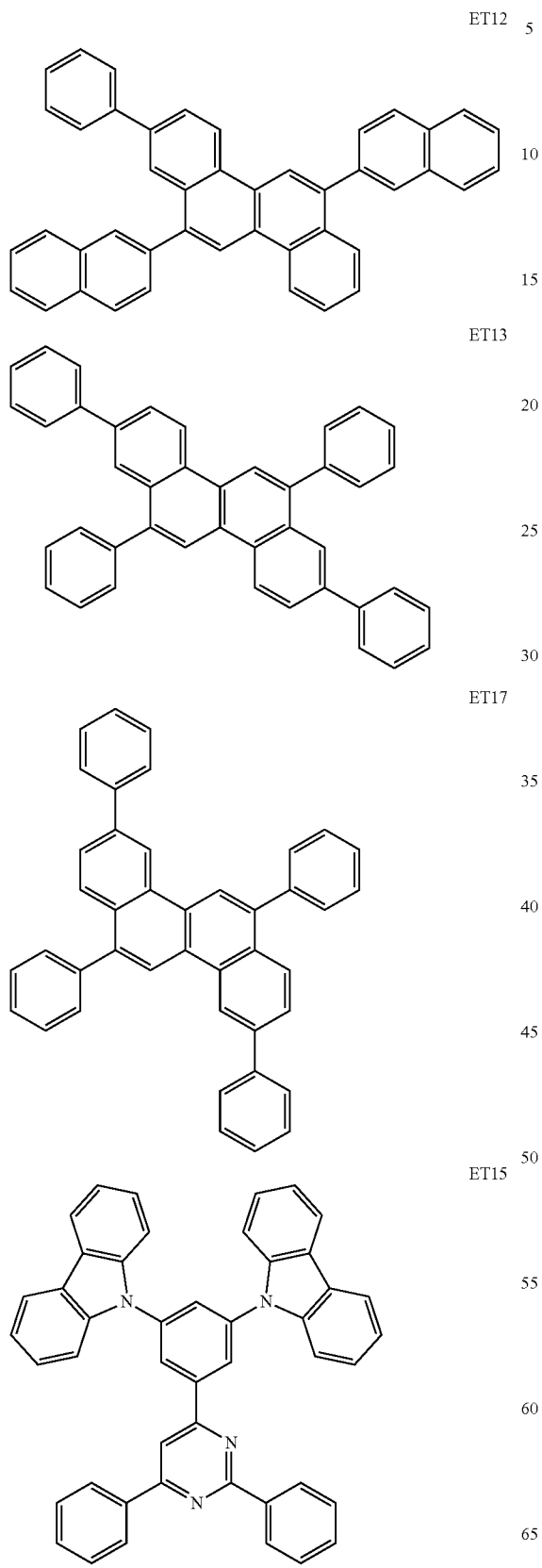
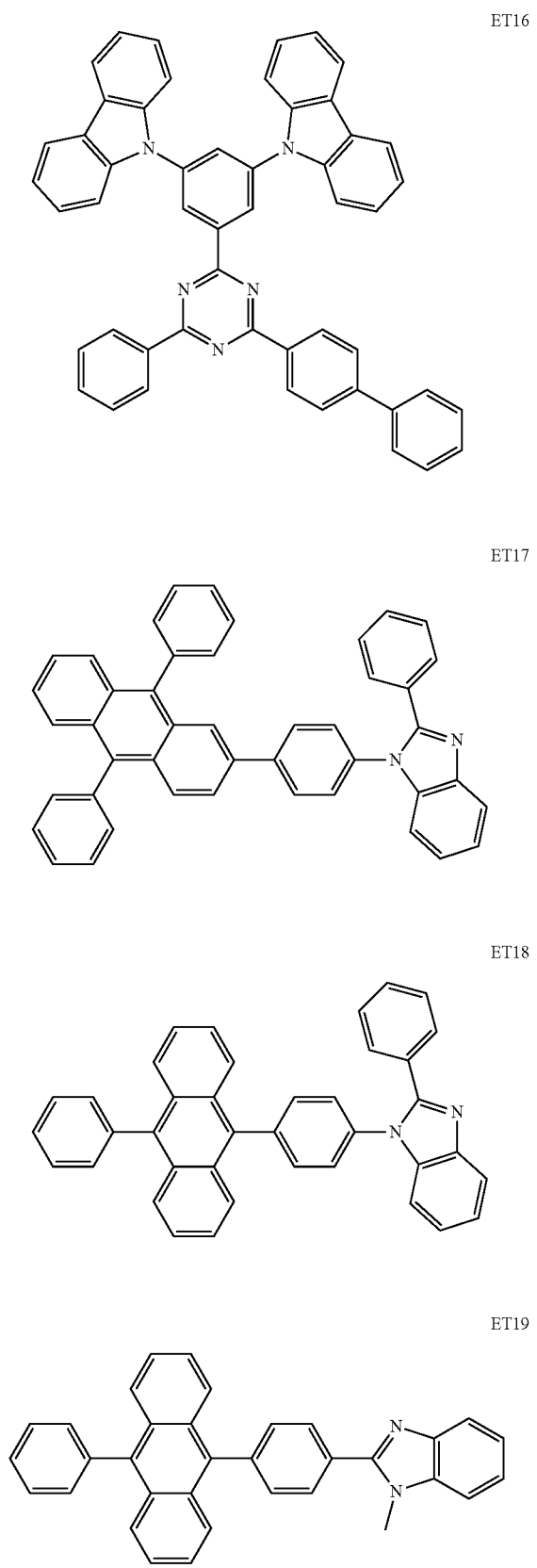

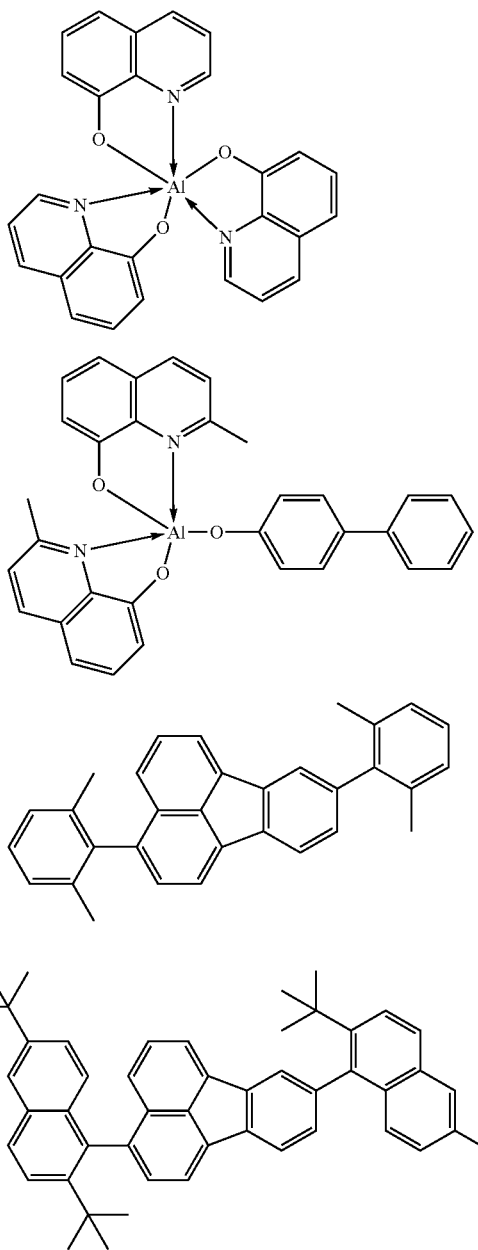

Other constituents are described below with reference to FIG. 1.

The substrate 1 may be formed of any material, such as quartz, glass, a silicon wafer, a resin, or a metal. The substrate 1 may have a switching device, such as a transistor, and a wire, on which an insulating layer may be formed. To ensure electrical continuity between the anode 2 and a wire, the insulating layer may be formed of any material than can form a contact hole and insulate the wire from unconnected wires. For example, the insulating layer may be formed of a resin, such as polyimide, silicon oxide, or silicon nitride. In a device of the bottom emission type, the substrate 1 and the insulating layer are formed of a light-transmitting material.

A constituent material of the anode 2 preferably has as high a work function as possible. Examples of the constituent material include, but are not limited to, metallic elements, such as gold, platinum, silver, copper, nickel, palladium, cobalt, selenium, vanadium, and tungsten, mixtures thereof, alloys thereof, and metal oxides, such as tin oxide, zinc oxide, indium oxide, indium tin oxide (ITO), and indium zinc oxide. Electrically conductive polymers, such as polyaniline, polypyrrole, and polythiophene, may also be used.

These electrode materials may be used alone or in combination. The anode 2 may be composed of one layer or a plurality of layers.

In a device of the top emission type, the anode 2 is used as a reflecting electrode and may therefore be formed of chromium, aluminum, silver, titanium, tungsten, molybdenum, an alloy thereof, or a laminate thereof, for example. In a device of the bottom emission type, the anode 2 is used as a transparent electrode and therefore may be, but is not limited to, formed of an oxide transparent conductive layer, such as indium tin oxide (ITO) or indium zinc oxide.

The electrodes may be formed by photolithography.

A constituent material of the cathode 7 preferably has a low work function. For example, an alkali metal, such as lithium, an alkaline-earth metal, such as calcium, a metallic element, such as aluminum, titanium, manganese, silver, lead, or chromium, or a mixture thereof may be used. An alloy of these metallic elements may also be used. For example, magnesium-silver, aluminum-lithium, aluminum-magnesium, silver-copper, or zinc-silver may be used. A metal oxide, such as indium tin oxide (ITO), may also be used. These electrode materials may be used alone or in combination. The cathode 7 may be composed of one layer or a plurality of layers.

In a device of the top emission type, the cathode 7 may be a light-transmitting electrode formed of a transparent oxide conductive layer, such as ITO. In a device of the bottom emission type, the cathode 7 may be a reflecting electrode formed of aluminum (Al). The cathode 7 may be formed by any method, preferably by a direct-current or alternating-current sputtering method, because such a sputtering method can achieve good film coverage and easily decrease resistance.

After the cathode 7 is formed, a sealing member (not shown) may be applied thereto. For example, a glass sheet with a moisture absorbent may be attached to the cathode 7 to prevent water from entering an organic compound layer and prevent or reduce the occurrence of display defects. A passivation film, such as silicon nitride, may be formed on the cathode 7 to prevent water from entering an organic compound layer. For example, after the cathode 7 is formed, the device may be transported to another chamber without breaking the vacuum, and a silicon nitride film 2 μm in thickness may be formed by CVD as a sealing film.

A color filter may be provided on the outside of the cathode 7 in a device of the top emission type or on the outside of the substrate 1 in a device of the bottom emission type. A color filter may be separately formed and bonded to the organic EL device or may be directly formed on the organic EL device by photolithography.

Organic compound layers (a hole-injection layer, a hole-transport layer, an electron-blocking layer, a light-emitting layer, a hole-blocking layer, an electron-transport layer, and an electron-injection layer) according to the present invention can be formed by a dry process, such as a vacuum evaporation method, an ionized deposition method, sputtering, or plasma. Instead of the dry process, a wet process may also be employed in which a layer is formed by a known coating method (for example, spin coating, dipping, a casting method, an LB method, an ink jet method, etc.) using an appropriate solvent.

A layer formed by a vacuum evaporation method or a solution coating method undergoes little crystallization and has high temporal stability. In a coating method, a film may also be formed using an appropriate binder resin.

Examples of the binder resin include, but are not limited to, polyvinylcarbazole resins, polycarbonate resins, polyester resins, ABS resins, acrylic resins, polyimide resins, phenolic resins, epoxy resins, silicone resins, and urea resins. The binder resin may be composed of a homopolymer or copolymer alone or at least two homopolymers and/or copolymers. If necessary, a known additive agent, such as a plasticizer, an antioxidant, and/or an ultraviolet absorber, may be used.

An organic EL device according to the present invention can be used as a light source for display apparatuses, image pickup apparatuses, communication apparatuses, lighting apparatuses, and luminaires.

Figure 3:
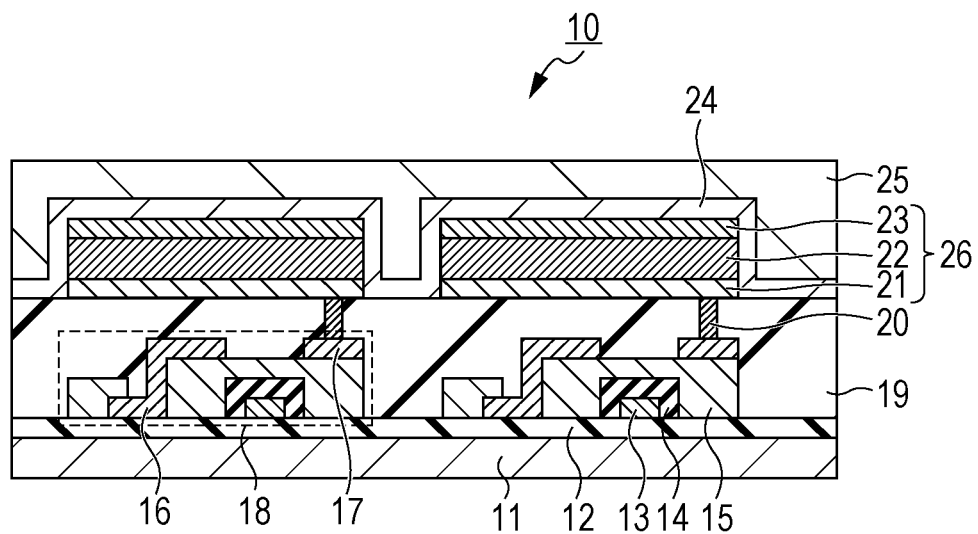
FIG. 3 is a schematic cross-sectional view of a display apparatus including an organic EL device according to the present invention.

FIG. 3 is a schematic cross-sectional view of a display apparatus that includes an organic light-emitting device and an active device coupled to the organic light-emitting device. The active device may be a transistor or TFT composed of polysilicon or an oxide semiconductor.

A display apparatus 10 illustrated in FIG. 3 includes a substrate 11, such as a glass sheet, and an insulating layer 12 on the substrate 11. The insulating layer 12 protects a transistor device or an organic compound layer. A transistor device 18 located on the insulating layer 12 includes a gate electrode 13, a gate-insulating film 14, a semiconductor layer 15, a drain electrode 16, and a source electrode 17.

The display apparatus includes an organic light-emitting device 26 on the transistor device with an interlayer insulating layer 19 interposed therebetween. The organic light-emitting device 26 includes an anode 21, an organic compound layer 22 including a light-emitting layer, and a cathode 23.

The interlayer insulating layer 19 includes a contact hole 20, through which the anode 21 and the source electrode 17 constituting the organic light-emitting device are coupled together.

Electrical connection between electrodes of an organic light-emitting device (an anode and a cathode) and electrodes of a transistor (a source electrode and a drain electrode) is not limited to that illustrated in FIG. 3. It is only necessary to electrically connect one of an anode or a cathode to one of a source electrode or a drain electrode of a transistor device.

Although the organic compound layer 22 is a single layer in the display apparatus 10 illustrated in FIG. 3, the organic compound layer 22 may be composed of a plurality of layers. The cathode 23 is covered with a first protective layer 24 and a second protective layer 25 for preventing degradation of the organic light-emitting device.

Although the display apparatus 10 illustrated in FIG. 3 includes a transistor as a switching device, another device may be used instead as the switching device.

A transistor for use in the display apparatus 10 illustrated in FIG. 3 is not limited to a transistor including a single crystal silicon wafer and may also be a thin-film transistor including an active layer on an insulating surface of the substrate. The active layer may be single-crystal silicon, non-single-crystal silicon, such as amorphous silicon or microcrystalline silicon, or a non-single-crystal oxide semiconductor, such as indium zinc oxide or indium gallium zinc oxide. A thin-film transistor is also referred to as a TFT device.

In the display apparatus 10 illustrated in FIG. 3, the luminance of the organic EL device 26 is controlled by the transistor 18, and a plurality of organic EL devices on the surface can display an image at their respective luminances. The transistor 18 is preferably TFT. In addition to transistors, switching devices, such as MIM devices and active-matrix drivers formed on a substrate, such as a Si substrate, are preferably used. "On a substrate" may also be referred to as "in a substrate". This depends on the definition. For example, for a definition of approximately QVGA per inch, an organic EL device is preferably provided on a Si substrate. A display apparatus that includes an organic EL device according to the present invention can stably display high-quality images for extended periods.

Figure 4:
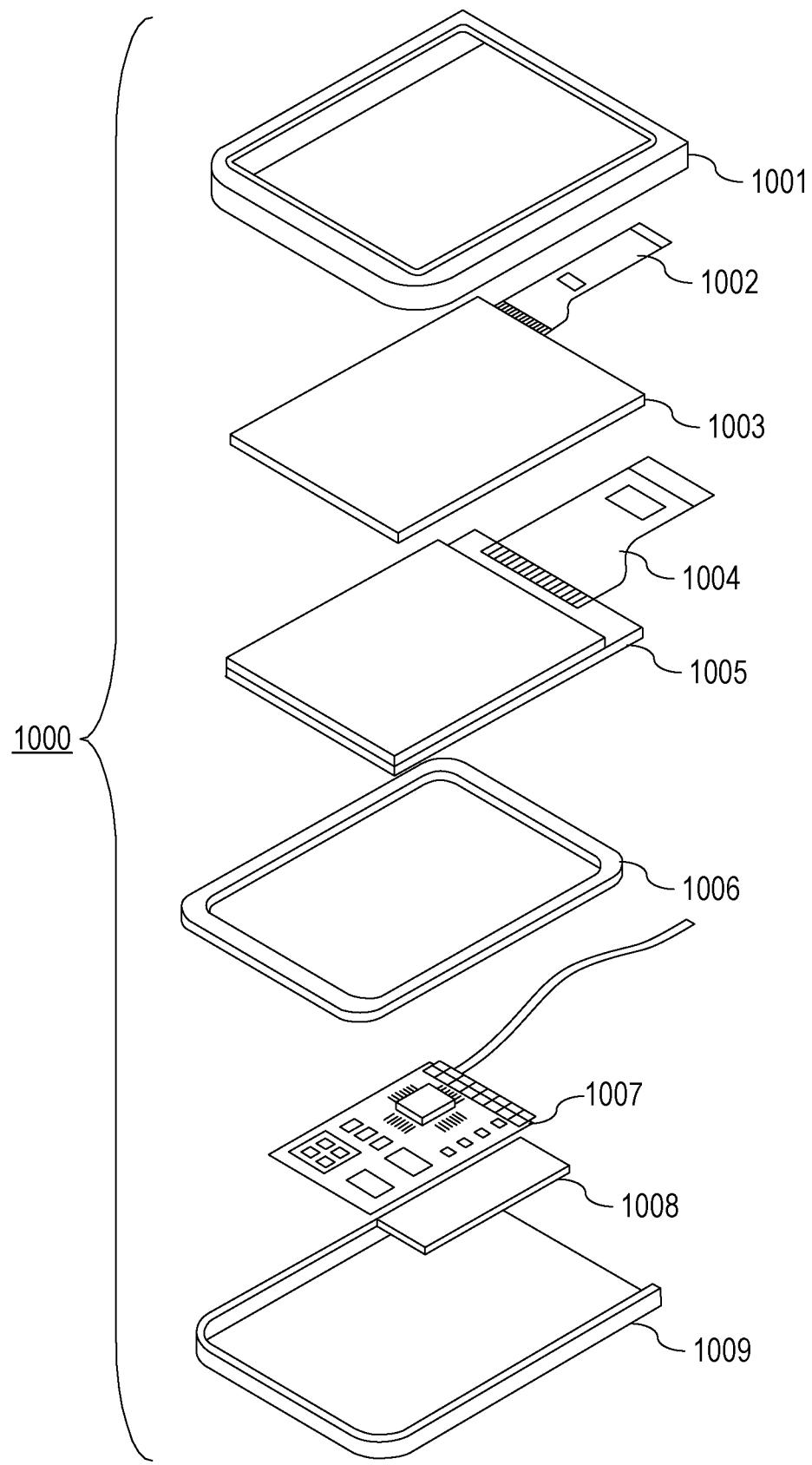
FIG. 4 is a schematic exploded perspective view of another display apparatus including an organic EL device according to the present invention.

FIG. 4 is a schematic view of a display apparatus that includes the display apparatus of FIG. 3 as a display panel. A display apparatus 1000 illustrated in FIG. 4 includes a touch panel 1003, a display panel 1005, a frame 1006, a circuit board 1007, and a battery 1008 between an upper cover 1001 and a lower cover 1009. The touch panel 1003 and the display panel 1005 are coupled to flexible print circuits FPC 1002 and 1004, respectively. A transistor is printed on the circuit board 1007. The battery 1008 may be omitted when the display apparatus is not a mobile apparatus, and is not necessarily located at this position even when the display apparatus is a mobile apparatus.

An organic EL device according to the present invention may be used in a display unit of an image pickup apparatus that includes an optical unit with a plurality of lenses and an image pickup device for receiving light passing through the optical unit. The image pickup apparatus may have a display unit for displaying information acquired by the image pickup device. The display unit may be a display unit exposed outside from the image pickup apparatus or a display unit located in a finder. The image pickup apparatus may be a digital camera or a digital video camera.

Figure 5:
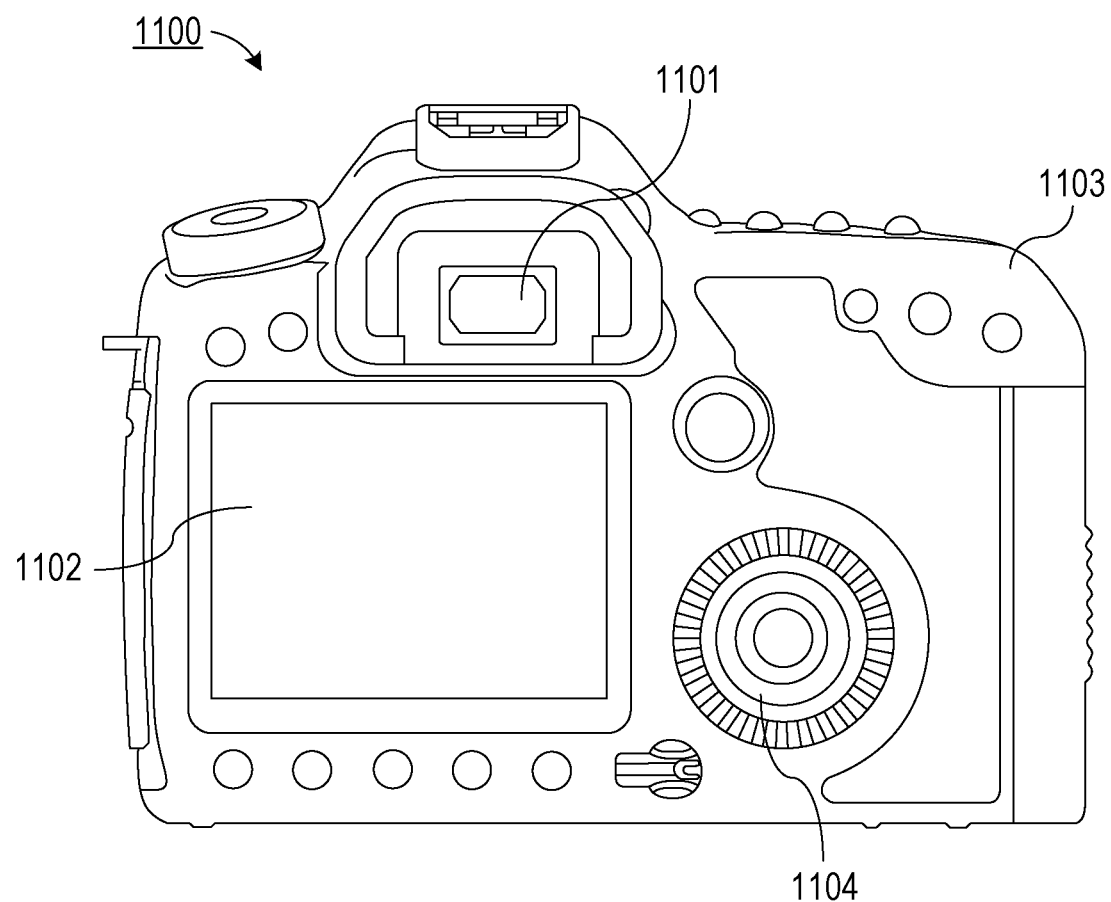
FIG. 5 is a schematic rear view of an image pickup apparatus including an organic EL device according to the present invention.

FIG. 5 is a schematic view of an example of the image pickup apparatus. An image pickup apparatus 1100 illustrated in FIG. 5 includes a viewfinder 1101, a rear display 1102, a housing 1103, and an operating unit 1104. The viewfinder 1101 includes an organic EL device according to the present invention and may display not only a captured image but also environmental information and imaging instructions. The environmental information may include the intensity and direction of outside light, the travel speed of the subject, and the possibility that the subject is shielded by a shield.

Because the appropriate timing for taking an image is a short time, the information is preferably displayed as soon as possible. An organic EL device according to the present invention has a high response speed and is therefore preferred as a display unit of an image pickup apparatus. A display apparatus including such an organic EL device is more suitable for apparatuses that require a high display speed than liquid crystal displays.

The image pickup apparatus 1100 includes an optical unit (not shown). The optical unit has a plurality of lenses and forms an image on an image pickup device housed in the housing 1103. The focus of the lenses can be adjusted by adjusting their relative positions. This operation can also be automatically performed.

A display apparatus including an organic EL device according to the present invention may have red, green, and blue color filters. The red, green, and blue color filters may be arranged in a delta arrangement.

A display apparatus including an organic EL device according to the present invention may be used in a display unit of portable terminals. Such a display apparatus may have both a display function and an operation function. Examples of the portable terminals include mobile phones, such as smartphones, tablets, and head-mounted displays.

Figure 6:
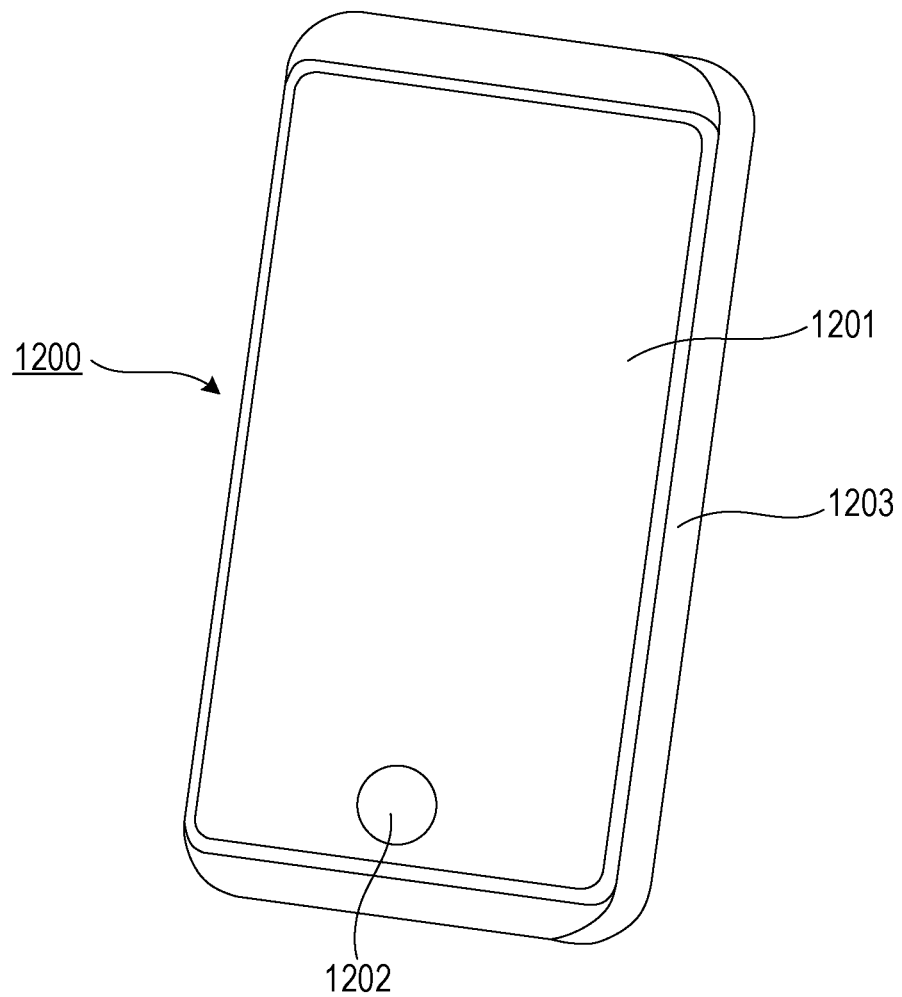
FIG. 6 is a schematic perspective view of a mobile communication apparatus including an organic EL device according to the present invention.

FIG. 6 is a schematic view of a mobile apparatus including an organic EL device according to the present invention in a display unit. A mobile apparatus 1200 includes a display unit 1201, an operating unit 1202, and a housing 1203. The housing 1203 is provided with a circuit, a printed circuit board including the circuit, a battery, and a communication unit. The operating unit 1202 may be a button or a touch panel response unit. The operating unit 1202 may be a biometric recognition unit that recognizes a fingerprint and releases the lock. A mobile apparatus including a communication unit may also be referred to as a communication apparatus.

Figure 7A:
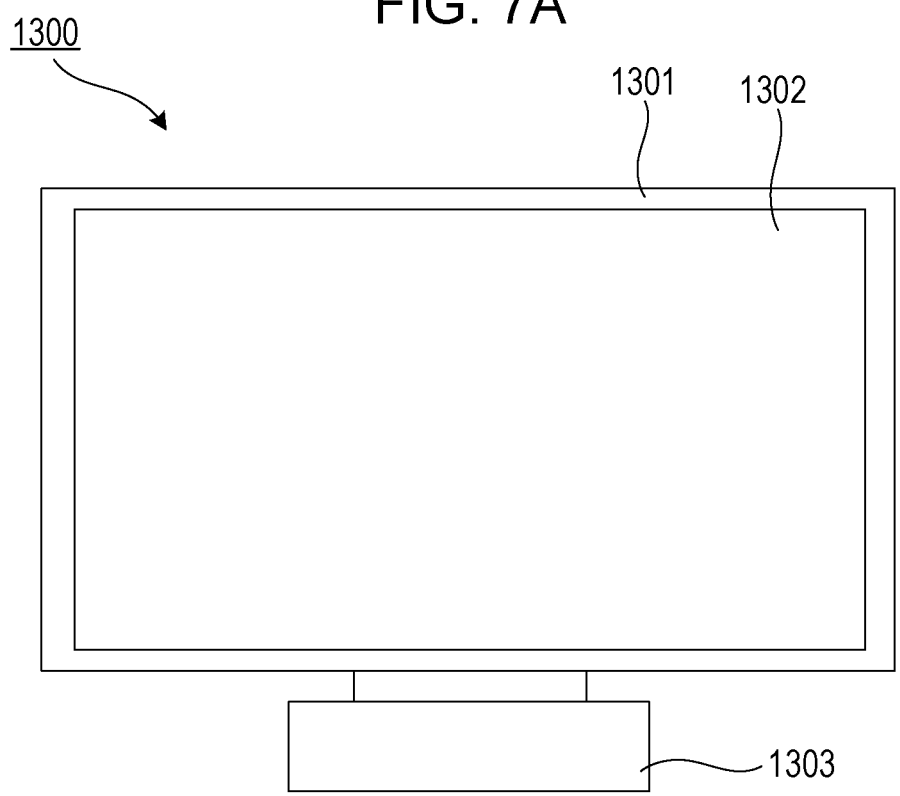
FIG. 7A is a schematic front view of another display apparatus including an organic EL device according to the present invention.

FIG. 7 is a schematic view of another example of a display apparatus including an organic EL device according to the present invention in a display unit. FIG. 7A illustrates a display apparatus, such as a television monitor or a PC monitor. A display apparatus 1300 includes a frame 1301, a display unit 1302, and a base 1303 for supporting the frame 1301 and the display unit 1302. The base 1303 is not limited to that illustrated in FIG. 7A, and the lower side of the frame 1301 may also serve as the base. The frame 1301 and the display unit 1302 may be bent, and the radius of curvature thereof may be 5000 mm or more and 6000 mm or less.

Figure 7B:
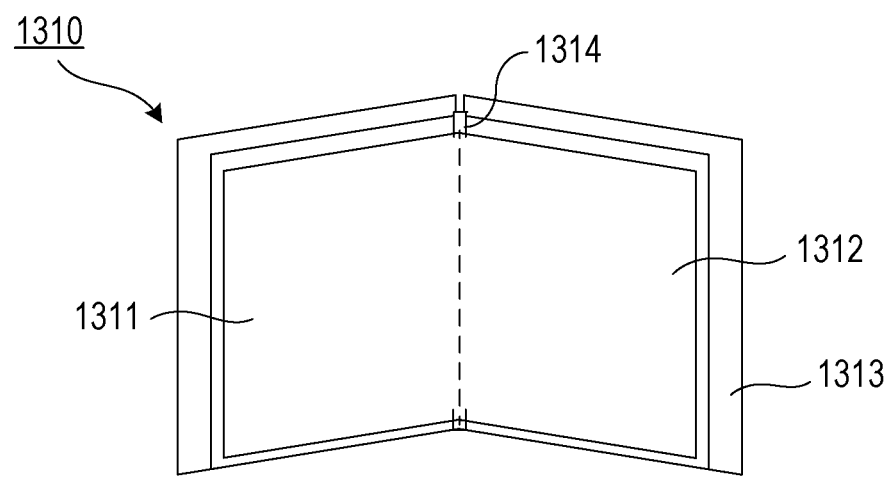
FIG. 7B is a schematic front view of another display apparatus including an organic EL device according to the present invention.

FIG. 7B is a schematic view of another example of a display apparatus including an organic EL device according to the present invention in a display unit. A display apparatus 1310 illustrated in FIG. 7B is configured to be foldable and is a so-called foldable display apparatus. The display apparatus 1310 includes a first display unit 1311, a second display unit 1312, a housing 1313, and a folding point 1314. The first display unit 1311 and the second display unit 1312 are organic EL devices according to the present invention and are one seamless piece, which can be divided by the folding point. The first display unit 1311 and the second display unit 1312 may display different images or one image. The housing 1313 is a flexible substrate.

Figure 8:
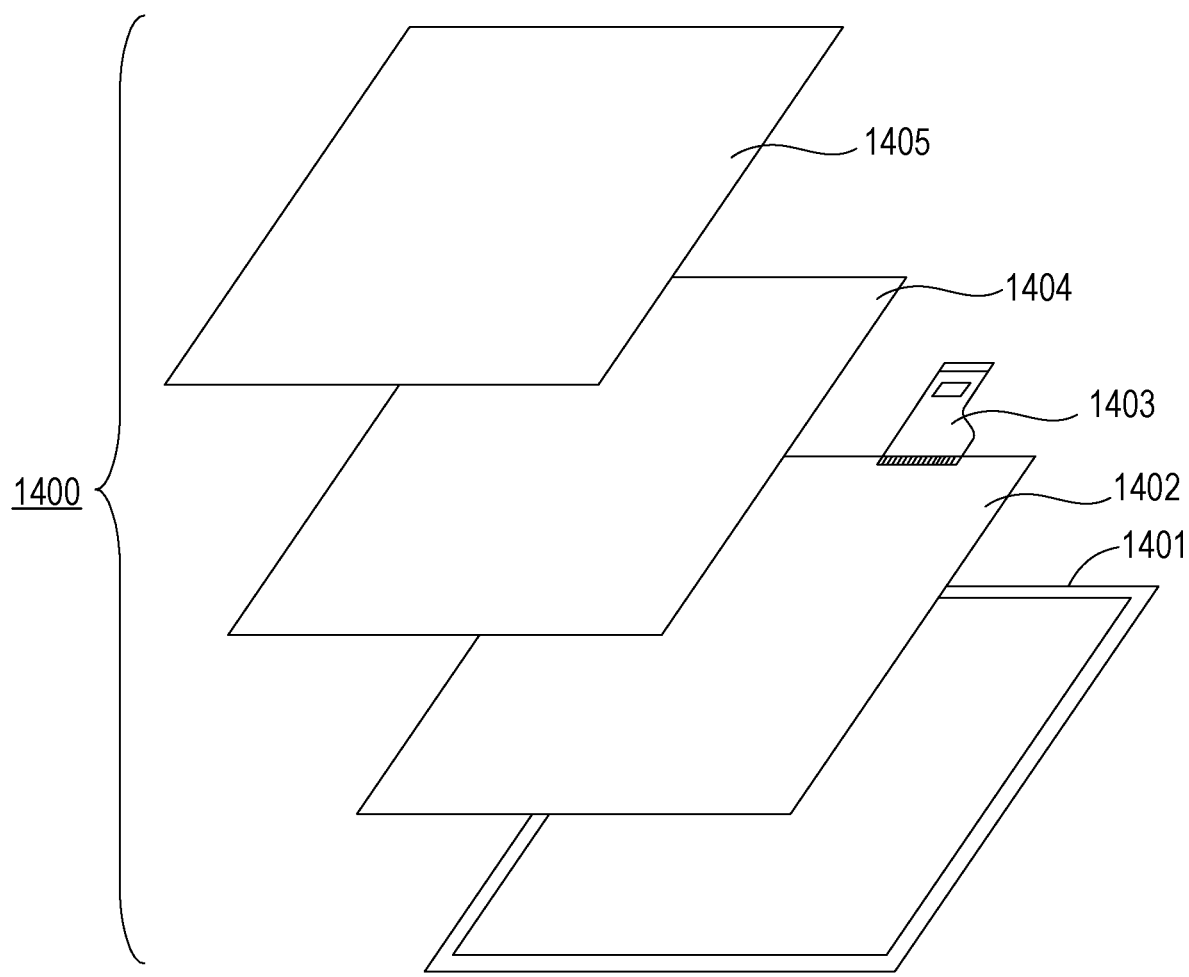
FIG. 8 is an exploded perspective view of a lighting apparatus including an organic EL device according to the present invention.

FIG. 8 is a schematic view of a lighting apparatus including an organic EL device according to the present invention as a light source. A lighting apparatus 1400 includes a housing 1401, a light source 1402, a circuit board 1403, an optical film 1404, and a light diffusing unit 1405. The optical film 1404 may be a filter that improves the color rendering properties of the light source 1402 and is located on the light output side of the light source 1402. The light diffusing unit can effectively diffuse light of the light source and widely spread light as in illumination. If necessary, a cover may be provided on the outermost portion.

For example, the lighting apparatus is an interior lighting apparatus. The lighting apparatus may emit white light or light of any color from blue to red. The lighting apparatus may have a light control circuit for controlling such light. The lighting apparatus has a power supply circuit coupled to an organic EL device according to the present invention. The power supply circuit converts an AC voltage into a DC voltage. White has a color temperature of 4200 K, and the daytime has a color temperature of 5000 K. The lighting apparatus may have a color filter.

Figure 9:
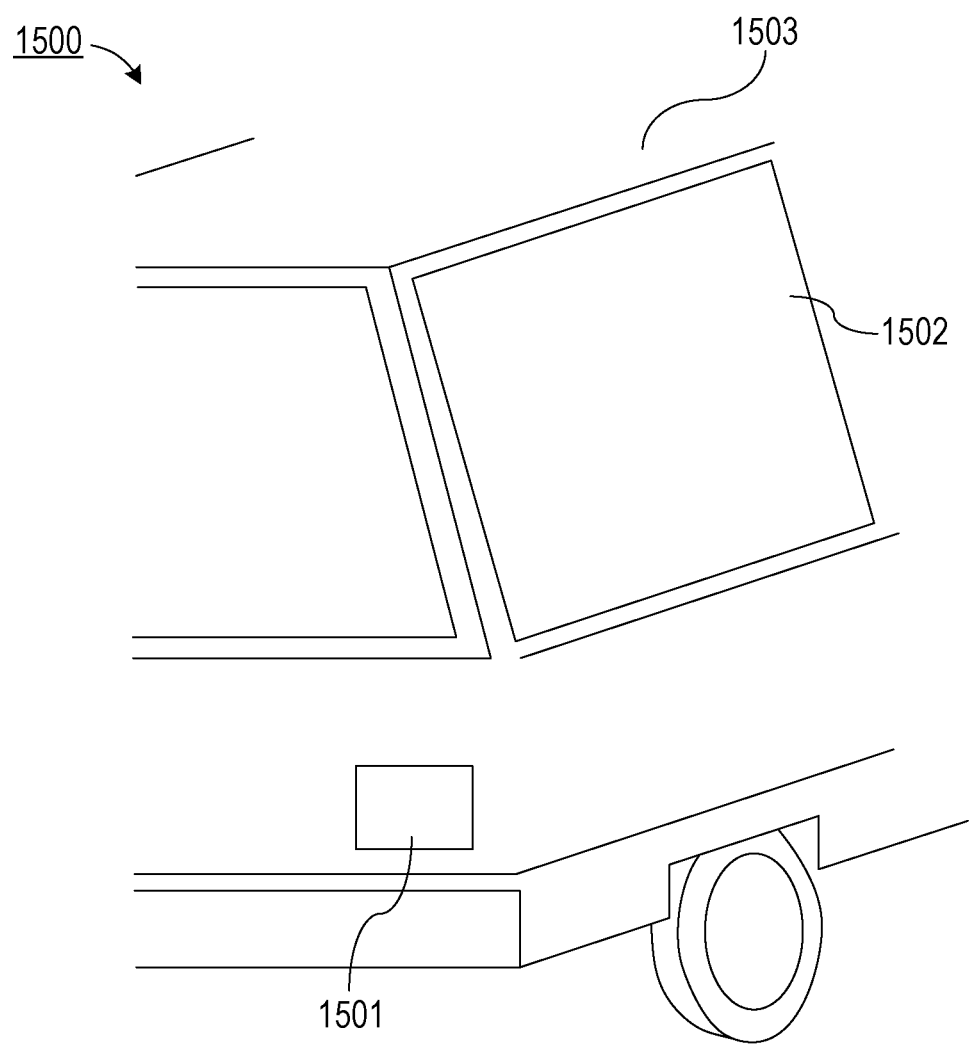
FIG. 9 is a schematic view of an automobile including an organic EL device according to the present invention as a luminaire.

FIG. 9 is a schematic view of an automobile, which is an example of a moving body including an organic EL device according to the present invention as a luminaire. An automobile 1500 has a taillight 1501. The taillight is an example of luminaires. The taillight may be in a form that lights up when the automobile is braked. The taillight may have a protective member for protecting the organic EL device. The protective member may be formed of any transparent material with moderately high strength and is preferably formed of a polycarbonate. The polycarbonate may be mixed with a furan dicarboxylic acid derivative or an acrylonitrile derivative.

The automobile 1500 may have a body 1503 and a window 1502 on the body 1503. The window may be a transparent display as long as it is not a window for checking the front and rear of the automobile. The transparent display may be an organic EL device according to the present invention. In such a case, constituent materials, such as electrodes, in the organic EL device are transparent materials. A moving body according to the present invention may be a ship, a drone, or an aircraft, as well as an automobile. A luminaire of a moving body may be in the form of emitting light to indicate its position.

EXEMPLARY EMBODIMENTS

Exemplary Embodiment 1

<Measurement of HOMO and LUMO Levels>

The HOMO and LUMO levels of hosts, dopants, and intermediate layer materials were measured by the following method. Table 1 shows the results.
A) Measurement of HOMO Level Thin films 30 nm in thickness were formed from various materials on an aluminum substrate. HOMO levels in the thin films were measured with AC-3 (manufactured by Riken Keiki Co., Ltd.). Tables 1 and 2 show the results.
B) Measurement of LUMO Level Thin films 30 nm in thickness were formed from various materials on a quartz substrate. The optical band gap (absorption edge) of a material to be measured in the thin films was determined with a spectrophotometer ("V-560" manufactured by JASCO Corporation). The sum of the optical band gap and the HOMO level was defined as the LUMO level.

Tables 1 and 2 show the results.

Tables 1 and 2 also show values calculated by a molecular orbital calculation method. A comparison with actual values shows that the HOMO level correlates with the LUMO level. In the present exemplary embodiment, therefore, the results for devices are discussed in terms of the numerical values of the HOMO and LUMO levels determined from calculated values. The HOMO and LUMO levels in the following tables are referred to as "HOMO" and "LUMO", respectively.

TABLE 1

| | Compound No. | HOMO [eV] Actual value | LUMO [eV] Actual value | HOMO [eV] Calculated value | LUMO [eV] Calculated value |
|---|---|---|---|---|---|
| Host | EM1 | −6.02 | −3.10 | −5.11 | −1.67 |
| | EM2 | −5.96 | −3.04 | −5.06 | −1.62 |
| | EM3 | −5.94 | −2.95 | −5.14 | −1.62 |
| | EM4 | −6.00 | −3.01 | −5.19 | −1.66 |
| | EM5 | −6.03 | −3.06 | −5.12 | −1.64 |
| | EM7 | −6.01 | −3.13 | −5.02 | −1.70 |
| | EM10 | −6.31 | −2.83 | −5.67 | −1.21 |
| | EM13 | −5.99 | −3.06 | −5.13 | −1.46 |

TABLE 1-continued

|  | Compound No. | HOMO [eV] | LUMO [eV] | HOMO [eV] | LUMO [eV] |
|---|---|---|---|---|---|
|  |  | Actual value | | Calculated value | |
|  | EM17 | −5.73 | −3.53 | −4.68 | −2.07 |
|  | EM22 | −5.80 | −3.20 | −4.94 | −1.77 |
|  | EM27 | −6.22 | −3.11 | −5.73 | −1.87 |
| Intermediate layer material | IL1 | −6.04 | −3.10 | −5.32 | −1.57 |
|  | IL2 | −6.13 | −2.93 | −5.31 | −1.44 |
|  | IL3 | −6.02 | −3.10 | −5.11 | −1.67 |
|  | IL4 | −6.00 | −3.01 | −5.19 | −1.66 |
|  | IL5 | −6.09 | −3.01 | −5.28 | −1.55 |
|  | IL7 | −6.05 | −3.26 | −5.36 | −1.91 |
|  | IL10 | −6.00 | −3.21 | −5.11 | −1.65 |
|  | IL11 | −5.96 | −3.04 | −5.06 | −1.62 |
|  | IL12 | −6.28 | −3.38 | −5.56 | −1.81 |
|  | IL14 | −5.99 | −3.06 | −5.19 | −1.49 |

TABLE 2

|  | Compound | HOMO (eV) | LUMO (eV) | HOMO (eV) | LUMO (eV) |
|---|---|---|---|---|---|
|  |  | Actual value | | Calculated value | |
| Blue dopant | BD1 | −5.46 | −2.67 | −4.73 | −1.47 |
|  | BD8 | −6.05 | −3.26 | −5.18 | −1.72 |
|  | BD9 | −6.08 | −3.38 | −5.24 | −1.84 |
|  | BD15 | −6.10 | −3.40 | −5.20 | −1.91 |
|  | BD20 | −5.90 | −3.30 | −5.04 | −1.82 |
|  | BD23 | −6.20 | −3.52 | −5.44 | −2.06 |
|  | BD24 | −6.08 | −3.38 | −5.32 | −1.94 |
| Green dopant | GD2 | −5.40 | −2.60 | −4.74 | −1.83 |
|  | GD9 | −5.94 | −3.45 | −5.06 | −1.98 |
|  | GD11 | −5.82 | −3.51 | −5.00 | −1.97 |
|  | GD22 | −5.90 | −3.40 | −5.02 | −2.11 |
|  | GD27 | −5.84 | −3.52 | −4.95 | −2.08 |
| Red dopant | RD5 | −5.62 | −3.63 | −4.72 | −2.37 |
|  | RD10 | −5.60 | −3.55 | −4.98 | −2.58 |
|  | RD15 | −5.53 | −3.50 | −4.57 | −2.26 |
|  | RD21 | −5.65 | −3.61 | −4.81 | −2.47 |

Exemplary Embodiment 2

An organic EL device of the top emission type produced in the present exemplary embodiment included an anode, a hole-injection layer, a hole-transport layer, an electron-blocking layer, a first light-emitting layer, an intermediate layer, a second light-emitting layer, a hole-blocking layer, an electron-transport layer, an electron-injection layer, and a cathode on a substrate. More specifically, first, a 40-nm Ti film was formed on a glass substrate by sputtering and was patterned by photolithography to form an anode. The facing areas of the anode and the cathode were set to 3 mm². Subsequently, the substrate on which up to a cleaned electrode was formed and a material were mounted in a vacuum evaporator (manufactured by ULVAC, Inc.), which was then evacuated to $1.33 \times 10^{-4}$ Pa ($1 \times 10^{-6}$ Torr). UV/ozone cleaning was then performed. Subsequently, each layer of a layer structure shown in the following table 3 was formed.

TABLE 3

|  | Material | Thickness [nm] |
|---|---|---|
| Electron-injection layer | ET2:Cs (Mass ratio ET2:Cs = 77.0:23.0) | 30 |
| Electron-transport layer | ET2 | 10 |

TABLE 3-continued

|  |  | Material |  | Thickness [nm] |
|---|---|---|---|---|
| Hole-blocking layer |  | ET12 |  | 10 |
| Second light-emitting layer | Second host Second dopant (blue-light-emitting dopant) | EM1 BD24 | Mass ratio EM1:BD24 = 99.4:0.6 | 10 |
| Intermediate layer |  | IL1 |  | 5 |
| First light-emitting layer | First host First dopant (red-light-emitting dopant) Third dopant (green-light-emitting dopant) | EM1 RD5 GD10 | Mass ratio EM1:RD5:GD10 = 96.5:0.5:3.0 | 10 |
| Electron-blocking layer |  | HT7 |  | 10 |
| Hole-transport layer |  | HT2 |  | 18 |
| Hole-injection layer |  | HT16 |  | 7 |

After an electron-injection layer was formed, a 500-nm ITO film was formed by sputtering to form a cathode. Subsequently, the substrate was transferred to a glove box and was sealed with a glass cap containing a drying agent in a nitrogen atmosphere to obtain an organic EL device.

The organic EL device was coupled to a voltage application apparatus, and its characteristics were evaluated. The current-voltage characteristics were measured with a microammeter "4140B" manufactured by Hewlett-Packard Co., and chromaticity was evaluated with "SR-3" manufactured by Topcon Corporation. Luminance was measured with "BM7" manufactured by Topcon Corporation. The efficiency, voltage, and CIE chromaticity coordinates of display at 1000 cd/m² were 6.4 cd/A, 3.2 V, and (0.36, 0.36), respectively, which indicated a satisfactory highly efficient organic EL device.

An emission spectrum was then evaluated at a low current density (0.01 mA/cm²). The peak height in an emission spectrum derived from a red-light-emitting dopant was set to 1.0, and the peak heights of a blue-light-emitting dopant and a green-light-emitting dopant were evaluated. A peak height of less than 0.1 was represented by "X", a peak height of 0.1 or more and less than 0.5 was represented by "Δ", and a peak height of 0.5 or more was represented by "O". Satisfactory white light emission can be obtained even at a low current density, that is, at a low luminance when blue light emission and green light emission have a sufficiently high peak height. Table 4 shows the results.

Furthermore, a continuous operation test was performed at an initial luminance of 2000 cd/m², and the luminance decay rate after 100 hours was measured. Table 4 shows the results.

Exemplary Embodiments 3 to 7, Comparative Examples 1 to 3

An organic EL device was produced in the same manner as in Exemplary Embodiment 2 except that the compounds in the first light-emitting layer, the intermediate layer, and the second light-emitting layer in Exemplary Embodiment 2 were changed as shown in Table 4. The characteristics of the organic EL device were measured and evaluated in the same manner as in Exemplary Embodiment 2. Table 4 shows the results.

had a low HOMO level, and the intermediate layer material was HT7 (an amine compound) and was not a hydrocarbon. A decrease in durability was also observed in Comparative Example 2. This is because the intermediate layer material was not a hydrocarbon. Balanced light could not be observed in Comparative Example 3. This is probably due to energy transfer from the second light-emitting layer (blue-light-emitting layer) to the first light-emitting layer (red- and green-light-emitting layer) in the absence of the intermediate layer.

TABLE 4

| | First light-emitting layer | | | | | | Intermediate layer | |
|---|---|---|---|---|---|---|---|---|
| | First host | | First dopant | | Third dopant | | Intermediate layer material | |
| | HOMO (H1) [eV] | LUMO (H1) [eV] | HOMO (D1) [eV] | LUMO (D1) [eV] | HOMO (D3) [eV] | LUMO (D3) [eV] | HOMO (IL) [eV] | LUMO (IL) [eV] |
| Example 2 | EM1 | | RD5 | | GD9 | | IL1 | |
| | −5.11 | −1.67 | −4.72 | −2.37 | −5.06 | −1.98 | −5.32 | −1.57 |
| Example 3 | EM1 | | RD5 | | GD9 | | IL3 | |
| | −5.11 | −1.67 | −4.72 | −2.37 | −5.06 | −1.98 | −5.11 | −1.67 |
| Example 4 | EM4 | | RD21 | | GD9 | | IL3 | |
| | −5.19 | −1.66 | −4.63 | −2.24 | −5.06 | −1.98 | −5.11 | −1.67 |
| Example 5 | EM1 | | RD5 | | GD27 | | IL3 | |
| | −5.11 | −1.67 | −4.72 | −2.37 | −4.95 | −2.08 | −5.11 | −1.67 |
| Example 6 | EM1 | | RD5 | | GD11 | | IL5 | |
| | −5.11 | −1.67 | −4.72 | −2.37 | −5.00 | −1.97 | −5.28 | −1.55 |
| Example 7 | EM1 | | RD5 | | GD11 | | IL2 | |
| | −5.11 | −1.67 | −4.72 | −2.37 | −5.00 | −1.97 | −5.31 | −2.93 |
| Comparative example 1 | EM1 | | RD5 | | GD10 | | HT7 | |
| | −5.11 | −1.67 | −4.72 | −2.37 | −5.05 | −1.96 | −4.92 | −1.29 |
| Comparative example 2 | EM1 | | RD5 | | GD10 | | EM27 | |
| | −5.11 | −1.67 | −4.72 | −2.37 | −5.05 | −1.96 | −5.73 | −1.87 |
| Comparative example 3 | EM1 | | RD5 | | GD10 | | None | |
| | −5.11 | −1.67 | −4.72 | −2.37 | −5.05 | −1.96 | | |

| | Second light-emitting layer | | | | | Peak height ratio | |
|---|---|---|---|---|---|---|---|
| | Second host | | Second dopant | | Luminance decay rate [%] | | |
| | HOMO (H2) [eV] | LUMO (H2) [eV] | HOMO (D2) [eV] | LUMO (D2) [eV] | | Blue | Green |
| Example 2 | EM1 | | BD24 | | 8 | ○ | ○ |
| | −5.11 | −1.67 | −5.32 | −1.94 | | | |
| Example 3 | EM1 | | BD9 | | 8 | ○ | ○ |
| | −5.11 | −1.67 | −5.24 | −1.84 | | | |
| Example 4 | EM1 | | BD23 | | 6 | ○ | ○ |
| | −5.11 | −1.67 | −5.44 | −2.06 | | | |
| Example 5 | EM4 | | BD9 | | 7 | ○ | ○ |
| | −5.19 | −1.66 | −5.24 | −1.84 | | | |
| Example 6 | EM5 | | BD23 | | 9 | ○ | ○ |
| | −5.12 | −1.64 | −5.44 | −2.06 | | | |
| Example 7 | EM1 | | BD23 | | 10 | ○ | ○ |
| | −5.11 | −1.67 | −5.44 | −2.06 | | | |
| Comparative example 1 | EM1 | | BD9 | | 20 | ○ | ○ |
| | −5.11 | −1.67 | −5.24 | −1.84 | | | |
| Comparative example 2 | EM1 | | BD9 | | 14 | Δ | ○ |
| | −5.11 | −1.67 | −5.24 | −1.84 | | | |
| Comparative example 3 | EM1 | | BD9 | | 8 | X | Δ |
| | −5.11 | −1.67 | −5.24 | −1.84 | | | |

Exemplary Embodiments 2 to 7 show that organic EL devices according to the present invention had high durability and emitted white light with a good balance of red, green, and blue in a low luminance region. By contrast, Comparative Example 1 emitted balanced white light but had low durability. This is because the intermediate layer Exemplary Embodiments 8 to 11, Comparative Example 4

An organic EL device was produced in the same manner as in Exemplary Embodiment 1 except that the compounds, film thicknesses, and concentrations in the first light-emitting layer, the intermediate layer, and the second light-emitting layer in Exemplary Embodiment 2 were changed as shown in Table 5. The characteristics of the organic EL device were measured and evaluated in the same manner as in Exemplary Embodiment 1. Table 5 shows the results.

in Exemplary Embodiment 2 was changed to a layered structure of the first light-emitting layer/intermediate layer/second light-emitting layer/third light-emitting layer shown in Table 6 and that the compounds and concentrations were changed as shown in Table 6. The thicknesses of the first

TABLE 5

| | First light-emitting layer | | | | | | Intermediate layer | | |
|---|---|---|---|---|---|---|---|---|---|
| | First host | | First dopant | | | | Intermediate layer material | | |
| | HOMO (H1) [eV] | LUMO (H1) [eV] | HOMO (D1) [eV] | LUMO (D1) [eV] | Thickness [nm] | Weight ratio | HOMO (IL) [eV] | LUMO (IL) [eV] | Thickness [nm] |
| Example 8 | EM1 −5.11 | −1.67 | BD9 −5.24 | −1.84 | 20 | EM1:BD9 = 99.5:0.5 | IL1 −5.32 | −1.57 | 10 |
| Example 9 | EM2 −5.06 | −1.62 | BD9 −5.24 | −1.84 | 20 | EM2:BD9 = 99.0:1.0 | IL12 −5.56 | −1.81 | 15 |
| Example 10 | EM1 −5.11 | −1.67 | BD9 −5.24 | −1.84 | 25 | EM1:BD9 = 99.5:0.5 | IL3 −5.11 | −1.67 | 10 |
| Example 11 | EM1 −5.11 | −1.67 | BD9 −5.24 | −1.84 | 25 | EM1:BD9 = 99.5:0.5 | IL11 −5.14 | −1.62 | 10 |
| Comparative example 4 | EM1 −5.11 | −1.67 | BD9 −5.24 | −1.84 | 20 | EM1:BD9 = 99.5:0.5 | None | | |

| | Second light-emitting layer | | | | | | | |
|---|---|---|---|---|---|---|---|---|
| | Second host | | Second dopant | | Third dopant | | | |
| | HOMO (H2) [eV] | LUMO (H2) [eV] | HOMO (D2) [eV] | LUMO (D2) [eV] | HOMO (D2) [eV] | LUMO (D2) [eV] | Thickness [nm] | Weight ratio |
| Example 8 | EM1 −5.11 | −1.67 | RD5 −4.72 | −2.37 | GD27 −4.95 | −2.08 | 10 | EM1:RD5:GD27 = 96.0:0.5:2.5 |
| Example 9 | EM1 −5.11 | −1.67 | RD10 −4.98 | −2.58 | GD27 −4.95 | −2.08 | 5 | EM1:RD10:GD27 = 97.5:0.5:2.0 |
| Example 10 | EM1 −5.11 | −1.67 | RD5 −4.72 | −2.37 | GD11 −5.00 | −1.97 | 5 | EM1:RD5:GD11 = 95.6:0.4:4.0 |
| Example 11 | EM22 −4.94 | −1.77 | RD5 −4.72 | −2.37 | GD27 −4.95 | −2.08 | 5 | EM22:RD5:GD27 = 96.0:0.5:2.5 |
| Comparative example 4 | EM1 −5.11 | −1.67 | RD5 −4.72 | −2.37 | GD27 −4.95 | −2.08 | 5 | EM1:RD5:GD27 = 97.5:0.5:2.0 |

Exemplary Embodiments 12 to 14

An organic EL device was produced in the same manner as in Exemplary Embodiment 2 except that the first light-emitting layer/intermediate layer/second light-emitting layer/third light-emitting layer were 10 nm/5 nm/10 nm/5 nm. The characteristics of the organic EL device were measured and evaluated in the same manner as in Exemplary Embodiment 2. Table 7 shows the results.

TABLE 6

| | First light-emitting layer | | | | | Intermediate layer | | Second light-emitting layer | |
|---|---|---|---|---|---|---|---|---|---|
| | First host | | First dopant | | | Intermediate layer material | | Second host | |
| | HOMO (H1) [eV] | LUMO (H1) [eV] | HOMO (D1) [eV] | LUMO (D1) [eV] | Mass ratio | HOMO (IL) [eV] | LUMO (IL) [eV] | HOMO (H2) [eV] | LUMO (H2) [eV] |
| Example 12 | EM1 −5.11 | −1.67 | RD5 −4.72 | −2.37 | EM1:RD5 = 99.8:0.2 | IL1 −5.32 | −1.57 | EM1 −5.11 | −1.67 |
| Example 13 | EM4 −5.19 | −1.66 | RD5 −4.72 | −2.37 | EM4:RD5 = 99.8:0.2 | IL4 −5.19 | −1.66 | EM1 −5.11 | −1.67 |

TABLE 6-continued

| Example 14 | EM1 | | RD5 | | EM1:RD5 = | IL3 | | EM5 | |
|---|---|---|---|---|---|---|---|---|---|
| | −5.11 | −1.67 | −4.72 | −2.37 | 99.8:0.2 | −5.11 | −1.67 | −5.12 | −1.64 |

| | Second light-emitting layer | | | Third light-emitting layer | | | | |
|---|---|---|---|---|---|---|---|---|
| | Second dopant | | | Second host | | Third dopant | | |
| | HOMO (D2) [eV] | LUMO (D2) [eV] | Mass ratio | HOMO (H2) [eV] | LUMO (H2) [eV] | HOMO (D2) [eV] | LUMO (D2) [eV] | Mass ratio |
| Example 12 | BD9 −5.24 | −1.84 | EM1:BD9 = 99.0:1.0 | EM1 −5.11 | −1.67 | GD11 −5.00 | −1.97 | EM1:GD11 = 98.0:2.0 |
| Example 13 | BD9 −5.24 | −1.84 | EM1:BD9 = 99.0:1.0 | EM1 −5.11 | −1.67 | GD11 −5.00 | −1.97 | EM1:GD11 = 98.5:1.5 |
| Example 14 | BD9 −5.24 | −1.84 | EM1:BD9 = 99.0:1.0 | EM1 −5.11 | −1.67 | GD11 −5.00 | −1.97 | EM1:GD11 = 99.0:1.0 |

TABLE 7

| | | Example 8 | Example 9 | Example 10 | Example 11 | Comparative example 4 | Example 12 | Example 13 | Example 14 |
|---|---|---|---|---|---|---|---|---|---|
| Luminance decay rate [%] | | 15 | 20 | 15 | 15 | 25 | 10 | 8 | 8 |
| Peak height ratio | Blue | Δ | Δ | Δ | Δ | X | ○ | ○ | ○ |
| | Green | ○ | ○ | Δ | Δ | X | ○ | ○ | ○ |

Exemplary Embodiments 8 to 14 show that organic EL devices according to the present invention had high durability and emitted white light with a good balance of red, green, and blue in a low luminance region. By contrast, balanced light could not be observed in Comparative Example 4. This is due to energy transfer from the first light-emitting layer (blue-light-emitting layer) to the second light-emitting layer (red- and green-light-emitting layer) in the absence of the intermediate layer.

Exemplary Embodiment 15

An organic EL device of the bottom emission type produced in the present exemplary embodiment included an anode, a hole-injection layer, an electron-blocking layer, a hole-transport layer, a first light-emitting layer, an intermediate layer, a second light-emitting layer, a third light-emitting layer, a hole-blocking layer, an electron-transport layer, an electron-injection layer, and a cathode on a substrate. More specifically, first, an ITO film was formed on a glass substrate and was subjected to desired patterning to form an ITO electrode (anode). The ITO electrode had a thickness of 100 nm. Second, vacuum evaporation was performed by resistance heating in a vacuum chamber at $1.33 \times 10^{-4}$ Pa to continuously form an organic compound layer and a cathode shown in the following table 8 on the ITO electrode. The facing areas of the anode and the cathode were set to 3 mm².

TABLE 8

| | Material | Thickness [nm] |
|---|---|---|
| Cathode | Al | 100 |
| Electron-injection layer | LiF | 1 |
| Electron-transport layer | ET5 | 30 |
| Hole-blocking layer | ET17 | 70 |
| Third light-emitting layer | Second host Second dopant (green-light-emitting dopant) | EM1 GD11 | Mass ratio EM1:GD11 = 99.0:1.0 | 10 |
| Second light-emitting layer | Third host Third dopant (blue-light-emitting dopant) | EM1 BD9 | Mass ratio EM1:BD9 = 99.0:1.0 | 10 |
| Intermediate layer | | IL1 | | 10 |
| First light-emitting layer | First host First dopant (red-light-emitting dopant) | EM1 RD5 | Mass ratio EM1:RD5 = 99.5:0.5 | 10 |
| Electron-blocking layer | | HT12 | | 10 |
| Hole-transport layer | | HT3 | | 18 |
| Hole-injection layer | | HT16 | | 7 |

The substrate was then transferred to a glove box and was sealed with a glass cap containing a drying agent in a nitrogen atmosphere to obtain an organic EL device. The characteristics of the organic EL device were measured and evaluated in the same manner as in Exemplary Embodiment 2. Table 9 shows the results.

Exemplary Embodiments 16 and 17, Comparative Example 5 to 7

An organic EL device was produced in the same manner as in Exemplary Embodiment 15 except that the compounds in the first light-emitting layer/intermediate layer/second light-emitting layer/third light-emitting layer in Exemplary Embodiment 15 was changed as shown in Table 9. The characteristics of the organic EL device were measured and evaluated in the same manner as in Exemplary Embodiment 2. Table 10 shows the results.

TABLE 9

| | First light-emitting layer | | | | Intermediate layer | | Second light-emitting layer | | | | Third light-emitting layer | | | |
|---|---|---|---|---|---|---|---|---|---|---|---|---|---|---|
| | First host | | First dopant | | Intermediate layer material | | Second host | | Second dopant | | Third host | | Third dopant | |
| | HOMO (H1) [eV] | LUMO (H1) [eV] | HOMO (D1) [eV] | LUMO (D1) [eV] | HOMO (IL) [eV] | LUMO (IL) [eV] | HOMO (H2) [eV] | LUMO (H2) [eV] | HOMO (D2) [eV] | LUMO (D2) [eV] | HOMO (H2) [eV] | LUMO (H2) [eV] | HOMO (D2) [eV] | LUMO (D2) [eV] |
| Example 15 | EM1 | | RD5 | | IL1 | | EM1 | | BD9 | | EM1 | | GD11 | |
| | −5.11 | −1.67 | −4.72 | −2.37 | −5.32 | −1.57 | −5.11 | −1.67 | −5.24 | −1.84 | −5.11 | −1.67 | −5.00 | −1.97 |
| Example 16 | EM1 | | RD21 | | IL5 | | EM1 | | GD11 | | EM1 | | BD9 | |
| | −5.11 | −1.67 | −4.63 | −2.24 | −5.28 | −1.55 | −5.11 | −1.67 | −5.00 | −1.97 | −5.11 | −1.67 | −5.24 | −1.84 |
| Example 17 | EM22 | | RD5 | | IL3 | | EM7 | | BD23 | | EM1 | | GD9 | |
| | −4.94 | −1.77 | −4.72 | −2.37 | −5.11 | −1.67 | −5.02 | −1.70 | −5.44 | −2.06 | −5.11 | −1.67 | −5.06 | −1.98 |
| Comparative example 5 | EM1 | | RD5 | | IL11 | | EM1 | | BD23 | | EM1 | | GD11 | |
| | −5.11 | −1.67 | −4.72 | −2.37 | −5.06 | −1.62 | −5.11 | −1.67 | −5.44 | −2.06 | −5.11 | −1.67 | −5.00 | −1.97 |
| Comparative example 6 | EM1 | | RD5 | | IL3 | | EM1 | | BD1 | | EM1 | | GD11 | |
| | −5.11 | −1.67 | −4.72 | −2.37 | −5.11 | −1.67 | −5.11 | −1.67 | −4.73 | −1.47 | −5.11 | −1.67 | −5.00 | −1.97 |
| Comparative example 7 | EM17 | | RD5 | | EM17 | | EM1 | | BD23 | | EM1 | | GD11 | |
| | −4.68 | −2.07 | −4.72 | −2.37 | −4.68 | −2.07 | −5.11 | −1.67 | −5.44 | −2.06 | −5.11 | −1.67 | −5.00 | −1.97 |

TABLE 10

| | | Example 15 | Example 16 | Example 17 | Comparative example 5 | Comparative example 6 | Comparative example 7 |
|---|---|---|---|---|---|---|---|
| Luminance decay rate [%] | | 8 | 6 | 6 | 14 | 20 | 10 |
| Peak height ratio | Blue | ○ | ○ | ○ | ○ | Δ | X |
| | Green | ○ | ○ | ○ | ○ | ○ | ○ |

Exemplary Embodiments 15 to 17 show that organic EL devices according to the present invention had high durability and emitted balanced white light. By contrast, Comparative Example 5 emitted balanced white light but had low durability. This is due to the low HOMO level of the intermediate layer. A decrease in durability was also observed in Comparative Example 6. This is because the blue-light-emitting layer did not have electron trapping properties. Balanced light could not be observed in Comparative Example 7. This is probably because the intermediate layer had a low $S_1$ level, and energy was transferred from the second light-emitting layer (blue-light-emitting layer) to the first light-emitting layer or the third light-emitting layer (red- or green-light-emitting layer).

The present invention can provide an organic EL device with improved durability and good emission balance. Such an organic EL device can be used to provide a display apparatus, an image pickup apparatus, a communication apparatus, a lighting apparatus, a luminaire, and a moving body each having desired characteristics.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An organic EL device comprising at least:
   an anode;
   a first light-emitting layer;
   an intermediate layer;
   a second light-emitting layer; and
   a cathode in this order,
   the intermediate layer being located between the first light-emitting layer and the second light-emitting layer,
   wherein the first light-emitting layer contains a first host and a first dopant,
   the second light-emitting layer contains a second host and a second dopant,
   the intermediate layer contains an aromatic hydrocarbon compound,
   the following relationship (a) is satisfied between the first host and the first dopant,
   the following relationship (b) is satisfied between the second host and the second dopant,
   the following relationship (c) is satisfied between the hydrocarbon compound of the intermediate layer and the first host, and
   the following relationship (d) is satisfied between the second host and the hydrocarbon compound of the intermediate layer,
   (a) LUMO (H1)>LUMO (D1)
   (b) LUMO (H2)>LUMO (D2)
   (c) HOMO (H1)≥HOMO (IL)
   (d) HOMO (H2)>HOMO (IL)
   wherein LUMO (H1), LUMO (D1), LUMO (H2), and LUMO (D2) in (a) to (d) denote LUMO energy levels of the first host, the first dopant, the second host, and the second dopant, respectively, and HOMO (H1), HOMO (H2), and HOMO (IL) denote HOMO energy levels of the first host, the second host, and the intermediate layer material, respectively.

2. The organic EL device according to claim 1, wherein the intermediate layer has a lowest excited singlet energy level of 2.58 eV or more.

3. The organic EL device according to claim 1, wherein the aromatic hydrocarbon compound is a compound in which at least two of aromatic hydrocarbons selected from the group consisting of benzene, naphthalene, fluorene, benzofluorene, phenanthrene, anthracene, chrysene, triphenylene, pyrene, fluoranthene, and benzofluoranthene are bonded to form a molecular structure.

4. The organic EL device according to claim 1, wherein the first host and the second host are hydrocarbons.

5. The organic EL device according to claim 1, wherein the first dopant and the second dopant are dopants that fluoresce.

6. The organic EL device according to claim 1, wherein the first dopant and the second dopant are compounds that have a fluoranthene skeleton and have no substituted amino group.

7. The organic EL device according to claim 1, further comprising a third light-emitting layer adjacent to the second light-emitting layer between the second light-emitting layer and the cathode,
wherein the third light-emitting layer contains a third host and a third dopant that fluoresces, and
the following relationship (e) is satisfied between the third host and the third dopant,
(e) LUMO (H3)>LUMO (D3)
wherein LUMO (H3) and LUMO (D3) in (e) denote LUMO energy levels of the third host and the third dopant, respectively.

8. The organic EL device according to claim 7, wherein the first dopant emits red light, one of the second dopant and the third dopant emits blue light, and the other of the second dopant and the third dopant emits green light.

9. The organic EL device according to claim 1, further comprising a third light-emitting layer adjacent to the first light-emitting layer between the anode and the first light-emitting layer,
wherein the third light-emitting layer contains a third host and a third dopant that fluoresces, and
the following relationship (e) is satisfied between the third host and the third dopant,
(e) LUMO (H3)>LUMO (D3)
wherein LUMO (H3) and LUMO (D3) in (e) denote LUMO energy levels of the third host and the third dopant, respectively.

10. The organic EL device according to claim 9, wherein the first dopant emits green light, the second dopant emits blue light, and the third dopant emits red light.

11. The organic EL device according to claim 1, wherein the first light-emitting layer contains a third dopant that fluoresces, and
the following relationship (f) is satisfied between the first host and the third dopant,
(f) LUMO (H1)>LUMO (D3)
wherein LUMO (D3) in (f) denotes a LUMO energy level of the third dopant.

12. The organic EL device according to claim 11, wherein the second dopant emits blue light, one of the first dopant and the third dopant emits red light, and the other of the first dopant and the third dopant emits green light.

13. The organic EL device according to claim 7, wherein the third host is a hydrocarbon.

14. The organic EL device according to claim 7, wherein the third dopant is a compound that has a fluoranthene skeleton and has no substituted amino group.

15. The organic EL device according to claim 1, wherein the following relationship (g) is satisfied between the first host and the first dopant,
(g) HOMO (H1)<HOMO (D1)
wherein HOMO (H1) and HOMO (D1) in (g) denote HOMO energy levels of the first host and the first dopant, respectively.

16. The organic EL device according to claim 1, wherein the following relationship (h) is satisfied between the second host and the second dopant,
(h) HOMO (H2)>HOMO (D2)
wherein HOMO (H2) and HOMO (D2) in (h) denote HOMO energy levels of the second host and the second dopant, respectively.

17. The organic EL device according to claim 1, wherein the following relationship (h) is satisfied between the first host and the first dopant,
(i) LUMO (H1)–LUMO (D1)>HOMO (D1)–HOMO (H1)
wherein HOMO (D1) in (i) denotes a HOMO energy level of the first dopant.

18. A display apparatus comprising a plurality of pixels, wherein each pixel has the organic EL device according to claim 1 and an active device coupled to the organic EL device.

19. A flexible display apparatus comprising:
a flexible substrate; and
a display unit on the flexible substrate,
wherein the display unit includes the organic EL device according to claim 1 and an active device coupled to the organic EL device.

20. An image pickup apparatus comprising:
an optical unit with a plurality of lenses;
an image pickup device for receiving light passing through the optical unit; and
a display unit for displaying an image,
wherein the display unit is a display unit for displaying an image taken with the image pickup device, and the display unit has the organic EL device according to claim 1.

21. A communication apparatus comprising:
a display unit; and
a communication unit,
wherein the display unit has the organic EL device according to claim 1.

22. A lighting apparatus comprising:
a light source; and
a light diffusing unit,
wherein the light source has the organic EL device according to claim 1.

23. A lighting apparatus comprising:
a light source; and
an optical film on a light output side of the light source,
wherein the light source has the organic EL device according to claim 1.

24. A luminaire comprising:
the organic EL device according to claim 1; and
a protective member for protecting the organic EL device.

25. A moving body comprising:
a body; and
a luminaire on the body, wherein the luminaire has the organic EL device according to claim 1.

* * * * *